(12) United States Patent
Nakatani

(10) Patent No.: US 7,176,757 B2
(45) Date of Patent: Feb. 13, 2007

(54) MULTISTAGE AMPLIFYING DEVICES, AND RECEPTION DEVICE AND TRANSMISSION DEVICE USING THE SAME

(75) Inventor: Toshifumi Nakatani, Sakai (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 127 days.

(21) Appl. No.: 11/142,406

(22) Filed: Jun. 2, 2005

(65) Prior Publication Data
US 2005/0270094 A1 Dec. 8, 2005

(30) Foreign Application Priority Data
Jun. 4, 2004 (JP) ............... 2004-167718

(51) Int. Cl.
*H03F 1/36* (2006.01)
(52) U.S. Cl. .................................... 330/107
(58) Field of Classification Search ........... 330/107, 330/109
See application file for complete search history.

(56) References Cited
U.S. PATENT DOCUMENTS

| | | | |
|---|---|---|---|
| 4,591,802 A | 5/1986 | Asazawa | |
| 5,675,656 A | 10/1997 | Sondermeyer et al. | |
| 6,204,728 B1 | 3/2001 | Hageraats | |
| 6,275,104 B1 * | 8/2001 | Holter | 330/149 |
| 6,393,259 B1 * | 5/2002 | Kusunoki | 455/78 |
| 6,750,724 B1 | 6/2004 | Mori et al. | |

FOREIGN PATENT DOCUMENTS

| | | |
|---|---|---|
| EP | 0 391 235 A1 | 10/1990 |
| EP | 0 692 869 A2 | 1/1996 |
| EP | 1 315 286 A1 | 5/2003 |
| JP | 2002-536859 | 10/2002 |
| JP | 3405401 | 3/2003 |
| JP | 2003-289226 | 10/2003 |

* cited by examiner

*Primary Examiner*—Robert Pascal
*Assistant Examiner*—Hieu Nguyen
(74) *Attorney, Agent, or Firm*—Wenderoth, Lind & Ponack, L.L.P.

(57) ABSTRACT

A multistage amplifying device for amplifying a desired signal comprise first to N-th amplifiers connected in cascade,wherein the k-th (k is 1 to N) amplifier includes a k-th amplification section; and a k-th feedback section which has a reactance component, changes a phase of a signal output from the k-th amplification section. When a phase difference between the desired signal output from the N-th amplifier and a third-order inter-modulation distortion(IM3) output from the (N−1)-th amplifier is referred to as a first phase, and a phase difference between the desired signal output from the N-th amplifier, and a combined IM3 obtained by combining a IM3 occurring in the N-th amplification section and a IM3 fed back from the N-th feedback section is referred to as a second phase, a difference between the first phase and the second phase is 120° or more and 180° or less.

18 Claims, 49 Drawing Sheets

POINT a1

POINT b1

FIG. 2E POINT d1
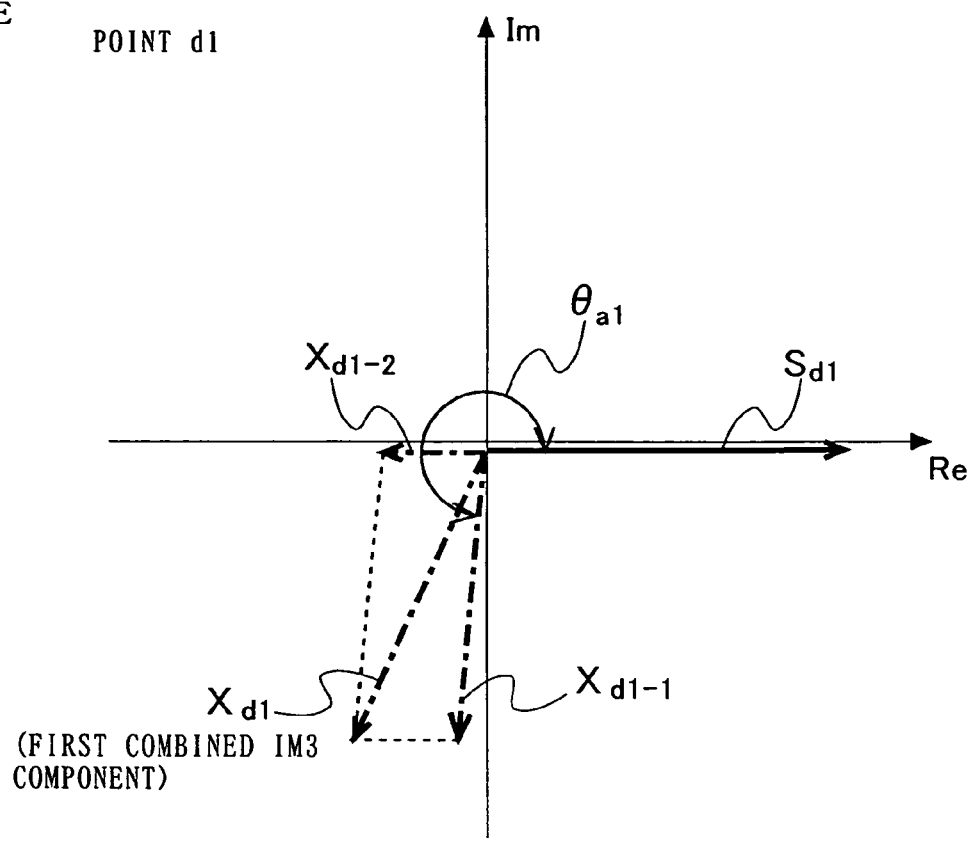
FIG. 2F POINT e1
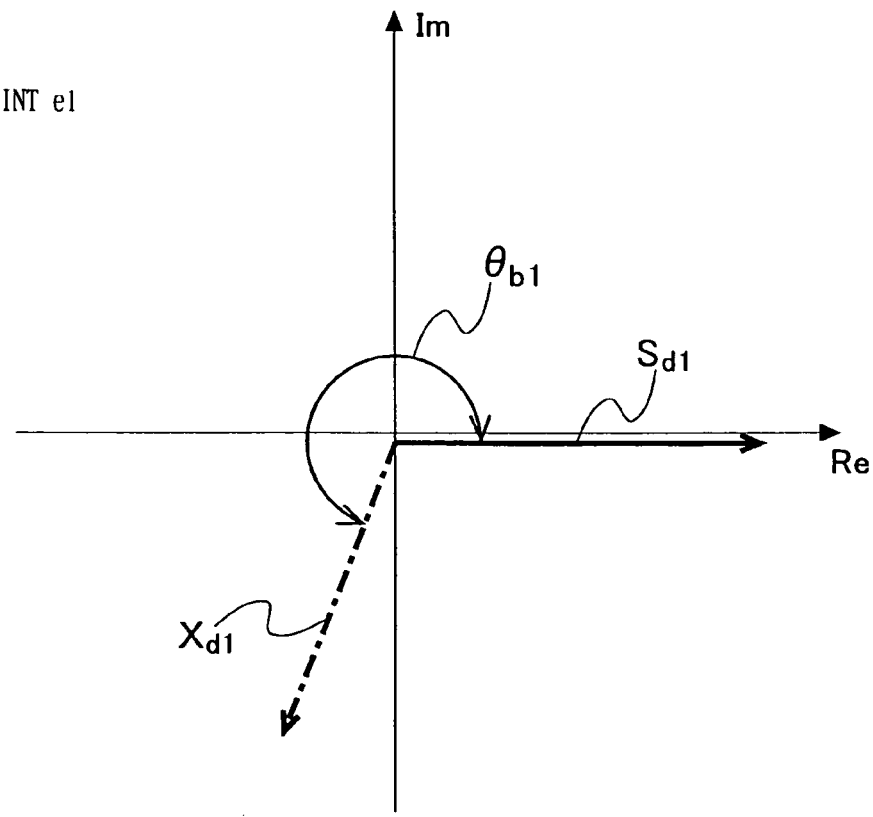

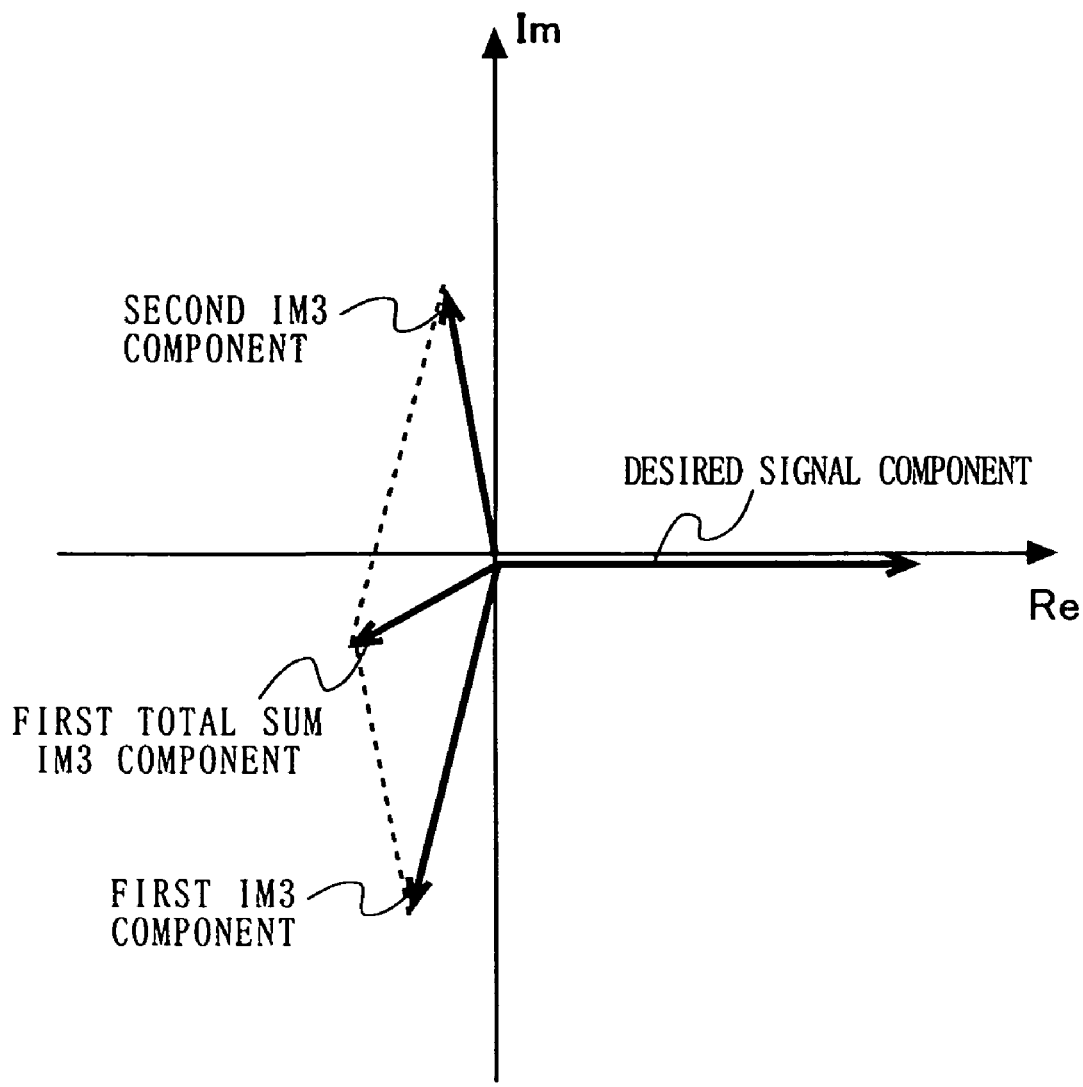

FIRST TOTAL SUM IM3 COMPONENT

POINT L1

POINT m1

POINT o1

OUTPUT TERMINAL 72

MULTISTAGE AMPLIFYING DEVICES, AND RECEPTION DEVICE AND TRANSMISSION DEVICE USING THE SAME

BACKGROUND OF THE INVENTION

1. Field of the Invention

The present invention relates to an amplifier and a reception device and transmission device using the same. More particularly, the present invention relates to an amplifying device with a distortion compensation function, and a reception device and transmission device using the same.

2. Description of the Background Art

Recently, rapid progress has been made in improving mobile communication terminals. Particularly, various functions as well as a communication function have been incorporated into a mobile communication terminal. As the mobile communication terminal is increasingly becoming widespread, there is a keen demand for a reduction in the power consumption thereof. In a wireless circuit of the mobile communication terminal, an amplifier circuit, a mixer circuit and the like are predominant factors for the power consumption. Therefore, it is an important challenge for the amplifier circuit to attain a predetermined function while suppressing the power consumption.

In the amplifier circuit, for example, when a signal is input thereinto, inter-modulation distortion occurs due to signals of two bands included in the received signal. Particularly, third-order inter-modulation distortion (hereinafter referred to as IM3) occurs in the vicinity of the received signal, affecting the received signal. Also, when a transmission signal is input to the amplifier circuit, IM3 occurs due to an influence of the bandwidth of the transmission signal, affecting the transmission signal. Thus, it is also an important challenge to suppress the occurrence of IM3 in the amplifier circuit and the like.

It is conventionally known that the occurrence of IM3 can be suppressed by increasing the power consumption of the amplifier circuit. Although the occurrence of IM3 is suppressed, power consumption increases. Thus, the two challenges are not simultaneously solved. Therefore, various methods for suppressing the occurrence of IM3 without an increase in power consumption have been proposed.

As a first exemplary method of reducing IM3, a method of using a feedback-type amplifier circuit has been proposed. Patent publications 1 and 2 describe exemplary feedback-type amplifier circuits.

FIG. 32 is a diagram illustrating a feedback-type amplifier circuit described in Patent Publication 1 (Japanese PCT National Phase Laid-Open Patent Publication No. 2002-536859). In FIG. 32, a signal generator 1501 generates a signal, which is in turn input to an amplifier circuit 1502. A first transistor 1521 and a second transistor 1522 amplify an input signal. During signal amplification, an IM3 component occurs in the first transistor 1521 and the second transistor 1522. A shunt reactive feedback network 1523 includes a capacitor. The amplified signal and the occurring IM3 component are input to the shunt reactive feedback network 1523. The shunt reactive feedback network 1523 changes the phases of the amplified signal and the IM3 component, and feeds the resultant signal and IM3 component back to the base of the first transistor 1521. As a result, the IM3 component occurring during amplification is canceled with the IM3 component whose phase is changed during feedback.

FIG. 33 is a diagram illustrating a feedback-type amplifier circuit described in Patent Publication 2 (Japanese Laid-Open Patent Publication No. 2003-289226). In FIG. 33, an amplifier circuit 1602 amplifies a signal input through an internal terminal 1601. During signal amplification, an IM3 component occurs in the amplifier circuit 1602. A feedback circuit 1603 feeds the amplified signal back to the base of a first transistor 1621. During feedback of the amplified signal, the phases of the amplified signal and the IM3 component are changed by a first capacitor 1631. As a result, the IM3 component occurring in the amplifier circuit 1602 is canceled with the IM3 component whose phase is changed during feedback, thereby suppressing IM3.

As a second method of reducing IM3, a predistortion-type amplifier circuit has been proposed. The predistortion-type amplifier circuit comprises a noise generation section (first stage) and an amplification section (second stage). The noise generation section and the amplification section are connected in cascade.

FIG. 34 is a diagram illustrating the first stage circuit of a predistortion-type amplifier circuit described in Patent Publication 3 (Japanese Patent No. 3405401). In a FET 1701, noise occurs which has the same frequency band as that of an IM3 component occurring in the second stage during signal amplification. A first inductor 1702 changes the phase of the noise occurring in the FET 1701. A gate control voltage 1703 controls the amplitude of the noise occurring in the FET 1701. In this manner, the first stage generates a noise component having the same frequency band, the same amplitude, and the reverse phase with respect to IM3 which is expected to occur in the second stage during signal amplification. As a result, the noise component occurring in the first stage is canceled with the IM3 component occurring in the second stage during signal amplification.

However, the above-described methods have the following problems. In the first method, the phase of the IM3 component is changed, and a portion of the amplified signal and the IM3 component is fed back. In the first method, the IM3 component occurring in the amplifier circuit is canceled with the fed-back IM3 component, thereby suppressing IM3. However, the level of the input signal is reduced due to the feedback of the amplified signal. Therefore, the amplifier circuit cannot obtain a desired amplification level. Therefore, the amplified signal to be fed back needs to be limited, so that there is a limitation on suppression of IM3.

In the second method, the IM3 component which is generated on the first stage is canceled with the IM3 component occurring in the amplifier on the second stage, thereby suppressing IM3. However, when the IM3 component is generated on the first stage, white noise occurs in addition to the IM3 component. When the second method is applied to a transmission device, the occurrence of white noise leads to the following problem. The transmission device emits white noise in a frequency band which is different from that used by the transmission device. Therefore, a means for removing the white noise is additionally required, leading to a complicated device structure. In addition, there is a limit of removal of the white noise. When the second method is applied to a reception device, the occurrence of white noise leads to the following problem. A desired signal is not amplified on the first stage, and therefore, the level of the white noise becomes higher than the level of the IM3 component to a non-negligible extent. Therefore, a means for removing the white noise is additionally required, leading to a complicated device structure.

SUMMARY OF THE INVENTION

Therefore, an object of the present invention is to provide a low power consumption amplifier which can suppress IM3 during signal amplification and does not require a means for removing white noise.

To solve the above-described problems, the present invention has the following features. A multistage amplifying device is provided for amplifying a desired signal having a desired frequency band and outputting the amplified desired signal. The multistage amplifying device comprises first to N-th (N is a natural number of 2 or more) amplifiers connected in cascade. The k-th (k is a natural number of 1 to N) amplifier includes a k-th amplification section, and a k-th feedback section which has a reactance component and charges a phase of a signal output from the k-th amplification section and negatively feeds the resultant signal back to an input side of the k-th amplification section. When a difference between a phase of a frequency component of the desired frequency band included in a signal output from the N-th amplifier (10-N) and a phase of a third-order inter-modulation distortion included in a signal output from the (N−1)-th amplifier is referred to as a first phase, and a difference between the phase of the frequency component of the desired frequency band included in the signal output from the N-th amplifier (10-N), and a phase of a combined third-order inter-modulation distortion obtained by combining a third-order inter-modulation distortion occurring in the N-th amplification section and a third-order inter-modulation distortion fed back from the N-th feedback section is referred to as a second phase, a difference between the first phase and the second phase is 120° or more and 180° or less.

Preferably, the k-th feedback section may have a reactance component which causes a phase component of $1/(1-\alpha \cdot \beta)$ to be −90° or more and 90° or less, where $\beta$ represents a feedback amount of the k-th feedback section which is a value obtained by dividing an admittance of the k-th feedback section by a sum of the admittance of the k-th feedback section and a load admittance of the k-th amplifier, and $\alpha$ represents a gain of the k-th amplifier (101-k) with respect to the frequency component of the desired frequency band.

Preferably, N may be 2, the first phase may be a difference between a phase of a frequency component of the desired frequency band included in a signal output from the second amplifier and a phase of a third-order inter-modulation distortion included in a signal output from the first amplifier, the second phase may be a difference between the phase of the frequency component of the desired frequency band included in the signal output from the second amplifier, and a phase of a combined third-order inter-modulation distortion obtained by combining a third-order inter-modulation distortion occurring in the second amplification section and a third-order inter-modulation distortion fed back from the second feedback section, and a difference between the first phase and the second phase may be 120° or more and 180° or less.

Preferably, when a difference between a phase of a frequency component of the desired frequency band included in a signal output from the k-th (k is at least one natural number of 2 or more and N−1 or less) amplifier, and a phase of a third-order inter-modulation distortion included in a signal output from the (k−1)-th amplifier is referred to as a third phase, and a difference between the phase of the frequency component of the desired frequency band included in the signal output from the k-th amplifier, and a phase of a combined third-order inter-modulation distortion obtained by combining a phase of a third-order inter-modulation distortion occurring in the k-th amplification section (101-k) and a third-order inter-modulation distortion fed back from the k-th feedback section is referred to as a fourth phase, the k-th feedback section (102-k) may change the phase of the signal output from the k-th amplification section (101-k) to cause a difference between the third phase and the fourth phase to be 0° or more and less than 120°.

Preferably, each of the first to (N−1)-th feedback sections may change the phase of the signal output from the k-th amplification section to cause the difference between the third phase and the fourth phase to be 0° or more and less than 120°.

Preferably, at least two of the first to N-th feedback sections may have a capacitive parallel feedback section which has a capacitive reactance component and performs parallel feedback with respect to a signal output from an amplification section, and an inductive parallel feedback section (102-2) which has an inductive reactance component and performs parallel feedback with respect to a signal output from an amplification section. A gain decrease rate of the desired frequency band of the amplifier including the capacitive parallel feedback section may be equivalent to a gain increase rate of the desired frequency band of the amplifier including the inductive parallel feedback section.

Preferably, at least two of the first to N-th feedback sections may has a capacitive parallel feedback section which has a capacitive reactance component and performs series feedback with respect to a signal output from an amplification section, and an inductive parallel feedback section which has an inductive reactance component and performs series feedback with respect to a signal output from an amplification section. A gain decrease rate of the desired frequency band of the amplifier including the capacitive parallel feedback section may be equivalent to a gain increase rate of the desired frequency band of the amplifier including the inductive parallel feedback section.

Preferably, the first feedback section may have an inductive series feedback section which has an inductive reactance component and performs series feedback with respect to a signal output from the first amplification section.

Preferably, the N-th feedback section may have an inductive series feedback section which has an inductive reactance component and performs series feedback with respect to a signal output from the N-th amplification section.

Preferably, at least two of the first to N-th feedback sections may has a feedback amount increasing feedback section including a parallel feedback section which has a capacitive reactance component and performs parallel feedback with respect to a signal output from an amplification section, and a series feedback section which has an inductive reactance component and performs series feedback with respect to a signal output from an amplification section, and a feedback amount decreasing feedback section including a parallel feedback section which has an inductive reactance component and performs parallel feedback with respect to a signal output from an amplification section, and a series feedback section which has a conductive reactance component and performs series feedback with respect to a signal output from an amplification section. A gain decrease rate of the desired frequency band of the amplifier including the feedback amount increasing feedback section may be equivalent to a gain increase rate of the desired frequency band of the amplifier including the feedback amount decreasing feedback section.

Preferably, at least one k-th amplifier may further include a matching circuit of matching impedances of the k-th amplification section (101-k) and the (k+1)-th amplification section. The matching circuit may change a reactance based on an externally-input control signal to adjust a level of a signal to be fed back to the k-th feedback section.

Preferably, at least one k-th feedback section may include a varactor diode which changes a reactance, depending on an externally-input control signal, as the reactance component.

Preferably, at least k-th feedback section may change a reactance by turning ON/OFF a switching element.

Preferably, at least k-th amplification section may change a current value of a bias current based on an externally-input control signal.

Preferably, at least one k-th bias circuit may change the current value of the bias current by turning ON/OFF a switching circuit.

The present invention also provides a reception device, comprising a multistage amplifying device (904) for amplifying a received radio signal. The multistage amplifying device comprises first to N-th (N is a natural number of 2 or more) amplifiers connected in cascade. The k-th (k is a natural number of 1 to N) amplifier includes a k-th amplification section, and a k-th feedback section which has a reactance component and charges a phase of a signal output from the k-th amplification section and negatively feeds the resultant signal back to an input side of the k-th amplification section. When a difference between a phase of a frequency component of the desired frequency band included in a signal output from the N-th amplifier and a phase of a third-order inter-modulation distortion included in a signal output from the (N−1)-th amplifier is referred to as a first phase, and a difference between the phase of the frequency component of the desired frequency band included in the signal output from the N-th amplifier, and a phase of a combined third-order inter-modulation distortion obtained by combining a third-order inter-modulation distortion occurring in the N-th amplification section and a third-order inter-modulation distortion fed back from the N-th feedback section is referred to as a second phase, a difference between the first phase and the second phase is 120° or more and 180° or less.

The present invention also provides a transmission device, comprising a multistage amplifying device for amplifying an electrical signal. The multistage amplifying device comprises first to N-th (N is a natural number of 2 or more) amplifiers connected in cascade. The k-th (k is a natural number of 1 to N) amplifier includes a k-th amplification section, and a k-th feedback section which has a reactance component and charges a phase of a signal output from the k-th amplification section and negatively feeds the resultant signal back to an input side of the k-th amplification section. When a difference between a phase of a frequency component of the desired frequency band included in a signal output from the N-th amplifier and a phase of a third-order inter-modulation distortion included in a signal output from the (N−1)-th amplifier is referred to as a first phase, and a difference between the phase of the frequency component of the desired frequency band included in the signal output from the N-th amplifier, and a phase of a combined third-order inter-modulation distortion obtained by combining a third-order inter-modulation distortion occurring in the N-th amplification section and a third-order inter-modulation distortion fed back from the N-th feedback section is referred to as a second phase, a difference between the first phase and the second phase is 120° or more and 180° or less.

The present invention also provides a radio communication device, comprising a signal reception amplifier of amplifying a received signal, a signal transmission amplifier of amplifying a transmission signal, and a control device of inputting a control signal to the signal reception amplifier, depending on a level of the amplified transmission signal, when performing signal transmission and signal reception simultaneously. The signal reception amplifier includes a multistage amplifying device. The multistage amplifying device comprises first to N-th (N is a natural number of 2 or more) amplifiers connected in cascade. The k-th (k is a natural number of 1 to N) amplifier includes a k-th amplification section, and a k-th feedback section which has a reactance component and charges a phase of a signal output from the k-th amplification section and negatively feeds the resultant signal back to an input side of the k-th amplification section. When a difference between a phase of a frequency component of the desired frequency band included in a signal output from the N-th amplifier and a phase of a third-order inter-modulation distortion included in a signal output from the (N−1)-th amplifier is referred to as a first phase, and a difference between the phase of the frequency component of the desired frequency band included in the signal output from the N-th amplifier, and a phase of a combined third-order inter-modulation distortion obtained by combining a third-order inter-modulation distortion occurring in the N-th amplification section and a third-order inter-modulation distortion fed back from the N-th feedback section is referred to as a second phase, a difference between the first phase and the second phase is 120° or more and 180° or less. The multistage amplification section changes a feedback amount of the k-th feedback section and a current value of a bias current of the k-th amplification section based on the control signal.

According to the present invention, the difference between the first phase and the second phase is 120° or more and 180° or less. Therefore, the power value of a total sum IM3 component obtained by combining the third-order inter-modulation distortion output from the (N−1)-th amplifier and the combined third-order inter-modulation distortion is caused to be smaller than the sum of the power value of the third-order inter-modulation component output from the (N−1)-th amplifier and the power value of the combined third-order inter-modulation distortion. Thereby, it is possible to suppress a third-order inter-modulation distortion output from each amplifier. In each amplifier, a desired signal having a desired frequency band is amplified, and therefore, white noise occurring when the desired signal is amplified is negligible. As a result, a structure for removing white noise is not required, thereby making it possible to the device structure.

The k-th feedback section has a reactance component which causes a phase component of $1/\{1-\alpha\cdot\beta\}$ to be −90° or more and 90° or less. As a result, the difference between the first phase and the second phase can be caused to be 120° or more and 180° or less.

When N=2, the difference between the phase of the third-order inter-modulation distortion output from the first amplifier and the phase of the combined third-order inter-modulation distortion occurring in the second amplifier is caused to be 120° or more and 180° or less, whereby it is expected that the third-order inter-modulation distortion is suppressed.

The difference between the phase of the third-order inter-modulation distortion output from the (k−1)-th amplifier and the phase of the combined third-order inter-modulation distortion occurring in the k-th amplifier can be caused to be 0° or more and 120° or less. The third-order inter-modulation distortion occurring in the N-th amplifier can be efficiently suppressed.

At least two feedback sections have a capacitive parallel feedback section and an inductive parallel feedback section, thereby making it possible to cause the difference between the first phase and the second phase to be 120° or more and 180° or less. The gain decrease rate of the amplifier having the capacitive parallel feedback section is equivalent to the gain increase rate of the amplifier having the inductive parallel feedback section, thereby obtaining a desired gain.

At least two feedback sections have a capacitive series feedback section and an inductive series feedback section, thereby making it possible to cause the difference between the first phase and the second phase to be 120° or more and 180° or less. The gain decrease rate of the amplifier having the capacitive series feedback section is equivalent to the gain increase rate of the amplifier having the inductive series feedback section, thereby obtaining a desired gain.

At least two feedback sections have a feedback amount increasing feedback section and a feedback amount decreasing feedback section. Therefore, the feedback section can control the phase of a fed-back signal so that the difference between the phase of a signal input to the amplifier and the phase of the fed-back signal is substantially 180°. As a result, the difference between the first phase and the second phase can be easily controlled to be substantially 180°, thereby making it possible to efficiently suppress a third-order inter-modulation distortion.

By changing the reactance of the matching circuit to adjust the level of a signal to be fed back to the k-th feedback section, the k-th feedback section can control a change amount of the phase of the signal to be fed back.

The k-th feedback section may have a varactor diode which changes a reactance depending on an externally-input control signal, thereby making it possible to control a change amount of the phase of a signal to be fed back. Also, by turning the switching element ON/OFF to change the reactance of the k-th feedback section, the k-th feedback section can control a change amount of the phase of a signal to be fed back.

The k-th amplification section may change the current value of a bias current based on an externally-input control signal to control a change amount of the phase of a signal to be fed back. Specifically, this is achieved by employing a k-th bias circuit which changes the current value of a bias current by turning the switching element ON/OFF.

These and other objects, features, aspects and advantages of the present invention will become more apparent from the following detailed description of the present invention when taken in conjunction with the accompanying drawings.

BRIEF DESCRIPTION OF THE DRAWINGS

FIG. 2E is a schematic diagram illustrating a relationship between the phase of the amplified desired signal component, the phase of the amplified first IM3 component, and the phase of the new first IM3 component, at a point d1 of FIG. 1, FIG. 2F is a schematic diagram illustrating a relationship between the phase of the desired signal component and the phase of the first IM3 component, at a point e1 of FIG. 1, FIG. 5C is a schematic diagram illustrating how the first IM3 component and the second IM3 component are combined so that IM3 is suppressed.

DESCRIPTION OF THE PREFERRED EMBODIMENTS

First Embodiment

Figure 1:
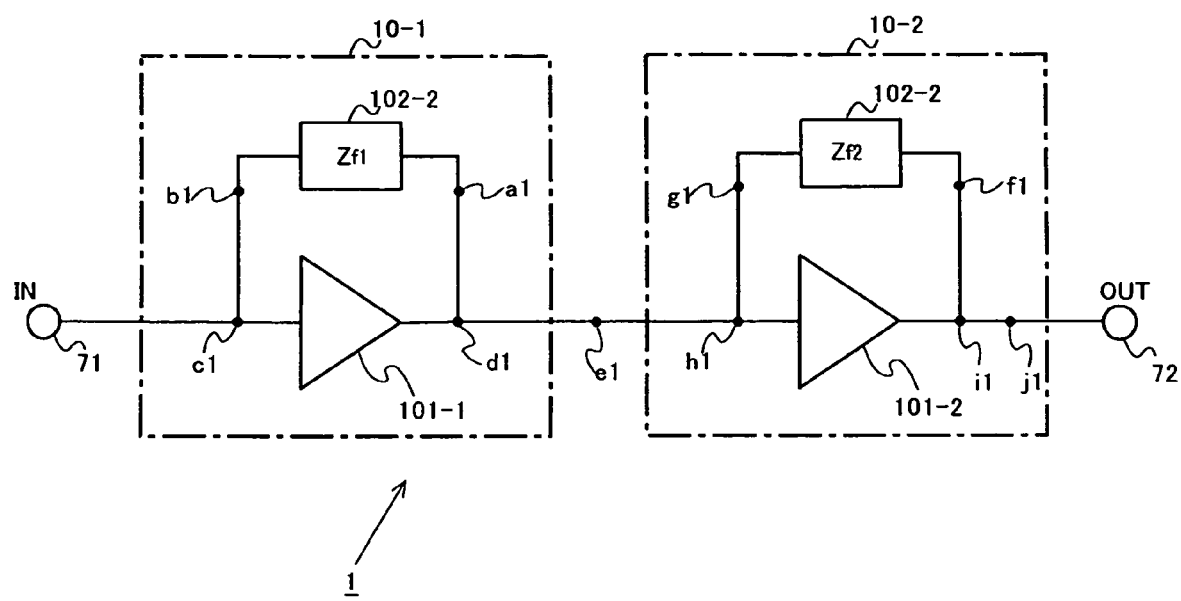
FIG. 1 is a block diagram illustrating a structure of a multistage amplifying device 1 according to a first embodiment of the present invention.

FIG. 1 is a block diagram illustrating a structure of a multistage amplifying device 1 according to a first embodiment of the present invention. In FIG. 1, the multistage amplifying device 1 comprises a first parallel feedback amplifier 10-1, a second parallel feedback amplifier 10-2, an internal terminal 71, and an output terminal 72. The first parallel feedback amplifier 10-1 includes a first amplification section 101-1, and a first parallel feedback section 102-1. The second parallel feedback amplifier 10-2 includes a second amplification section 101-2 and a second parallel feedback section 102-2.

As illustrated in FIG. 1, the multistage amplifying device 1 has the two amplifier connected in cascade, each amplifier including the parallel feedback section as a feedback circuit. The first amplification section 101-1 and the second amplification section 101-2 are inverting amplifiers. The first parallel feedback section 102-1 and the second parallel feedback section 102-2 have reactance components different from each other.

In the first parallel feedback amplifier 10-1, the first amplification section 101-1 amplifies a desired signal having a desired frequency band (hereinafter referred to as a desired signal) which is input through the internal terminal 71. When the first amplification section 101-1 amplifies the input desired signal, IM3 occurs due to the desired signal. The reactance component of the first parallel feedback section 102-1 changes the phase of the amplified desired signal component and the phase of IM3 occurring in the first amplification section 101-1 (hereinafter referred to as first IM3), and feeds back the resultant amplified desired signal component and first IM3 component.

In the second parallel feedback amplifier 10-2, the second amplification section 101-2 amplifies the desired signal and the first IM3 output from the first parallel feedback amplifier 10-1. In the second amplification section 101-2, IM3 newly occurs due to the amplified desired signal. The reactance component of the second parallel feedback section 102-2 changes the phase of the amplified desired signal component, the phase of the amplified first IM3, and the phase of the newly occurring IM3 (hereinafter referred to as second IM3), and feeds back the resultant amplified desired signal, amplified first IM3, and second IM3.

An outline of an operation of the multistage amplifying device 1 according to the first embodiment of the present invention will be described. Note that an operation of the multistage amplifying device of the present invention will be described using two frequency components of a desired signal having a desired frequency band (hereinafter referred to as desired signal components) and IM3 which occurs due to the two frequency components. Note that the frequencies of the two frequency components are assumed to be a maximum value and a minimum value of the desired frequency band. Thereby, in the multistage amplifying device of the present invention, a relationship between the desired signal of the desired frequency band and IM3 occurring due to the desired signal of the desired frequency band can be explained.

Hereinafter, a phase relationship between the desired signal component and the IM3 component will be illustrated according to a rule described above unless otherwise specified. The desired signal component is placed on the real axis, and a relationship between phases of the two frequency components of the desired signal and the phase of the IM3 component is illustrated. It is assumed that the desired signal component and the two IM3 components having different frequency components have the same phase. To clearly illustrate a relationship between the phase of the desired signal component and the phase of the IM3 component, a magnitude of the IM3 component is exaggerated.

Figure 2A:
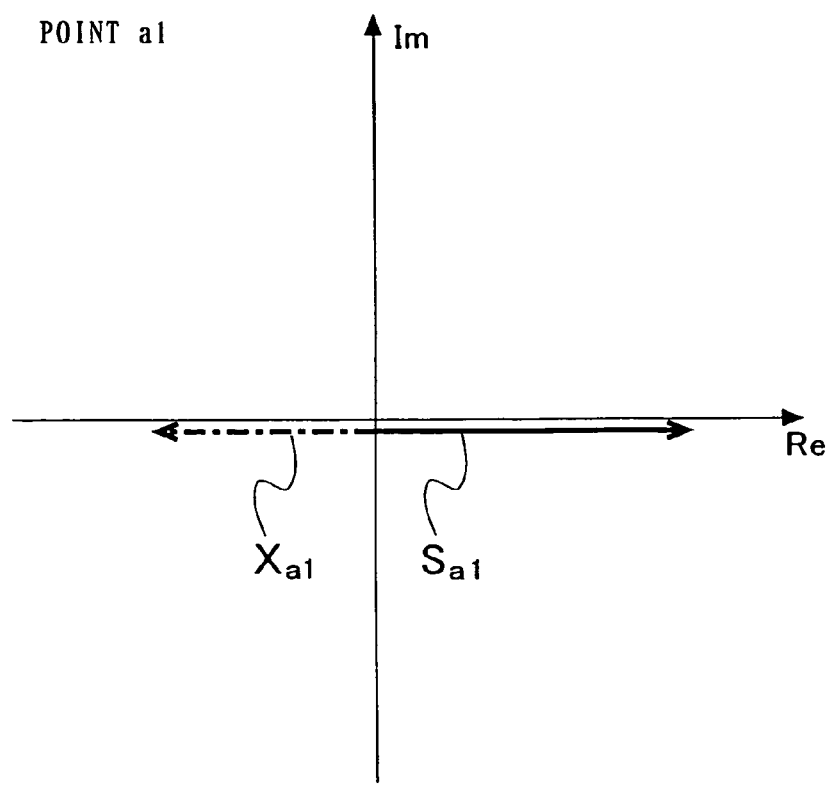
FIG. 2A is a schematic diagram illustrating a relationship between the phase of the amplified desired signal component (hereinafter referred to as a desired signal component) and the phase of the first IM3 component (hereinafter referred to as a first IM3 component), at a point a1 of FIG. 1.

The first amplification section 101-1 amplifies a desired signal component input thereinto (hereinafter referred to as an input desired signal component). When the first amplification section 101-1 amplifies the input desired signal component, an IM3 component occurs. Note that, in the first amplification section 101-1, a frequency component of first IM3a occurring due to the desired signal component is referred to as a first IM3 component. The first amplification section 101-1 outputs an amplified desired signal and the first IM3 component. A difference between the phase of the amplified desired signal component and the phase of the first IM3 component is assumed to be 180°. FIG. 2A is a schematic diagram illustrating a relationship between the phase of the amplified desired signal component (hereinafter referred to as a desired signal component $S_{a1}$) and the phase of the first IM3 component (hereinafter referred to as a first IM3 component $X_{a1}$) at a point a1 of FIG. 1. As illustrated in FIG. 2A, the difference between the phase of the desired signal component $S_{a1}$ and the phase of the first IM3 component $X_{a1}$ is 180°.

The first parallel feedback section 102-1 changes the phase of the desired signal component $S_{a1}$ and the phase of the first IM3 component $X_{a1}$. In the first parallel feedback section 102-1, the frequency dependency of the phase changes of the desired signal component Sa1 and the first IM3 component $X_{a1}$ is sufficiently small and is assumed to be negligible.

Figure 2B:
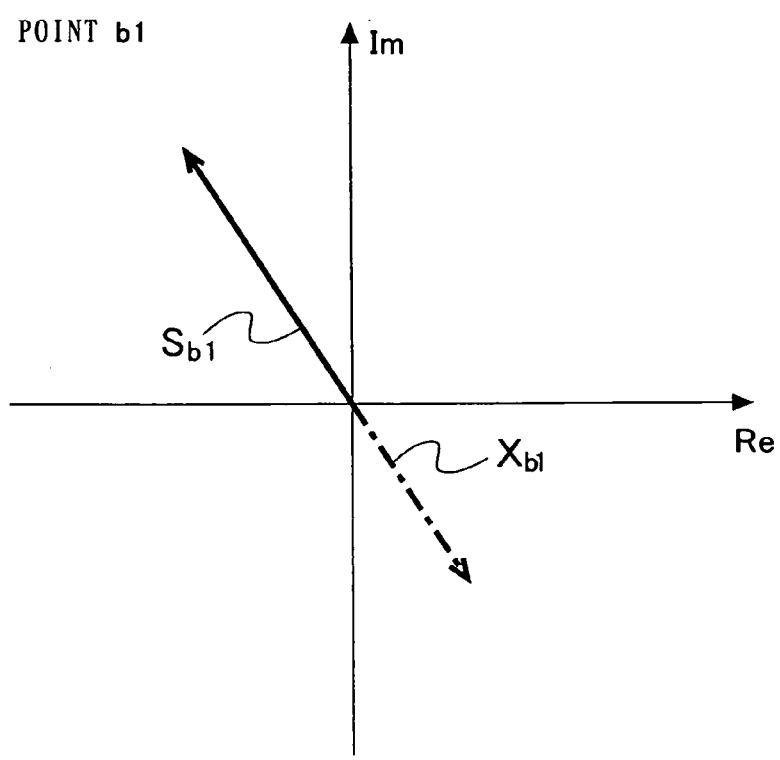
FIG. 2B is a schematic diagram illustrating a relationship between the phase of the desired signal component whose phase has been changed and the phase of the first IM3 component whose phase has been changed, at a point b1 of FIG. 1.

FIG. 2B is a schematic diagram illustrating a relationship between the phase of the desired signal component $S_{a1}$ whose phase has been changed at a point b1 of FIG. 1 (hereinafter referred to as a desired signal component $S_{b1}$) and the phase of the first IM3 component $X_{a1}$ whose phase has been changed at the point b1 (hereinafter referred to as a first IM3 component $X_{b1}$) Note that the input desired signal component is placed on the real axis in FIG. 2B. As illustrated in FIG. 2B, the difference between the phase of the desired signal component $S_{b1}$ and the phase of the first IM3 component $X_{b1}$ is kept to be 180°.

Figure 2C:
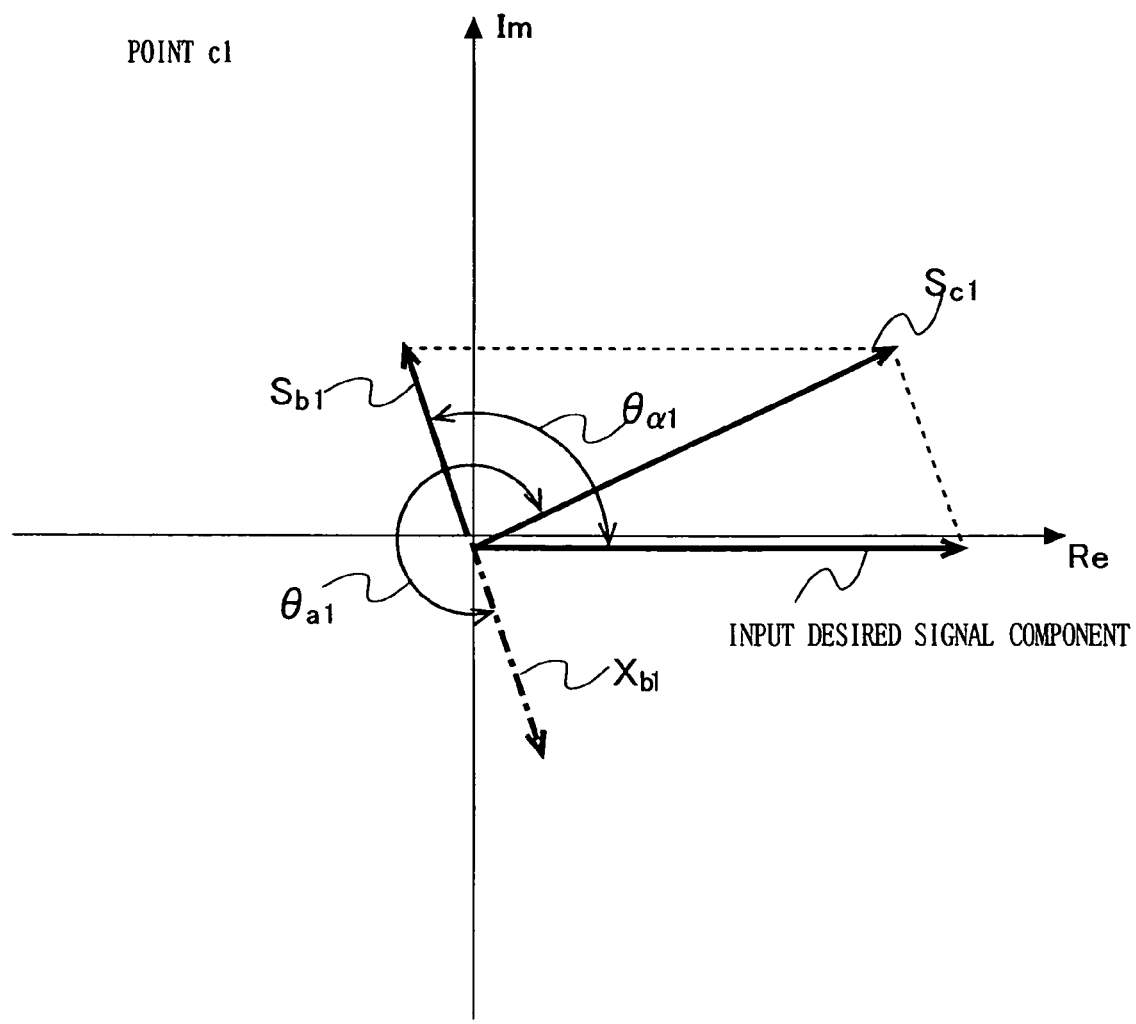
FIG. 2C is a schematic diagram a relationship between the phase of the input desired signal component, the phase of the fed-back desired signal component, and the phase of the fed-back first IM3 component, at a point c1 of FIG. 1.

FIG. 2C is a schematic diagram a relationship between the phase of the input desired signal component, the phase of the fed-back desired signal component $S_{b1}$, and the phase of the fed-back first IM3 component $X_{b1}$ at a point c1 of FIG. 1. Note that, in FIG. 2C, the input desired signal component is placed on the real axis. As illustrated in FIG. 2C, the input desired signal component and the desired signal component $S_{b1}$ fed back from the first parallel feedback section 102-1 are combined at the point c1 to generate a desired signal component $S_{c1}$. The input desired signal component and the desired signal component $S_{b1}$ have different phases from each other. Therefore, the desired signal component $S_{c1}$ has a phase different from the phases of the input desired signal component and the desired signal component $S_{b1}$. Note that the phase of the first IM3 component $S_{b1}$ is not changed at the point c1.

Figure 2D:
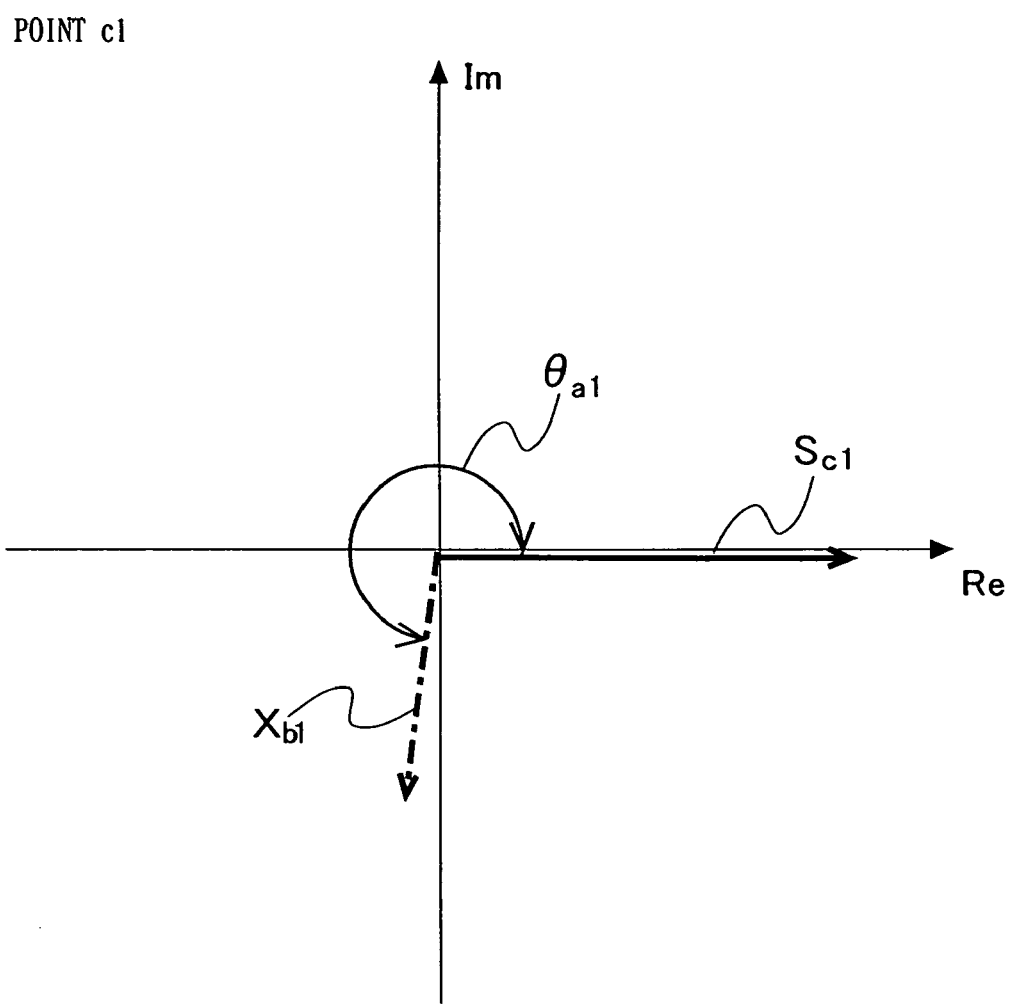
FIG. 2D is a shematic diagram illustrating a relationship between the phase of the desired signal component and the phase of the first IM3 component, at the point c1 of FIG. 1.

FIG. 2D is a diagram illustrating a relationship between the phase of the desired signal component $S_{c1}$ and the phase of the first IM3 component $X_{b1}$ at the point c1 of FIG. 1. As illustrated in FIG. 2D, the difference between the phase of the desired signal component $S_c$ and the phase of the first IM3 component $X_b$ is represented by $\theta_{a1}$.

A difference between the phase of the input desired signal component and the phase of the desired signal component $S_{b1}$ at the point c1 is represent by $\theta_{\alpha1}$. In this case, it is preferable that $\theta_{\alpha1}$ has a value of $90° \leq \theta_{\alpha1} \leq 270°$. The reason is described as follows. When the value of $\theta_{\alpha1}$ is $\theta_{\alpha1} \leq 90°$ or $\theta_{\alpha1} \geq 270°$, the feedback of the desired signal component $S_{b1}$ from the first parallel feedback section 102-1 is a positive feedback. As a result, the first parallel feedback amplifier 10-1 becomes unstable and difficult to control.

The first amplification section 101-1 amplifies the desired signal component $S_{c1}$ and the first IM3 component $X_{b1}$ while maintaining the phase difference $\theta_{a1}$. When the first amplification section 101-1 amplifies the desired signal component $S_{c1}$, a new first IM3 component occurs.

FIG. 2E is a schematic diagram illustrating a relationship between the phase of the amplified desired signal component $S_{c1}$ at a point d1 of FIG. 1 (hereinafter referred to as a desired signal component $S_{d1}$), the phase of the amplified first IM3 component $X_{b1}$ at the point d1 (hereinafter referred to as a first IM3 component $X_{d1-1}$), and the phase of the new first IM3 component at the point d1 (hereinafter referred to as a first IM3 component $X_{d1-2}$). As illustrated in FIG. 2E, the difference between the phase of desired signal component $S_{d1}$ and the phase of the first IM3 component $X_{d1-2}$ is 180° at the point d1. The first IM3 component $X_{d1-1}$ and the first IM3 component $X_{d1-2}$ are combined at the point d1 to generate a combined IM3 component. In the following description, the combined IM3 component generated in the first parallel feedback amplifier 10-1 is regarded as a first IM3 component $X_{d1}$.

FIG. 2F is a schematic diagram illustrating a relationship between the phase of the desired signal component $S_{d1}$ and the phase of the first IM3 component $X_{d1}$ at a point e1 of FIG. 1. As illustrated in FIG. 2F, the difference between the phase of the desired signal component $S_{d1}$ and the phase of the first IM3 component $X_{d1}$ is not changed from the state of FIG. 2E. The first parallel feedback amplifier 10-1 outputs a desired signal component $S_{e1}$ and a first IM3 component $X_{e1}$ in a state illustrated in FIG. 2F.

At the point d1, portions of the desired signal component $S_{d1}$ and the first IM3 component $X_{d1}$ are input to the first parallel feedback section 102-1. As a result, the first parallel feedback section 102-1 changes the phases of the desired signal component $S_{d1}$ and the first IM3 component $X_{d1}$ while maintaining the relationship between the phase of the desired signal component $S_{d1}$ and the phase of the first IM3 component $X_{d1}$ of FIG. 2F, and feeds back the resultant desired signal component $S_{d1}$ and first IM3 component $X_{d1}$. By the first parallel feedback amplifier 10-1 repeatedly performing the above-described operation, the difference between the phase of the desired signal component $S_{d1}$ and the phase of the first IM3 component $X_{d1}$ at the point d1 is changed and converged to a certain value. In the following description, the difference between the phase of the desired signal component $S_{d1}$ and the phase of the first IM3 component $X_{d1}$ output from the first parallel feedback amplifier 10-1 is represented by $\theta_{b1}$. Note that, when the difference between the phase of the desired signal component amplified by the first amplification section 101-1 and the phase of the first IM3 component generated in the first amplification section 101-1 is 180°, $\theta_{b1}$ has a value of $90° \leq \theta_{b1} \leq 270°$.

Next, an operation of the second parallel feedback amplifier 10-2 will be described.

The second parallel feedback amplifier 10-2 receives the desired signal component $S_{d1}$ and first IM3 component $X_{d1}$. The second amplification section 101-2 amplifies the desired signal component $S_{d1}$ and the first IM3 component $X_{d1}$, while maintaining the phase difference $\theta_{b1}$. When the second amplification section 101-2 amplifies the desired signal component $S_{d1}$, an IM3 component occurs. Note that the IM3 component occurring due to the desired signal component in the second amplification section 101-2 is referred to as a second IM3 component. A difference between the phase of the amplified desired signal component $S_{d1}$ and the phase of the second IM3 component output from the second amplification section 101-2 is 180°.

Figure 3A:
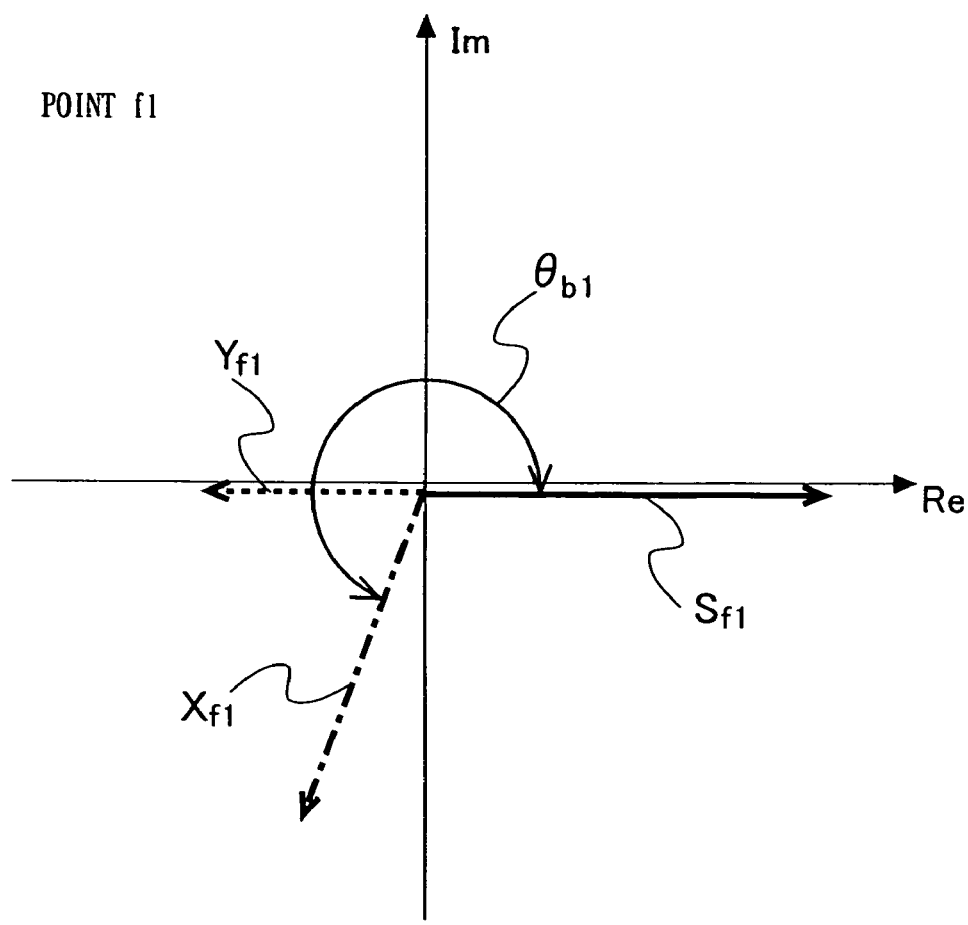
FIG. 3A is a schematic diagram illustrating a relationship between the phase of the amplified desired signal component, the phase of the amplified first IM3 component, and the phase of the newly occuring second IM3 component, at a point f1 of FIG. 1.

FIG. 3A is a schematic diagram illustrating a relationship between the phase of the amplified desired signal component $S_{d1}$ at a point f1 of FIG. 1 (hereinafter referred to as a desired signal component $S_{f1}$), the phase of the amplified first IM3 component $X_{d1}$ at the point f1 (hereinafter referred to as a first IM3 component $X_{f1}$), and the phase of the second IM3 component at the point f1 (hereinafter referred to as a second IM3 component $Y_{f1}$). As illustrated in FIG. 3A, the difference between the phase of the desired signal component $S_{f1}$ and the phase of the first IM3 component $X_{f1}$ is $\theta_{b1}$ at the point f1. A difference between the phase of the desired signal component $S_{f1}$ and the phase of the second IM3 component $Y_{f1}$ is 180°.

The second parallel feedback section 102-2 changes the phase of the desired signal component $S_{f1}$, the phase of the first IM3 component $X_{f1}$, and the phase of the second IM3 component $Y_{f1}$. In the second parallel feedback section 102-2, the frequency dependency of the phase changes of the desired signal component $S_{f1}$, the first IM3 component $X_{f1}$ and the second IM3 component $Y_{f1}$ is sufficiently small and is assumed to be negligible.

Figure 3B:
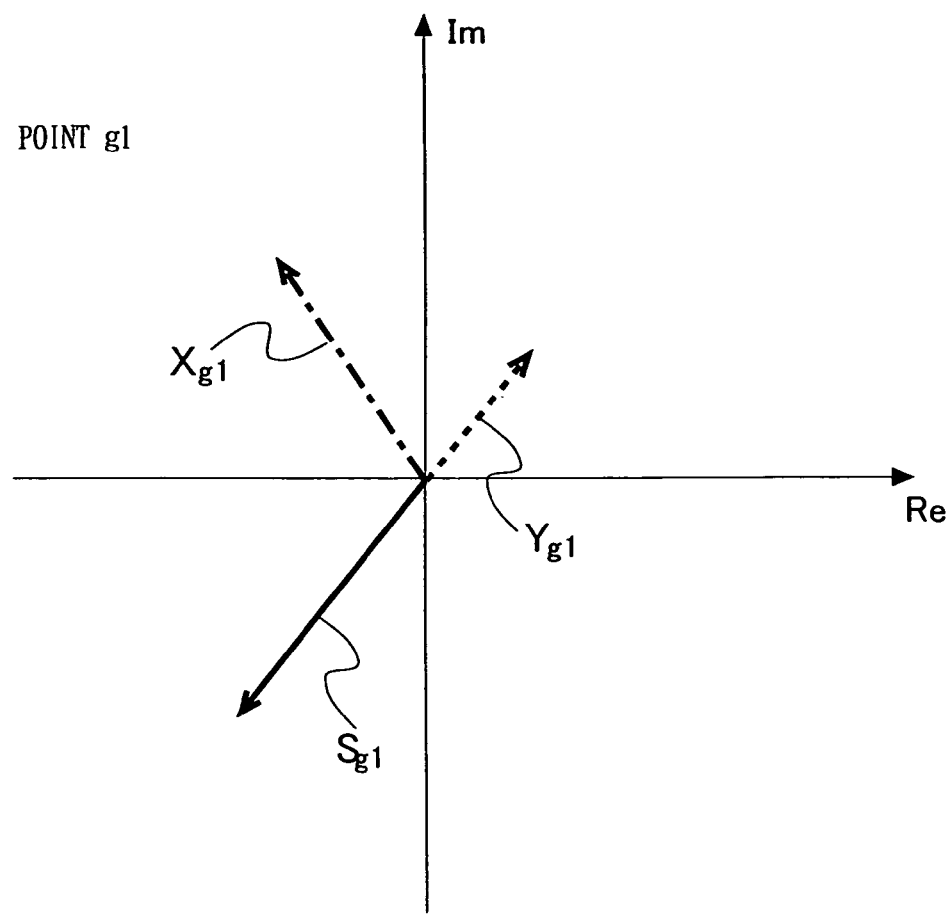
FIG. 3B is a schematic diagram illustrating a relationship between the phase of the desired signal component whose phase has been changed, the phase of the first IM3 component whose phase has been changed, and the phase of the second IM3 component whose phase has been changed, at a point g1 of FIG. 1.

FIG. 3B is a schematic diagram illustrating a relationship between the phase of the desired signal component $S_{f1}$ whose phase has been changed at a point g1 of FIG. 1 (hereinafter referred to as a desired signal component $S_{g1}$), the phase of the first IM3 component $S_{f1}$ whose phase has been changed at the point g1 (hereinafter referred to as a first IM3 component $X_{g1}$), and the phase of the second IM3 component $Y_{f1}$ whose phase has been changed at the point g1 (hereinafter referred to as a second IM3 component $Y_{g1}$). Note that the desired signal component $S_{d1}$ is placed on the real axis in FIG. 3B. As illustrated in FIG. 3B, at the point g1, the relationship between the phase of the desired signal component $S_{g1}$, the phase of the first IM3 component $X_{g1}$, and the phase of the second IM3 component $Y_{g1}$ is not changed from the state of FIG. 3A.

Figure 3C:
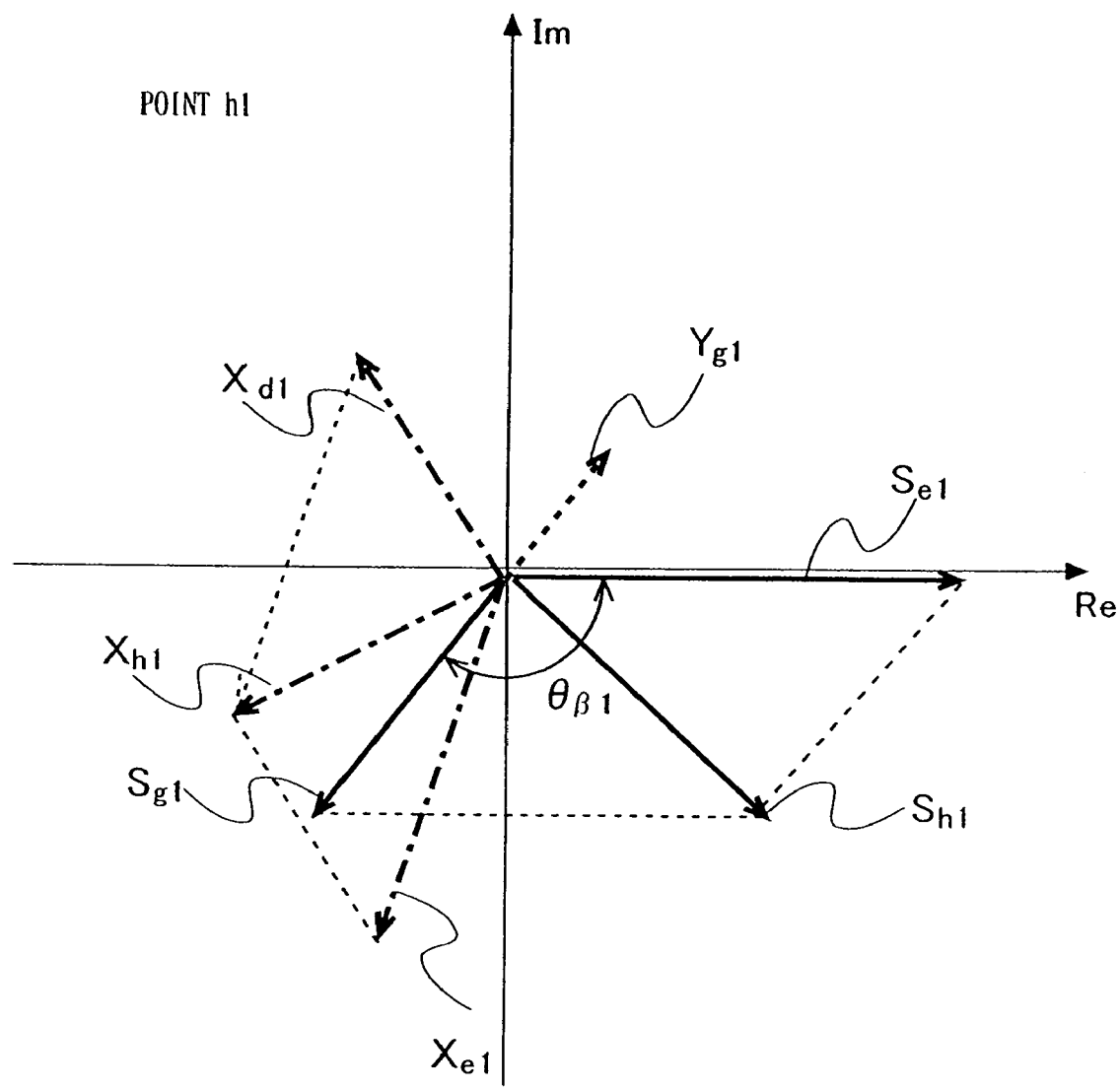
FIG. 3C is a schematic diagram illustrating a relationship between the phase of the desired signal component, the phase of the fed-back desired signal component, the phase of the fed-back first IM3 component, and the phase of the fed-back second IM3 component, at a point h1 of FIG. 1.

FIG. 3C is a schematic diagram illustrating a relationship between the phase of the desired signal component $S_{d1}$, the phase of the fed-back desired signal component $S_{g1}$, the phase of the fed-back first IM3 component $X_{g1}$, and the phase of the fed-back second IM3 component $Y_{g1}$, at a point h1 of FIG. 1. Note that the desired signal component $S_{d1}$ is placed on the real axis in FIG. 3C. As illustrated in FIG. 3C, at the point h1, the desired signal component $S_{d1}$ and the fed-back desired signal component $S_{g1}$ are combined to generate a desired signal component $S_{h1}$. Also, the first IM3 component $X_{d1}$ and the fed-back first IM3 component $X_{g1}$ are combined to generate a first IM3 component $X_{h1}$.

As illustrated in FIG. 3C, the phase of the desired signal component $S_{d1}$ is different from the phase of the desired signal component $S_{g1}$. Therefore, the phase of the desired signal component $S_{h1}$ is different from the phase of the desired signal component $S_{d1}$ and the phase of the desired signal component $S_{g1}$. Also, the phase of the first IM3 component $X_{d1}$ is different from the phase of the first IM3 component $X_{g1}$. Therefore, the phase of the first IM3 component $X_{h1}$ is different from the phase of the first IM3 component $X_{d1}$ and the first IM3 component $X_{g1}$. On the other hand, at the point h1, the phase of the second IM3 component $Y_{g1}$ is not changed.

Figure 3D:
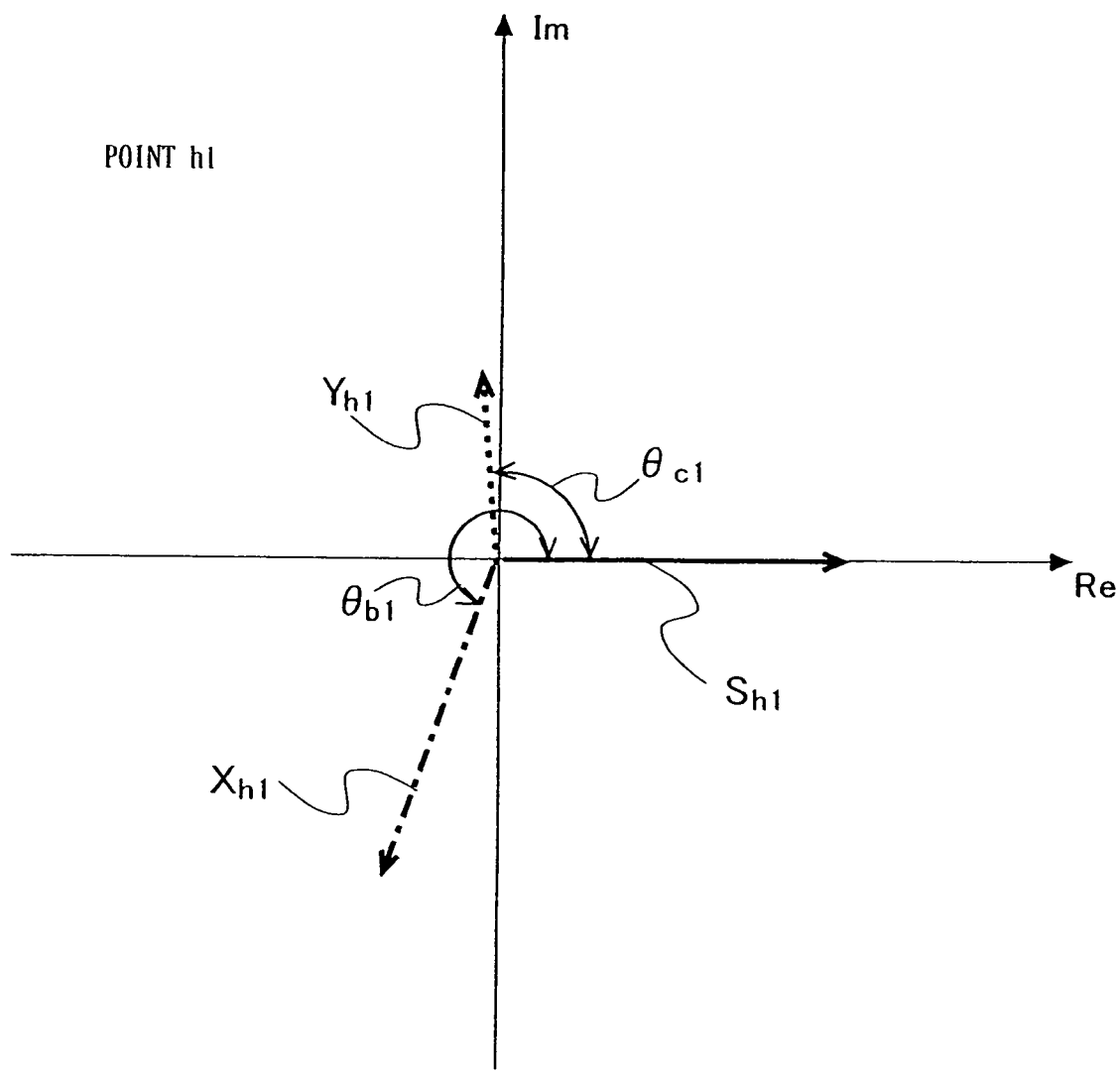
FIG. 3D is a schematic diagram illustrating a relationship between the phase of the desired signal component, the phase of the first IM3 component, and the phase of the second IM3 component, at the point h1 of FIG. 1.

FIG. 3D is a schematic diagram illustrating a relationship between the phase of the desired signal component $S_{h1}$, the phase of the first IM3 component $X_{h1}$, and the phase of the second IM3 component $Y_{g1}$, at the point h1 of FIG. 1. As illustrated in FIG. 3D, the difference between the phase of the desired signal component $S_{h1}$ and the phase of the first IM3 component $X_{h1}$ is not changed from $\theta_{b1}$. On the other hand, whereas the difference between the phase of the second IM3 component $Y_{g1}$ and the phase of the desired signal component $S_{g1}$ is 180°, the difference between the phase of the desired signal component $S_{h1}$ and the phase of the second IM3 component $Y_{g1}$ is $\theta_{c1}$. Thus, at the point h1, the relationship between the phase of the desired signal component and the phase of the second IM3 component is changed from the state of FIG. 3A to the state of FIG. 3D.

The difference between the phase of the desired signal component $S_{d1}$ and the phase of the desired signal component $S_{g1}$ is assumed to be $\theta_{\beta1}$ at the point h1. In this case, it is preferable that $\theta_{\beta1}$ has a value of $90° \leq \theta_{\beta1} \leq 270°$. The reason is described as follows. When the value of $\theta_{\beta1}$ is $\theta_{\beta1} \leq 90°$ or $\theta_{\beta1} \geq 270°$, the feedback of the desired signal component $S_{g1}$ from the second parallel feedback section 102-1 is a positive feedback. As a result, the second parallel feedback amplifier 10-2 becomes unstable and difficult to control.

The second amplification section 101-2 amplifies the desired signal component $S_{h1}$, the first IM3 component $X_{h1}$, and the second IM3 component $Y_{g1}$, while maintaining the phase relationship of FIG. 3D. When the desired signal component $S_{h1}$ is amplified, the second IM3 component newly occurs.

Figure 3E:
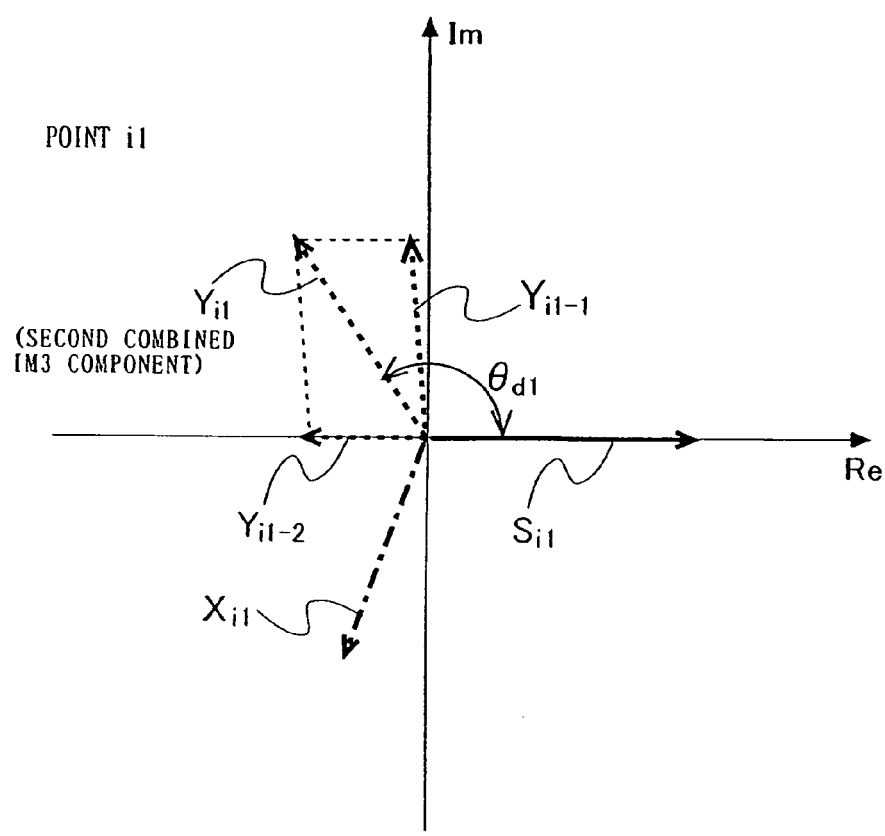
FIG. 3E is a schematic diagram illustrating a relationship between the phase of the amplified desired signal component at a point i1 of FIG. 1, the phase of the amplified first IM3 component at the point i1, the phase of the amplified second IM3 component at the point i1, and the phase of the second IM3 component occurring when the desired signal component is amplified.

FIG. 3E is a schematic diagram illustrating a relationship between the phase of the amplified desired signal component $S_{h1}$ at a point i1 of FIG. 1 (hereinafter referred to as desired signal component $S_{i1}$), the phase of the amplified first IM3 component $X_{h1}$ at the point i1 (hereinafter referred to as a first IM3 component $X_{i1}$), the phase of the amplified second IM3 component $Y_{h1}$ at the point i1 (hereinafter referred to as a second IM3 component $Y_{i1-1}$), and the phase of the second IM3 component occurring when the desired signal component $S_{h1}$ is amplified (herein after referred to as a second IM3 component $Y_{i1-2}$) As illustrated in FIG. 3E, the difference between the phase of the desired signal component $S_{i1}$ and the phase of the second IM3 component $Y_{i1-2}$ is 180°. At the point i1, the second IM3 component $Y_{i1-1}$ and the second IM3 component $Y_{i1-2}$ are combined to generate a second combined IM3 component (hereinafter referred to as a second IM3 component $Y_{i1}$). A difference between the phase of the desired signal component $S_{i1}$ and the phase of the second IM3 component $Y_{i1}$ is represented by $\theta_{d1}$. Note that, at the point i1, the difference between the phase of the desired signal component $S_{i1}$ and the phase of the first IM3 component $X_{i1}$ is not changed from $\theta_{b1}$.

Figure 3F:
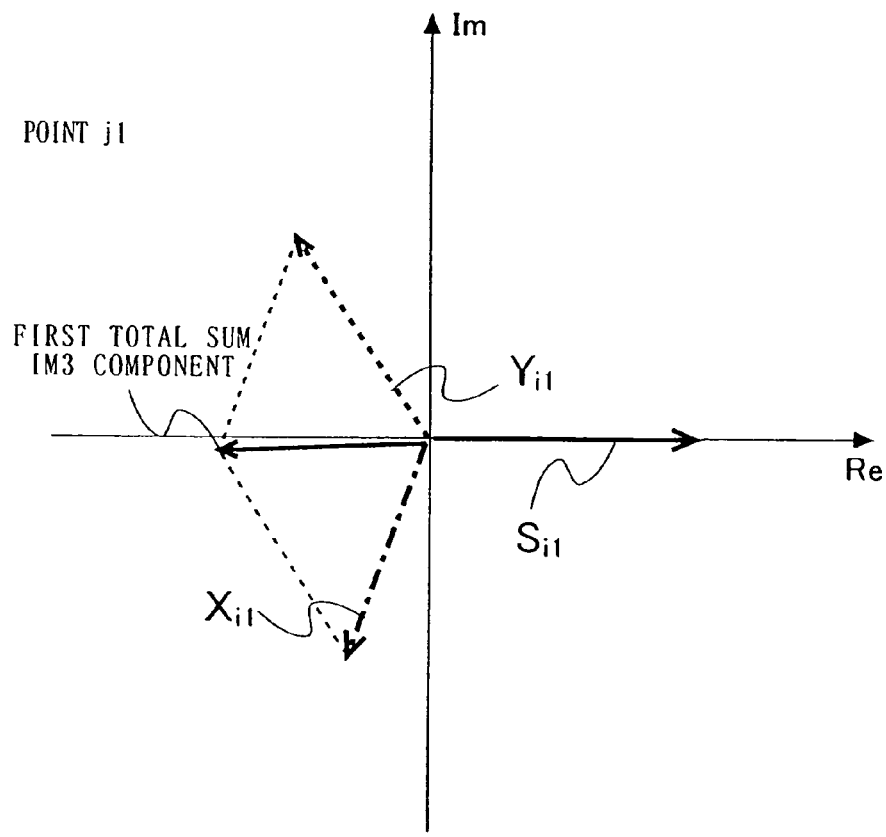
FIG. 3F is a schematic diagram illustrating a relationship between the phase of the desired signal component, the phase of the first IM3 component, and the phase of the second IM3 component, at a point j1 of FIG. 1.

FIG. 3F is a schematic diagram illustrating a relationship between the phase of the desired signal component $S_{i1}$, the phase of the first IM3 component $X_{i1}$, and the phase of the second IM3 component $Y_{i1}$, at a point j1 of FIG. 1. As illustrated in FIG. 3F, at the point j1, the first IM3 component $X_{i1}$ and the second IM3 component $Y_{i1}$ are combined to generate a first total sum IM3 component. In this case, the phases of the first IM3 component $X_{i1}$ and the second IM3 component $Y_{i1}$ are such that the phases are canceled with each other. The canceling phases of the first IM3 component $X_{i1}$ and the second IM3 component $Y_{i1}$ will be described in detail below.

Note that, at the point i1, the desired signal component $S_{i1}$, the first IM3 component $X_{i1}$, and the second IM3 component $Y_{i1}$ are also input to the second parallel feedback section 102-2. As a result, the second parallel feedback section 102-2 changes the phase of the desired signal component $S_{i1}$ and the phase of the first IM3 component $X_{i1}$ while maintaining the relationship between the phase of the desired signal component $S_{i1}$ and the phase of the first IM3 component $X_{i1}$ of FIG. 3E. By the second parallel feedback amplifier 10-2 repeatedly performing the above-described operation, the difference between the phase of the desired signal component $S_{i1}$ and the second IM3 component $Y_{i1}$ at the point i1 is changed and eventually converged to a certain value. In the following description, the difference between the phase of the desired signal component $S_{i1}$ and the phase of the second IM3 component $Y_{i1}$ at the point j1 is represented by $\theta_{d1}$. Note that, when the difference between the desired signal amplified in the second amplification section 101-2, and the second IM3 component generated in the second amplification section 101-2 is 180°, $\theta_{d1}$ has a value of $90° \leq \theta_{d1} \leq 270°$.

In this manner, the multistage amplifying device 1 causes the first IM3 component occurring in the first parallel feedback amplifier 10-1 and the second IM3 component occurring in the second parallel feedback amplifier 10-2 to cancel out, thereby suppressing IM3.

Figure 4:
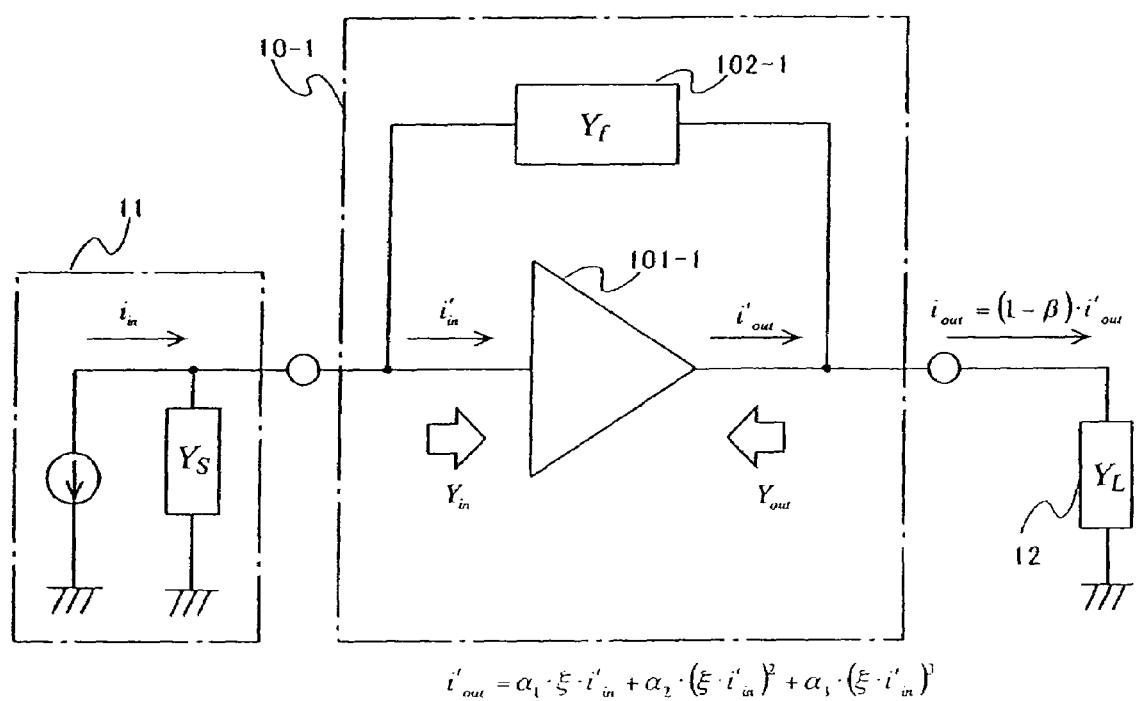
FIG. 4 is a diagram for explaining a detailed operation of the first parallel feedback amplifier 10-1.

Next, detailed operations of the first parallel feedback amplifier 10-1 and the second parallel feedback amplifier 10-2 will be described. FIG. 4 is a diagram for explaining the detailed operation of the first parallel feedback amplifier 10-1. Note that the operation of the second parallel feedback amplifier 10-2 is similar to that of the first parallel feedback amplifier 10-1.

As shown in FIG. 4, the first parallel feedback amplifier 10-1 receives a desired signal component from a signal source 11. An input current to the first parallel feedback amplifier 10-1 is represented by $i_{in}$. An output current from the first parallel feedback amplifier 10-1 is represented by $i_{out}$. An output current from the first amplification section 101-1 is represented by $i'_{out}$. It is assumed that a current of $\beta(\omega) \cdot i'_{out}$ flows through the first parallel feedback section 102-1, where $\beta(\omega)$ represents a feedback amount. In FIG. 4, an input admittance of the first amplification section 101-1 is represented by $Y_{in}$, an admittance of the first parallel feedback section 102-1 is represented by $Y_{f1}$, an internal admittance of the signal source 11 is represented by $Y_s$, and a load admittance of a load resistance 12 is represented by $Y_L$. An output admittance $Y_{out}$ of the first amplification section 101-1 is sufficiently small to be negligible.

When the parameters are defined as described above, a current flowing through the load resistance 12 is represented by:

$$i_{out} = i'_{out} - \beta(\omega) \cdot i'_{out} = \{1 - \beta(\omega)\} \cdot i'_{out} \quad (1)$$

According to Kirchhoff's law, $i_{out}$ and $i'_{out}$ are represented by:

$$\frac{i_{out}}{Y_L} = \frac{\beta(\omega) \cdot i'_{out}}{Y_{f1}} + \frac{\beta(\omega) \cdot i'_{out}}{Y_S + Y_{in}}. \quad (2)$$

$\beta(\omega)$ is obtained from expressions (1) and (2) to be represented by:

$$\beta(\omega) = \frac{\eta(\omega) \cdot Y_{f1}}{Y_L + \eta(\omega) \cdot Y_{f1}}. \quad (3)$$

In expression (3), $\eta(\omega) = (Y_S + Y_{in})/(Y_s + Y_{in} + Y_{f1})$.

In general, parallel feedback amplifiers are current feedback amplifiers. Therefore, input-output power characteristics of a current feedback amplifier are derived from input-output power characteristics of the first amplification section 101-1. The input-output power characteristics of the first amplification section 101-1 of FIG. 4 are represented by:

$$i'_{out} = \alpha_1(\omega) \cdot \xi(\omega) \cdot i'_{in} + \alpha_2(\omega) \cdot \{\xi(\omega) \cdot i'_{in}\}^2 + \alpha_3(\omega) \cdot \{\xi(\omega) \cdot i'_{in}\}^3 \quad (4)$$

where first- to third-order nonlinearity are taken into consideration, i.e., $\alpha_n(\omega)$ includes a first- to third-order coefficients, and $\epsilon(\omega)$ is $\epsilon(\omega) = (Y_{in} + Y_S)/Y_{in}$.

When the first parallel feedback section 102-1 has an admittance of 0, i.e., the first parallel feedback amplifier 10-1 is an open-loop amplifier, the input current $i_n$ from the signal source 11 is $i_{in} = \epsilon(\omega) \cdot i_{out}$. The output current $i_{out}$ from the first parallel feedback amplifier 10-1 to the load resistance 12 is $i_{out} = i'_{out}$. Therefore, it will be understood that $\alpha_1(\omega)$ represents a current gain of the desired signal of the open-loop amplifier. Similarly, it will be understood that $\alpha_2(\omega)$ represents a current gain of the second harmonic, and $\alpha_3(\omega)$ represents a current gain of the third harmonic.

According to Kirchhoff's law, expression (5) is established:

$$\xi(\omega) \cdot i'_{in} = \eta(\omega) \cdot i_{in} + \frac{\beta(\omega)}{1 - \beta(\omega)} \cdot i_{out}. \quad (5)$$

According to expressions (4) and (5), the input-output current characteristics of a current feedback amplifier is represented by:

$$i_{out} = \{1 - \beta(\omega)\} \cdot \left[ \alpha_1(\omega) \cdot \left\{ \eta(\omega) \cdot i_{in} + \frac{\beta(\omega)}{1 - \beta(\omega)} \cdot i_{out} \right\} + \alpha_2(\omega) \cdot \left\{ \eta(\omega) \cdot i_{in} + \frac{\beta(\omega)}{1 - \beta(\omega)} \cdot i_{out} \right\}^2 + \alpha_3(\omega) \cdot \left\{ \eta(\omega) \cdot i_{in} + \frac{\beta(\omega)}{1 - \beta(\omega)} \cdot i_{out} \right\}^3 \right]. \quad (6)$$

However, the right side of expression (6), which represents the input-output power characteristics of the current feedback amplifier, includes $i_{out}$. Therefore, the output current $i_{out}$ cannot be solved from expression (6). Therefore, a nonlinear closed-loop transfer function of $i_{out}$ is derived using Volterra series as described below.

When an output current $i_{out}$ of a first amplification section 101-1 is assumed to be represented by a Volterra series of an input current $i_{in}$ of the first amplification section 101-1, expression (7) is obtained:

$$i_{out} = \chi_1(\omega_1) o i_{in} + \chi_2(\omega_1, \omega_2) o i_{in}^2 + \chi_3(\omega_1, \omega_2, \omega_3) o i_{in}^3 \quad (7)$$

where $\chi_n(\ )$ represents a complex coefficient of the Volterra series.

In expression (7), in the case of $i_{in} = \exp(j\omega_1 t) + \exp(j\omega_2 t)$, the first-order term of $i_{out}$ of expression (7) is represented by:

$$i_{out} = \chi_1(\omega_1) \cdot e^{j\omega_1 t} + \chi_1(\omega_2) \cdot e^{j\omega_2 t} \quad (8).$$

From expression (7), the nonlinear closed-loop transfer function $\chi_n()$ of the output current $i_{out}$ of the first parallel feedback amplifier 10-1 is obtained.

Initially, $\chi_1(\omega_1)$ of expression (7) is derived. When the input current $i_{in}$ of the first parallel feedback amplifier 10-1 is represented by $i_{in}=\exp(j\omega_1 t)$, the first-order term of expression (7) is represented by:

$$i_{out} = \chi_1(\omega_1) \cdot e^{j\omega_1 t} \qquad (9)$$

When expression (9) is substituted in to expression (6), both sides of expression (6) have the same coefficient of the term $\exp(j\omega_1 t)$. Therefore, $\chi_1(\omega_1)$ is represented by:

$$\chi_1(\omega_1) = \{1 - \beta(\omega_1)\} \cdot \alpha_1(\omega_1) \cdot \qquad (10)$$
$$\left\{\eta(\omega_1) + \frac{\beta(\omega_1)}{1 - \beta(\omega_1)} \cdot \chi_1(\omega_1)\right\} \therefore$$
$$\chi_1(\omega_1) = \frac{\eta(\omega_1) \cdot \{1 - \beta(\omega_1)\} \cdot \alpha_1(\omega_1)}{1 - \beta(\omega_1) \cdot \alpha_1(\omega_1)}.$$

Next, assuming that the input current $i_{in}$ of the first parallel feedback amplifier 10-1 is represented by $i_{in}=\exp(j\omega_1 t)+\exp(j\omega_2 t)$, $\chi_2(\omega_1, \omega_2)$ is derived. Taking into consideration of the first- to second-order terms of $i_{in}$ in expression (7), $i_{in}$ is represented by:

$$i_{out} = \sum_{q1=1}^{2} \chi_1(\omega_{q1}) \cdot e^{j\omega_{q1} t} + \sum_{q1=1}^{2}\sum_{q2=1}^{2} \chi_2(\omega_{q1}, \omega_{q2}) \cdot e^{j(\omega_{q1}+\omega_{q2}) t}. \qquad (11)$$

When expression (11) is substituted into expression (6), both sides of expression (6) have the same coefficient of the term $\exp(j(\omega_1+\omega_2))$. Therefore, $\chi_2(\omega_1, \omega_2)$ is represented by:

$$2 \cdot \chi_2(\omega_1, \omega_2) = \{1 - \beta(\omega_1 + \omega_2)\} \cdot [\alpha_1(\omega_1 + \omega_2) \cdot \qquad (12)$$
$$\frac{\beta(\omega_1 + \omega_2)}{1 - \beta(\omega_1 + \omega_2)} \cdot 2 \cdot \chi_2(\omega_1, \omega_2) +$$
$$2 \cdot \alpha_2(\omega_1 + \omega_2) \cdot \{\eta(\omega_1 + \omega_2) +$$
$$\frac{\beta(\omega_1 + \omega_2)}{1 - \beta(\omega_1 + \omega_2)} \cdot \chi_1(\omega_1)\} \cdot \{\eta(\omega_1 + \omega_2) +$$
$$\frac{\beta(\omega_1 + \omega_2)}{1 - \beta(\omega_1 + \omega_2)} \cdot \chi_1(\omega_2)\}] \therefore \chi_2(\omega_1, \omega_2)$$
$$= \frac{\{1 - \beta(\omega_1 + \omega_2)\} \cdot \alpha_2(\omega_1 + \omega_2)}{1 - \beta(\omega_1 + \omega_2) \cdot \alpha_1(\omega_1 + \omega_2)} \cdot$$
$$\frac{\eta(\omega_1)}{1 - \beta(\omega_1) \cdot \alpha_1(\omega_1)} \cdot \frac{\eta(\omega_2)}{1 - \beta(\omega_2) \cdot \alpha_1(\omega_2)}.$$

Note that expression (12) includes $\chi_1(\omega_1)$ of expression (10).

Next, assuming that the input current $i_{in}$ of the first parallel feedback amplifier 10-1 is represented by $i_{in}=\exp(j\omega_1 t)+\exp(j\omega_2 t)+\exp(j\omega_3 t)$, $\chi_3(\omega_1, \omega_2, \omega_3)$ is derived. Taking into consideration the first- to third-order terms of $i_{in}$ of expression (7), $i_{in}$ is represented by:

$$i_{out} = \sum_{q1=1}^{3} \chi_1(\omega_{q1}) \cdot e^{j\omega_{q1} t} + \qquad (13)$$
$$\sum_{q1=1}^{3}\sum_{q2=1}^{3} \chi_2(\omega_{q1}, \omega_{q2}) \cdot e^{j(\omega_{q1}+\omega_{q2}) t} +$$
$$\sum_{q1=1}^{3}\sum_{q2=1}^{3}\sum_{q3=1}^{3} \chi_3(\omega_{q1}, \omega_{q2}, \omega_{q3}) \cdot e^{j(\omega_{q1}+\omega_{q2}+\omega_{q3}) t}.$$

When expression (13) is substituted into expression (6), both sides of expression (6) have the same coefficient of the term $\exp(j(\omega_1+\omega_2+\omega_3))$. Therefore, $\chi_3(\omega_1, \omega_2, \omega_3)$ is represented by:

$$6 \cdot \chi_3(\omega_1, \omega_2, \omega_3) = \{1 - \beta(\omega_1 + \omega_2 + \omega_3)\} \cdot \qquad (14)$$
$$[\alpha_1(\omega_1 + \omega_2 + \omega_3) \cdot$$
$$\frac{\beta(\omega_1 + \omega_2 + \omega_3)}{1 - \beta(\omega_1 + \omega_2 + \omega_3)} \cdot 6 \cdot$$
$$\chi_3(\omega_1, \omega_2, \omega_3) + \alpha_2(\omega_1 + \omega_2 + \omega_3) \cdot$$
$$2 \cdot \left\{\left(\eta(\omega_1) + \frac{\beta(\omega_1)}{1 - \beta(\omega_1)} \cdot \chi_1(\omega_1)\right) \cdot \right.$$
$$\frac{\beta(\omega_2 + \omega_3)}{1 - \beta(\omega_2 + \omega_3)} \cdot 2 \cdot \chi_2(\omega_2, \omega_3) +$$
$$\left(\eta(\omega_2) + \frac{\beta(\omega_2)}{1 - \beta(\omega_2)} \cdot \chi_1(\omega_2)\right) \cdot$$
$$\frac{\beta(\omega_1 + \omega_3)}{1 - \beta(\omega_1 + \omega_3)} \cdot 2 \cdot \chi_2(\omega_3, \omega_1) +$$
$$\left(\eta(\omega_1) + \frac{\beta(\omega_3)}{1 - \beta(\omega_3)} \cdot \chi_1(\omega_3)\right) \cdot$$
$$\frac{\beta(\omega_1 + \omega_2)}{1 - \beta(\omega_1 + \omega_2)} \cdot 2 \cdot \chi_2(\omega_1, \omega_2)\right\} +$$
$$\alpha_3(\omega_1 + \omega_2 + \omega_3) \cdot 6 \cdot$$
$$\left\{\eta(\omega_1) + \frac{\beta(\omega_1)}{1 - \beta(\omega_1)} \cdot \chi_1(\omega_1)\right\} \cdot$$
$$\left\{\eta(\omega_2) + \frac{\beta(\omega_2)}{1 - \beta(\omega_2)} \cdot \chi_1(\omega_2)\right\} \cdot$$
$$\left\{\eta(\omega_3) + \frac{\beta(\omega_3)}{1 - \beta(\omega_3)} \cdot \chi_1(\omega_3)\right\}]$$

$$\therefore \chi_3(\omega_1, \omega_2, \omega_3) \cong \frac{\{1 - \beta(\omega_1 + \omega_2 + \omega_3)\} \cdot \frac{\alpha_3(\omega_1 + \omega_2 + \omega_3)}{1 - \beta(\omega_1 + \omega_2 + \omega_3)} \cdot}{\alpha_3(\omega_1 + \omega_2 + \omega_3)}$$
$$\frac{\eta(\omega_1)}{1 - \beta(\omega_1) \cdot \alpha_1(\omega_1)} \cdot$$
$$\frac{\eta(\omega_2)}{1 - \beta(\omega_2) \cdot \alpha_1(\omega_2)} \cdot$$
$$\frac{\eta(\omega_3)}{1 - \beta(\omega_3) \cdot \alpha_1(\omega_3)}.$$

Note that expression (14) includes $\chi_1(\omega_1)$ of expression (10) and $\chi_2(\omega_2)$ of expression (12). When the difference frequency and the second-order harmonic (seond-order inter-modulation components) have a sufficiently large admittance, mixing of the desired signal component with the difference frequency and the second-order harmonic is negligible. Therefore, assuming that $\alpha_2(\ )$ is sufficiently small compared to $\alpha_3(\ )$, expression (14) is approximated while ignoring $\alpha_2$.

Assuming that a lower frequency component of the desired signal component has an angular frequency of $\omega_L$ and a higher frequency component thereof has an angular frequency of $\omega_H$, the input current $i_{in}$ of the first parallel feedback amplifier 10-1 is represented by:

$$in_{in} = I_1 \cdot \cos(\omega_L t + \phi_1) + I_1 \cdot \cos(\omega_H t + \phi_1) \quad (15).$$

By substituting expression (15) into expression (6), the desired signal component and the first IM3 component of the output current $i_{out}$ of the first parallel feedback amplifier 10-1 are represented by:

$$i_L = \chi_1(\omega_L) \cdot I_1 \cdot \cos(\omega_L t + \phi_1)$$

$$i_H = \chi_1(\omega_H) \cdot I_1 \cdot \cos(\omega_H t + \phi_1)$$

$$i_{IM3L} = \tfrac{3}{4}\chi_3(\omega_L, \omega_L, -\omega_H) \cdot I_1^3 \cdot \cos\{(2\omega_L - \omega_H) \cdot t + \phi_1\}$$

$$i_{IM3H} = \tfrac{3}{4}\chi_3(\omega_H, \omega_H, -\omega_L) \cdot I_1^3 \cdot \cos\{(2\omega_H - \omega_L) \cdot t + \phi_1\} \quad (16).$$

where $I_1$ represent an amplitude of the input current $i_{in}$, $i_L$ represents an output current of the desired signal component having an angular frequency of $\omega_L$, $i_H$ represents an output current of the desired signal component having an angular frequency of $\omega_H$, $i_{IM3L}$ represents a lower frequency component of the IM3 component, and $i_{IM3H}$ represents a higher frequency component of the IM3 component.

In the nonlinear closed-loop transfer function of the output current $i_{out}$ of the first parallel feedback amplifier 10-1, a first-order closed-loop transfer function $\chi_1(\omega_L)$ and a third-order closed-loop transfer function $\chi_3(\omega_L, \omega_L, -\omega_H)$ are represented by:

$$\chi_1(\omega_L) \cong \frac{\eta(\omega_0) \cdot \{1 - \beta(\omega_0)\} \cdot \alpha_1(\omega_0)}{1 - \beta(\omega_0) \cdot \alpha_1(\omega_0)} \quad (17)$$

$$\chi_3(\omega_L, \omega_L, -\omega_H) \cong \frac{\eta^2(\omega_0) \cdot \eta(-\omega_0) \cdot \{1 - \beta(\omega_0)\} \cdot \alpha_3(\omega_0)}{\{1 - \beta(\omega_0) \cdot \alpha_1(\omega_0)\}^3 \cdot \{1 - \beta(-\omega_0) \cdot \alpha_1(-\omega_0)\}}$$

where $\omega_0$ is $\omega_0 \cong \omega_L \cong \omega_H$.

In expression (17), when $\eta(\omega_0)$ is approximated as 1 ($\eta(\omega_0) \cong 1$), $\chi_1(\omega_L)$ is approximated by:

$$\chi_1(\omega_L) \cong \frac{\{1 - \beta(\omega_0)\} \cdot \alpha_1(\omega_0)}{1 - \beta(\omega_0) \cdot \alpha_1(\omega_0)}. \quad (18)$$

By substituting expression (3) into $\chi_3(\omega_L, \omega_L, -\omega_H)$ of expression (17), $\chi_3(\omega_L, \omega_L, -\omega_H)$ can be approximated by:

$$\chi_3(\omega_L, \omega_L, -\omega_H) \cong \frac{\{1 - \beta(\omega_0)\} \cdot \alpha_3(\omega_0)}{\{1 - \beta(\omega_0) \cdot \alpha_1(\omega_0)\}^3 \cdot \{1 - \beta(-\omega_0) \cdot \alpha_1(-\omega_0)\}}. \quad (19)$$

In this manner, the closed-loop transfer function of the first parallel feedback amplifier 10-1 can be derived.

The difference in phase between the amplified desired signal component and the first IM3 component output from the first parallel feedback amplifier 10-1 will be described using expressions (18) and (19). It is assumed that the admittance $Y_{f1}$ of the first parallel feedback section 102-1 and the input admittance (load admittance) $Y_L$ of the load resistance 12 include a susceptance component. In this case, the term $1/\{1-\beta(\omega_0) \cdot \alpha_1(\omega_0)\}$ in expressions (18) and (19) can be considered to have a phase component $\theta_1$.

In the output current $i_{out}$ of the first parallel feedback amplifier 10-1, $i_L$ and $i_{IM3L}$ will be discussed. The output current $i_L$ of the desired signal component having an angular frequency of $\omega_L$ and the output current $i_{IM3L}$ of the lower frequency IM3 component can be represented by:

$$i_{L1} = |\chi_1(\omega_L)| \cdot I_1 \cdot \cos(\omega_L t + \phi_1 + \theta_1 + \delta + 180)$$

$$i_{IM3L1} = \tfrac{3}{4}|\chi_3(\omega_L, \omega_L, -\omega_H)| \cdot I_1^3 \cdot \cos\{(2\omega_L - \omega_H) \cdot t + \phi_1 + 2\theta_1 + \delta\} \quad (20)$$

where $\delta$ represents a phase component of $\{1-\beta(\omega_0)\}$.

When expression (20) is derived, it is assumed that $\alpha_1$ and $\alpha_3$ which are input-output characteristics of the first amplification section 101-1 have a phase of 0° and 180°, respectively. Also, when expression (20) is derived, it is assumed that $\alpha_1(-\omega) = \alpha_1^*(\omega)$ and $\beta(-\omega) = \beta^*(\omega)$ where * represents complex conjugate.

In expression (20), the difference between the phase of the output current $i_L$ of the desired signal component having an angular frequency $\omega_L$ and the phase of the output current $i_{IM3L}$ of the lower frequency first IM3 component (t=0) is assumed to be $\Delta\phi_{1\text{-}IM3L}$. According to expression (20), $\Delta\phi_{1\text{-}IM3L}$ is represented by:

$$\Delta\phi_{1\text{-}IM3L} = \theta_1 - 180 \quad (21).$$

Figure 5A:
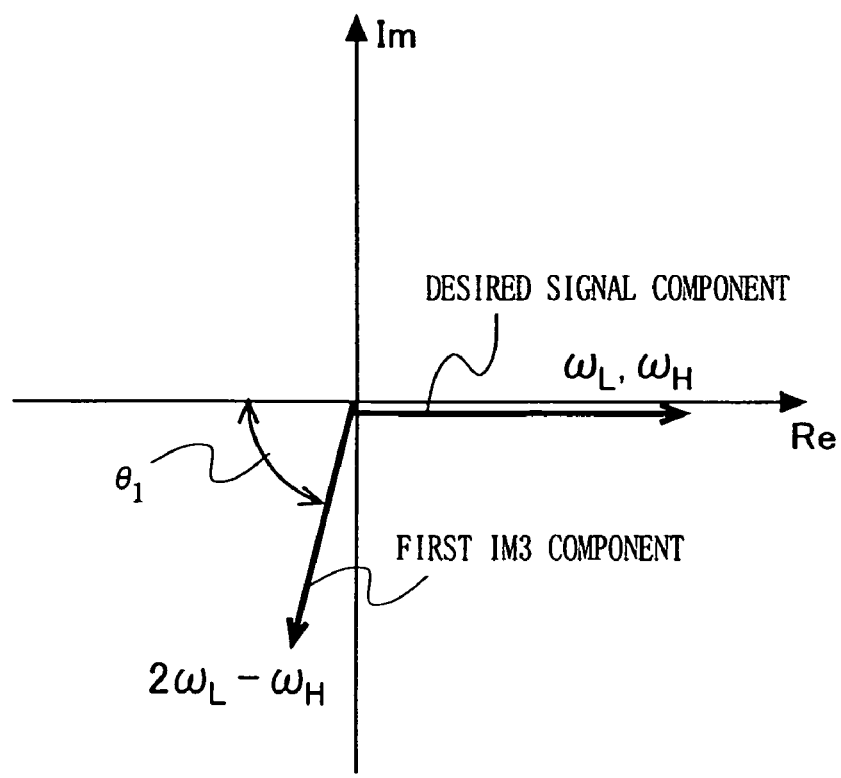
FIG. 5A is a schematic diagram illustrating a relationship between the phase of the desired signal component and the phase of the first IM3 component output from the first parallel feedback amplifier 10-1.

FIG. 5A is a schematic diagram illustrating a relationship between the phase of the desired signal component output from the first parallel feedback amplifier 10-1 and the phase of the first IM3 component. FIG. 5A illustrates the desired signal component ($\omega_L$ and $\omega_H$) and the first IM3 component ($2\omega_L - \omega_H$). As illustrated in FIG. 5A, the difference in phase between the desired signal component and the first IM3 component output from the phase first parallel feedback amplifier 10-1 is $\Delta\phi_{1\text{-}IM3L}$.

The relationship between the phases of the desired signal component and the first IM3 component output from the phase first parallel feedback amplifier 10-1 of FIG. 5A corresponds to the relationship between the phase of the desired signal component $S_{d1}$ and the phase of the first IM3 component $X_{d1}$ at the point e1 of FIG. 1 (FIG. 2F). In other words, the phase difference $\theta_{b1}$ between the desired signal component $S_{d1}$ and the first IM3 component $X_{d1}$ at the point e1 is equal to $\Delta\phi_{1\text{-}IM3L}$. When $\theta_{b1}$ is in the range of $-90° \leq \theta_{b1} \leq 270°$, $\theta_1$ has a value of $-90° \leq \theta_1 \leq 90°$.

Hereinafter, a description will be given of when the detailed description of the first parallel feedback amplifier 10-1 is applied to the second parallel feedback amplifier 10-2. It is assumed that the desired signal component and the first IM3 component of FIG. 5A are input to the second parallel feedback amplifier 10-2.

It is assumed that an admittance $Y_{f2}$ of the second parallel feedback section 102-2 and the input admittance (load admittance) $Y_L$ of the load admittance 12 include a susceptance component. In this case, the term $1/\{1-\beta(\omega_0) \cdot \alpha_1(\omega_0)\}$ in expressions (18) and (19) can be considered to have a phase component $\theta_2$. A difference in phase between a desired signal component and a second IM3 component output from the second parallel feedback amplifier 10-2 is assumed to be $\Delta\phi_{2\text{-}IM3L}$. Similar to the case of the first parallel feedback amplifier 10-1, $\Delta\phi_{2\text{-}IM3L}$ is represented by:

$$\Delta\phi_{2\text{-}IM3L} = \theta_2 - 180 \quad (22).$$

Figure 5B:
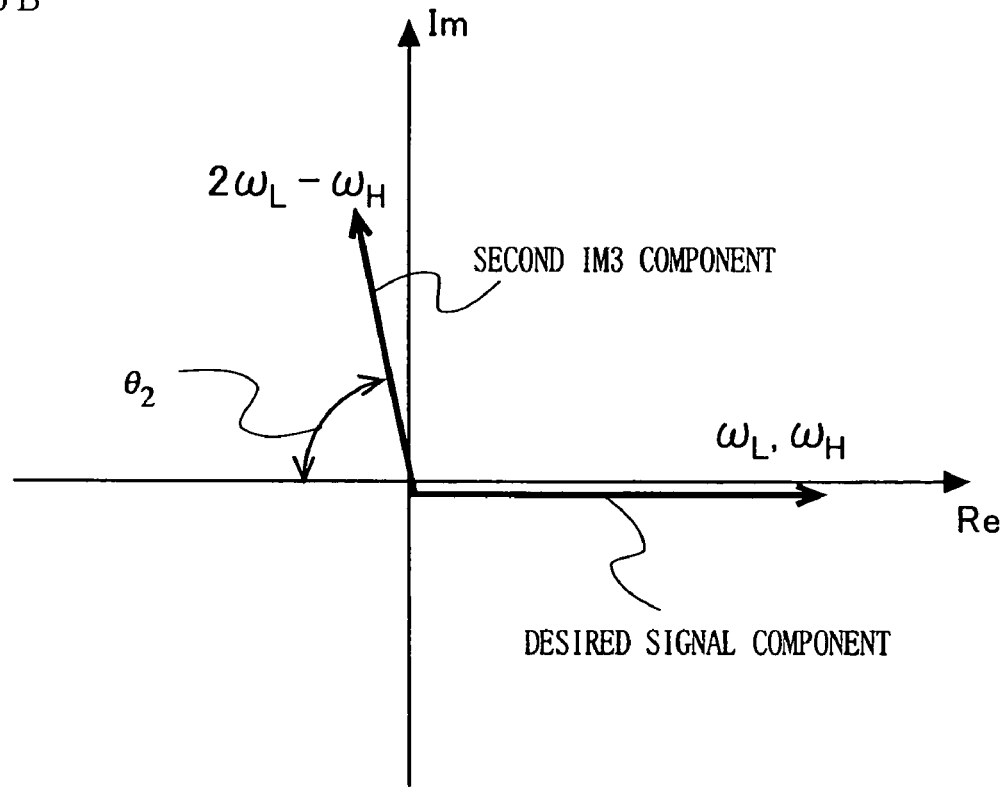
FIG. 5B is a schematic diagram illustrating a relationship between the phases of the desired signal component and the second IM3 component output from the second parallel feedback amplifier 10-2.

FIG. 5B is a schematic diagram illustrating a relationship between the phases of the desired signal component and the second IM3 component output from the second parallel feedback amplifier 10-2. FIG. 5B illustrates the desired signal component ($\omega_L$ and $\omega_H$) and the second IM3 component ($2\omega_L - \omega_H$). Ther relationship between the phases of the desired signal component and the second IM3 component output from the second parallel feedback amplifier 10-2 of FIG. 5B corresponds to the relationship between the phase of the desired signal component $S_{i1}$ and the phase of the second IM3 component $Y_{i1}$ at the point i1 (FIG. 3E). In other words, a phase difference $\theta_{d1}$ between the desired signal component $S_{i1}$ and the second IM3 component $Y_{i1}$ at the point i1 is equal to $\Delta\phi_{2-IM3L}$. When $\theta_{d1}$ is in the range of $-90° \leq \theta_{d1} \leq -270°$, $\theta_2$ has a value of $-90° \leq \theta_2 \leq 90°$.

FIG. 5C is a schematic diagram illustrating how the first IM3 component and the second IM3 component are combined so that IM3 is suppressed at the output terminal 72. FIG. 5C corresponds to FIG. 3F which illustrates how the first IM3 component $X_{i1}$ and the second IM3 component $Y_{i1}$ cancel out. In this case, the term "suppress" means that a first total sum IM3 component generated by combining the first IM3 component and the second IM3 component as illustrated in FIG. 5C has a power value smaller than the sum of the power value of the first IM3 component and the power value of the second IM3 component.

It is assumed that the power value of the first IM3 component occurring in the first amplification section 101-1 is the same as the power value of the second IM3 component occurring in the second amplification section 101-2. In this case, in order that the first total sum IM3 component is smaller than both the first IM3 component and the second IM3 component, $\theta_{min1} > 120°$ where $\theta_{min1}$ represents a minimum of $\theta_{b1} - \theta_{d1}$. If $\theta_{min1} > 120°$, the power value of the first total sum IM3 component can be made smaller than the sum of the power value of the first IM3 component and the power value of the second IM3 component.

When the difference of the phase of the first IM3 component and the phase of the second IM3 component is 180° and the power value of the first IM3 component is equal to the power value of the second IM3 component, the IM3 component is suppressed to a most extent. In other words, this is achieved when $\theta_{min1} = 180°$. In this case, $\theta_1 + \theta_2 = 180°$.

Figure 6:
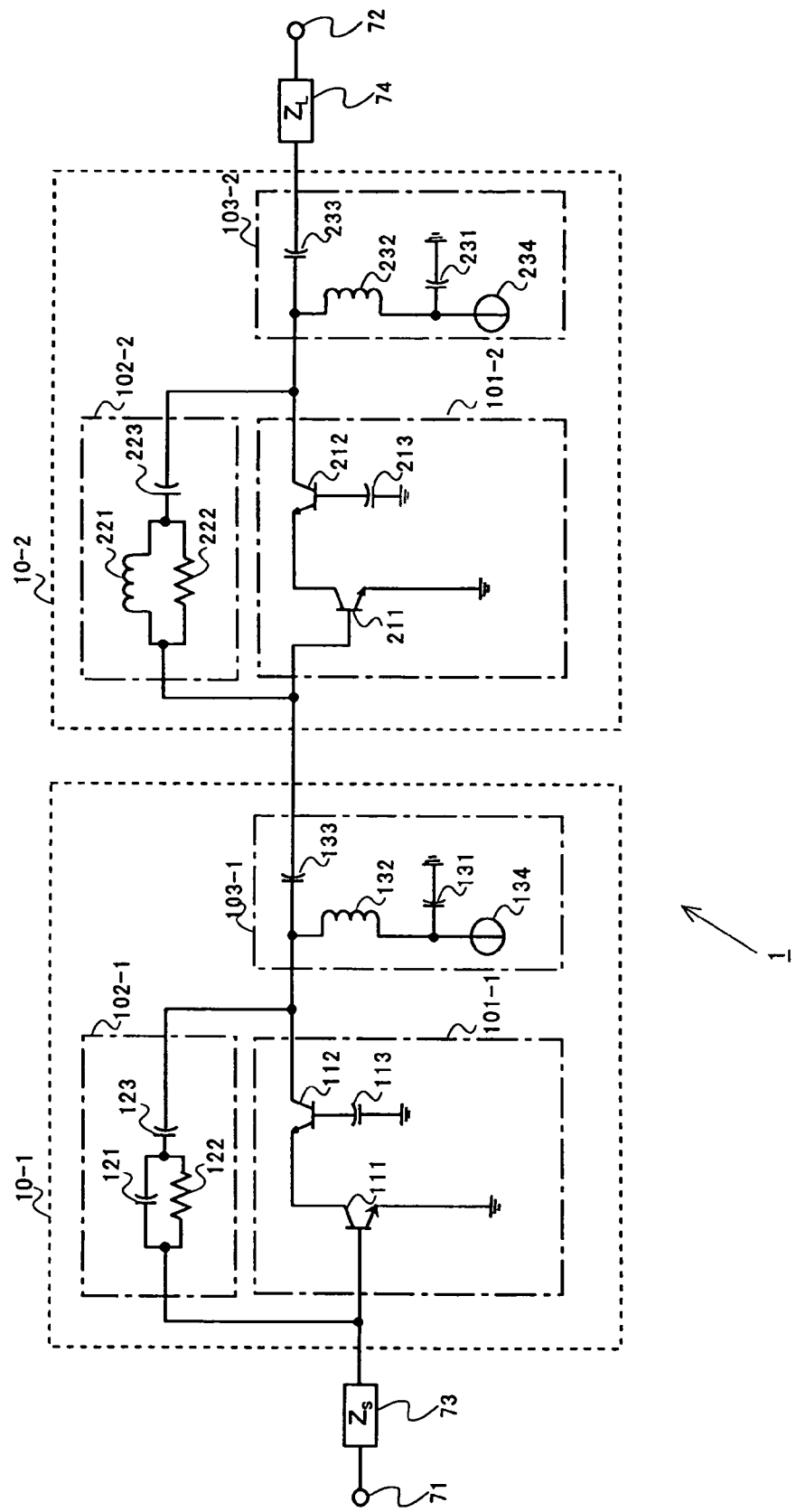
FIG. 6 is a diagram illustrating a specific exemplary structure of a multistage amplifying device according to a first embodiment.

A specific example of the multistage amplifying device 1 will be described with reference to FIG. 6. FIG. 6 is a diagram illustrating a specific exemplary structure of the multistage amplifying device 1. The multistage amplifying device 1 comprises a first parallel feedback amplifier 10-1, a second parallel feedback amplifier 10-2, an internal terminal 71, an output terminal 72, an input impedance matching circuit 73, and an output impedance matching circuit 74. The first parallel feedback amplifier 10-1 includes a first amplification section 101-1, a first parallel feedback section 102-1, and a first matching circuit 103-1. The second parallel feedback amplifier 10-2 includes a second amplification section 101-2, a second parallel feedback section 102-2, and a second matching circuit 103-2. Note that the bias circuits of the first amplification section 101-1 and the second amplification section 101-2 are not illustrated in FIG. 6. Although FIG. 6 illustrates an example of the multistage amplifying device 1, the structure of the multistage amplifying device 1 is not limited to the structure of FIG. 6 and may be other structures.

The first amplification section 101-1 has a first transistor 111, a second transistor 112, and a first capacitor 113. The first parallel feedback section 102-1 has a second capacitor 121, a first resistor 122, and a third capacitor 123. The first matching circuit 103-1 has a fourth capacitor 131, a first inductor 132, a fifth capacitor 133, and a first power source terminal 134.

The second amplification section 101-2 has a third transistor 211, a fourth transistor 212, and a sixth capacitor 213. The second parallel feedback section 102-2 has a second inductor 221, a second resistor 222, and a seventh capacitor 223. The second matching circuit 103-2 has an eighth capacitor 231, a third inductor 232, a ninth capacitor 233, and a second power source terminal 234.

In the first parallel feedback amplifier 10-1, one end of the input impedance matching circuit 73 is connected to the internal terminal 71. The first amplification section 101-1 and the first parallel feedback section 102-1 are connected in parallel between the other end of the input impedance matching circuit 73 and one end of the first matching circuit 103-1. The other end of the first matching circuit 103-1 is connected to the second parallel feedback amplifier 10-2. In the second parallel feedback amplifier 10-2, the second amplification section 101-2 and the second parallel feedback section 102-2 are connected in parallel between the other end of the first matching circuit 103-1 and one end of the second matching circuit 103-2. The output impedance matching circuit 74 is connected between the other end of the second matching circuit 103-2 and the output terminal 72.

In the first amplification section 101-1, the base of the first transistor 111 is connected via the input impedance matching circuit 73 to the internal terminal 71, and the collector thereof is connected to the emitter of the second transistor 112. The collector of the second transistor 112 is connected to the fifth capacitor 133 of the first matching circuit 103-1. The emitter of the first transistor 111 is grounded. The base of the second transistor 112 is grounded via the first capacitor 113.

In the first parallel feedback section 102-1, the second capacitor 121 and the first resistor 122 are connected in parallel between the base of the first transistor 111 and one end of the third capacitor 123. The other end of the third capacitor 123 is connected to the collector of the second transistor 112. Note that, in the first parallel feedback section 102-1, a reactance component thereof corresponds to a circuit in which the second capacitor 121 and the first resistor 122 are connected in parallel. Therefore, the first parallel feedback section 102-1 can function as a capacitive parallel feedback section.

In the first matching circuit 103-1, the other end of the fifth capacitor 133 is connected to the base of the third transistor 211 of the second amplification section 101-2. One end of the first inductor 132 is connected to one end of the fifth capacitor 133. The other end of the first inductor 132 is grounded via the fourth capacitor 131 and is also connected to the first power source terminal 134.

In the second amplification section 101-2, the collector of the third transistor 211 is connected to the emitter of the fourth transistor 212. The collector of the fourth transistor 212 is connected to one end of the ninth capacitor 233 of the second matching circuit 103-2. The emitter of the third transistor 211 is grounded. The base of the fourth transistor 212 is grounded via the sixth capacitor 213.

In the second parallel feedback section 102-2, the second inductor 221 and the second resistor 222 are connected in parallel between the base of the third transistor 211 and one end of the seventh capacitor 223. The other end of the seventh capacitor 223 is connected to the collector of the fourth transistor 212. Note that, in the second parallel feedback section 102-2, a reactance component thereof corresponds to a circuit in which the second inductor 221 and the second resistor 222 are connected in parallel. Therefore, the second parallel feedback section 202-1 can function as an inductive parallel feedback section.

In the second matching circuit 103-2, one end of the ninth capacitor 233 is connected to one end of the third inductor 232. The other end of the third inductor 232 is grounded via the eighth capacitor 231 and is also connected to the second power source terminal 234. The other end of the ninth capacitor 233 is connected via the output impedance matching circuit 74 to the output terminal 72.

An operation of the multistage amplifying device 1 of FIG. 6 will be described. In the first amplification section 101-1, the first transistor 111 and the second transistor 112 amplify a desired signal input to the multistage amplifying device 1. When the first transistor 111 and the second transistor 112 amplify a desired signal component, a first IM3 component occurs. In the second amplification section 101-2, the third transistor 211 and the fourth transistor 212 amplify the desired signal component and the first IM3 component input from the first parallel feedback amplifier 10-1. When the third transistor 211 and the fourth transistor 212 amplify the desired signal component input from the first parallel feedback amplifier 10-1, a second IM3 component occurs. The first matching circuit 103-1 and the second matching circuit 103-2 perform impedance matching.

Operations of the first parallel feedback section 102-1 and the second parallel feedback section 102-2 will be described in detail. Specifically, changes in the phases of the amplified desired signal component and the IM3 component due to the susceptance components of the first parallel feedback section 102-1 and the second parallel feedback section 102-2 will be described in detail.

Firstly, the first parallel feedback section 102-1 will be described. In the first parallel feedback section 102-1, when it is assumed that the third capacitor 123 has a sufficiently large capacitance, the admittance $Y_{f1}$ of the first parallel feedback section 102-1 is represented by:

$$Y_{f1} = 1/R_{f1} + j\omega C_{f1} \quad (23)$$

where $R_{f1}$ represents the resistance of the first resistor 122 and $C_{f1}$ represents the capacitance of the second capacitor 121. Further, the admittance of a portion from the first parallel feedback section 102-1 to the output terminal 72 is represented by $Y_{L1}$. Assuming that $Y_{L1}$ is a real number, a feedback amount $\beta(\omega)$ of expression (3) is represented by:

$$\beta(\omega) = \frac{1/R_{f1} + j\omega C_{f1}}{Y_{L1} + 1/R_{f1} + j\omega C_{f1}}. \quad (24)$$

According to expression (24), the feedback amount $\beta(\omega)$ has an advanced phase. In expressions (18) and (19), when $\alpha_1(\omega_0)$ has a phase of 180°, the phase component $\theta_1$ of $1/\{1-\beta(\omega_0)\cdot\alpha_1(\omega_0)\}$ is a delayed phase. Therefore, the phase component $\theta_1$ has a negative value.

The second parallel feedback section 102-2 will be described. Similar to the first parallel feedback section 102-1, in the second parallel feedback section 102-2, the phase component $\theta_2$ of $1/\{1-\beta(\omega_0)\cdot\alpha_1(\omega_0)\}$ in expressions (18) and (19) is an advanced phase. Therefore, the phase component $\theta_2$ has a positive value.

When the first parallel feedback section 102-1 and the second parallel feedback section 102-2 have different susceptance components, the first parallel feedback amplifier 10-1 and the second parallel feedback amplifier 10-2 can be controlled so that the phase of the amplified desired signal component and the phase of the IM3 component are different from each other. In the case of the multistage amplifying device 1 of FIG. 6, Since the first parallel feedback section 102-1 has a capacitor, the susceptance component of the first parallel feedback section 102-1 is capacitive. Since the second parallel feedback section 102-2 has an inductor, the susceptance component of the second parallel feedback section 102-2 is inductive.

Next, operations of the first matching circuit 103-1 and the second matching circuit 103-2 of FIG. 6 will be described. The first matching circuit 103-1 and the second matching circuit 103-2 have different admittance components, the phases of the signals fed back by the first parallel feedback section 102-1 and the second parallel feedback section 102-2 can be changed. This will be hereinafter described in detail.

It is assumed that the first matching circuit 103-1 has an admittance of $Y_{L1}$. The admittance $Y_{L1}$ is assumed to be represented by:

$$Y_{L1} = G_{L1} + jB_{L1} \; (B_{L1} < 0) \quad (25)$$

where $G_{L1}$ represents the conductance component of $Y_{L1}$ and $B_{L1}$ represents the susceptance component of $Y_{L1}$.

In this case, $\beta(\omega_0)$ of expression (3) is represented by:

$$\beta(\omega) = \frac{Y_{f1}}{G_{f1} + jB_{f1} + Y_{f1}}. \quad (26)$$

It is now assumed that the admittance $Y_{f1}$ of the first parallel feedback section 102-1 is a real number. In this case, according to expression (26), $\beta(\omega_0)$ has an advanced phase. In expressions (18) and (19), when $\alpha_1(\omega_0)$ has a phase of 180°, $1/\{1-\beta(\omega_0)\cdot\alpha_1(\omega_0)\}$ has a delayed phase. Therefore, the phase component $\theta_1$ has a negative value.

Alternatively, the admittance $Y_{L1}$ of the first matching circuit 103-1 is assumed to be represented by:

$$Y_{L1} = G_{L1} + jB_{L1} \; (B_{L1} > 0) \quad (27).$$

When the admittance $Y_{L1}$ is represented by expression (27), $1/\{1-\beta(\omega_0)\cdot\alpha_1(\omega_0)\}$ has an advanced phase as in the case of expression (25). Therefore, the phase component $\theta_1$ has a positive value. In this manner, the first matching circuit 103-1 has a susceptance component, so that the change amounts of the phases the amplified desired signal component and the first IM3 component fed-back by the first parallel feedback section 102-1 can be controlled.

Similar to the first matching circuit 103-1, the second matching circuit 103-2 has a susceptance component, so that the change amounts of the phases of the amplified desired signal component, the first IM3 component, and the second IM3 component fed-back by the second parallel feedback section 102-2 can be controlled.

Changes in gains of the first parallel feedback amplifier 10-1 and the second parallel feedback amplifier 10-2 will be described.

Figure 7:
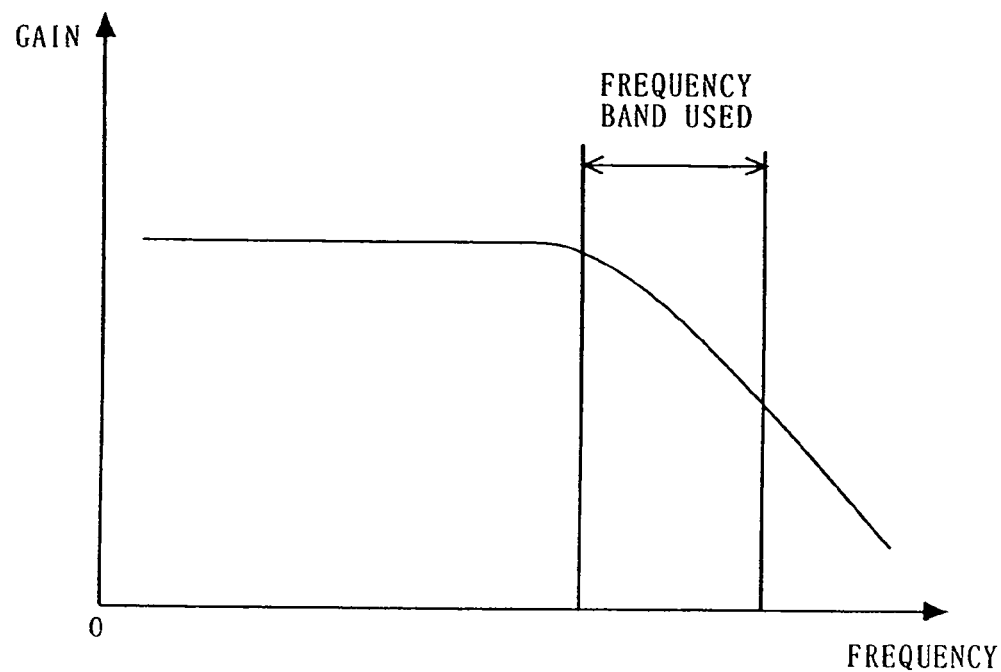
FIG. 7 is a diagram illustrating a change in gain of the first parallel feedback amplifier 10-1 when the first parallel feedback section 102-1 has a capacitive reactance component.

FIG. 7 is a diagram illustrating a change in gain of the first parallel feedback amplifier 10-1 when the first parallel feedback section 102-1 has a capacitive reactance component. As illustrated in FIG. 7, when the first parallel feedback section 102-1 has a capacitive reactance component, the gain of the first parallel feedback amplifier 10-1 decreases with an increase in the frequency component of a frequency band used. This is because the feedback amount increases with an increase in the frequency.

Figure 8:
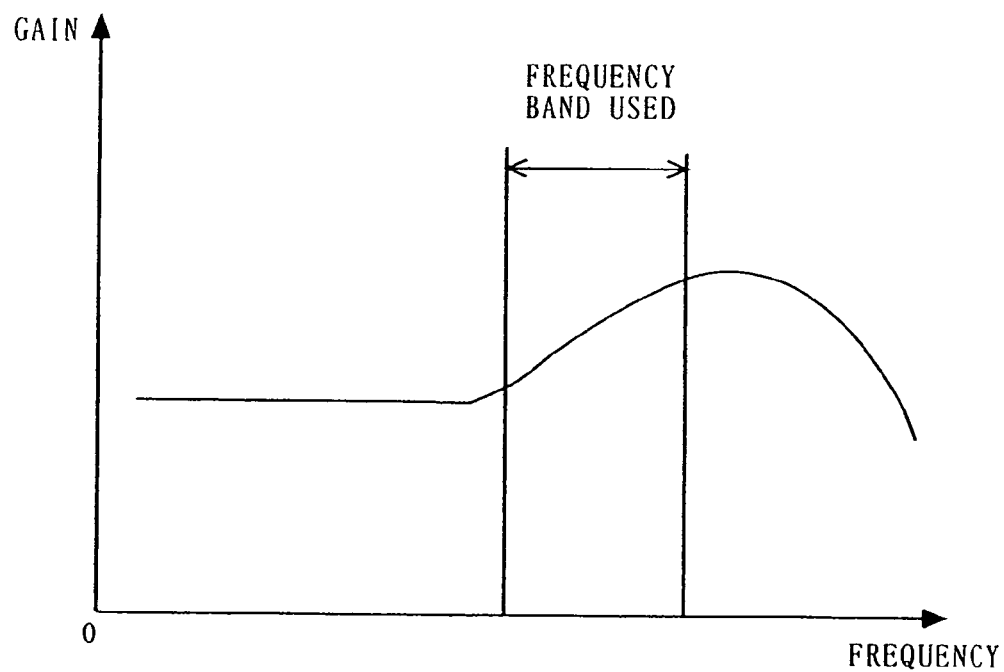
FIG. 8 is a diagram illustrating a change in gain of the second parallel feedback amplifier 10-2 when the second parallel feedback section 102-2 has an inductive reactance component.

FIG. 8 is a diagram illustrating a change in gain of the second parallel feedback amplifier 10-2 when the second parallel feedback section 102-2 has an inductive reactance component. As illustrated in FIG. 8, when the second parallel feedback section 102-2 has an inductive reactance component, the gain of the second parallel feedback amplifier 10-2 increases with an increase in the frequency component of a frequency band used. This is the feedback amount decreases with an increase in the frequency.

In the multistage amplifying device 1, when the gain decrease rate of the first parallel feedback amplifier 10-1 is equivalent to the gain increase rate of the second parallel feedback amplifier 10-2, both the flatness of the gain and the suppression of IM3 can be obtained. It is defined that the gain increase rate is equivalent to the gain decrease rate, if, assuming that the gain increase rate is 6 dB/OCT (20 dB/dec) and the gain decrease rate is −6 dB/OCT (−20 dB/dec), the gain deviation of the multistage amplifying device for each frequency component in a frequency band used is within 1 dB.

As described above, in the multistage amplifying device 1 of the first embodiment of the present invention, the first parallel feedback amplifier 10-1 changes the difference between the phase of the desired signal component to be amplified and the phase of the first IM3 component and outputs the resultant components. Also, the second parallel feedback amplifier 10-2 changes the difference between the phase of the desired signal component to be amplified and the phase of the second IM3 component. The multistage amplifying device 1 combines the first IM3 component and the second IM3 component to suppress IM3. Thereby, the multistage amplifying device 1 can suppress IM3 without generating noise other than the IM3 component. Each amplifier of the multistage amplifying device is a feedback-type amplifier. Therefore, the IM3 component occurring in each amplification section can be suppressed as in typical feedback-type amplifier circuits and, in addition, the IM3 components cancel out as described above. Therefore, IM3 is further suppressed. Further, white noise occurring in each amplification section of the multistage amplifying device 1 is negligible compared to the IM3 components occurring due to the amplified desired signal and the desired signal. Furthermore, white noise occurring in each amplification section can be suppressed by negative feedback. Therefore, the multistage amplifying device 1 does not require a device for removing white noise, and therefore, can be constructed with a simple structure.

Note that, in FIG. 6, both the susceptance component of the first parallel feedback section 102-1 and the susceptance component of the second parallel feedback section 102-2 may be either inductive or capacitive. In this case, the first parallel feedback section 102-1 and the second parallel feedback section 102-2 have different susceptance components, and further, $\theta_1$ and $\theta_2$ satisfy the above-described conditions.

Figure 9A:
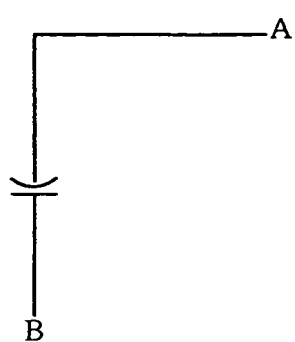
FIG. 9A is a diagram illustrating an exemplary structure of a parallel feedback section according to the first embodiment of the present invention.
Figure 9B:
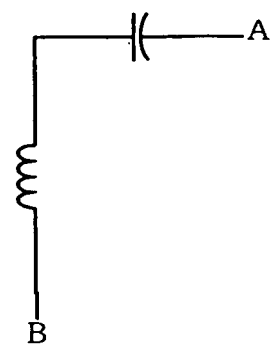
FIG. 9B is a diagram illustrating an exemplary structure of a parallel feedback section according to the first embodiment of the present invention.
Figure 9C:
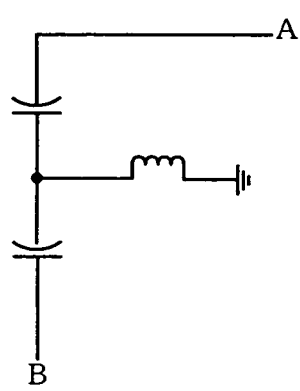
FIG. 9C is a diagram illustrating an exemplary structure of a parallel feedback section according to the first embodiment of the present invention.
Figure 9D:
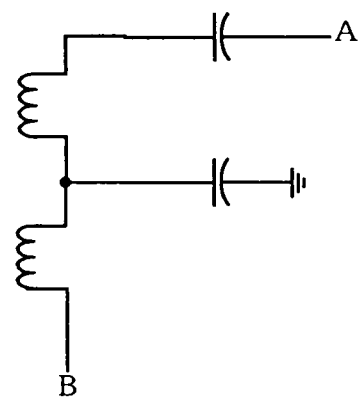
FIG. 9D is a diagram illustrating an exemplary structure of a parallel feedback section according to the first embodiment of the present invention.

Alternatively, the first parallel feedback section 102-1 and the second parallel feedback section 102-2 of FIG. 6 may employ circuits illustrated in FIGS. 9A to 9D. FIGS. 9A to 9D illustrate exemplary structures of the first parallel feedback section 102-1 and the second parallel feedback section 102-2. In FIGS. 9A to 9D, arrow A indicates a direction of the output terminal 72, and point B indicates a direction of the internal terminal 71. FIG. 9A illustrates a structure employing a capacitor. FIG. 9B illustrates a structure in which a capacitor and an inductor are connected in cascade. FIG. 9C illustrates a structure in which two capacitors are connected in cascade, and one end of an inductor is connected between two capacitor and the other end is grounded. FIG. 9D illustrates a structure in which a capacitor and two inductors are connected in cascade, and one end of another capacitor is connected between the two inductors and the other end is grounded. When a configuration of an amplifier(s) and a matching circuit(s) is changed, the feedback section can perform impedance matching using the circuits of FIGS. 9A to 9D. Alternatively, any circuit capable of changing the phase of the IM3 component and performing impedance matching can be used as the feedback circuit in addition to the feedback circuit of FIGS. 9A to 9D.

In the first embodiment, the detailed operation of the multistage amplifying device 1 has heretofore been described using the expressions. However, the detailed operation of the multistage amplifying device 1 may be described in a manner different from that above. Such a manner is any one in which an outline of the operations of the first parallel feedback amplifier 10-1 and the second parallel feedback amplifier 10-2 can be described.

Second Embodiment

Figure 10:
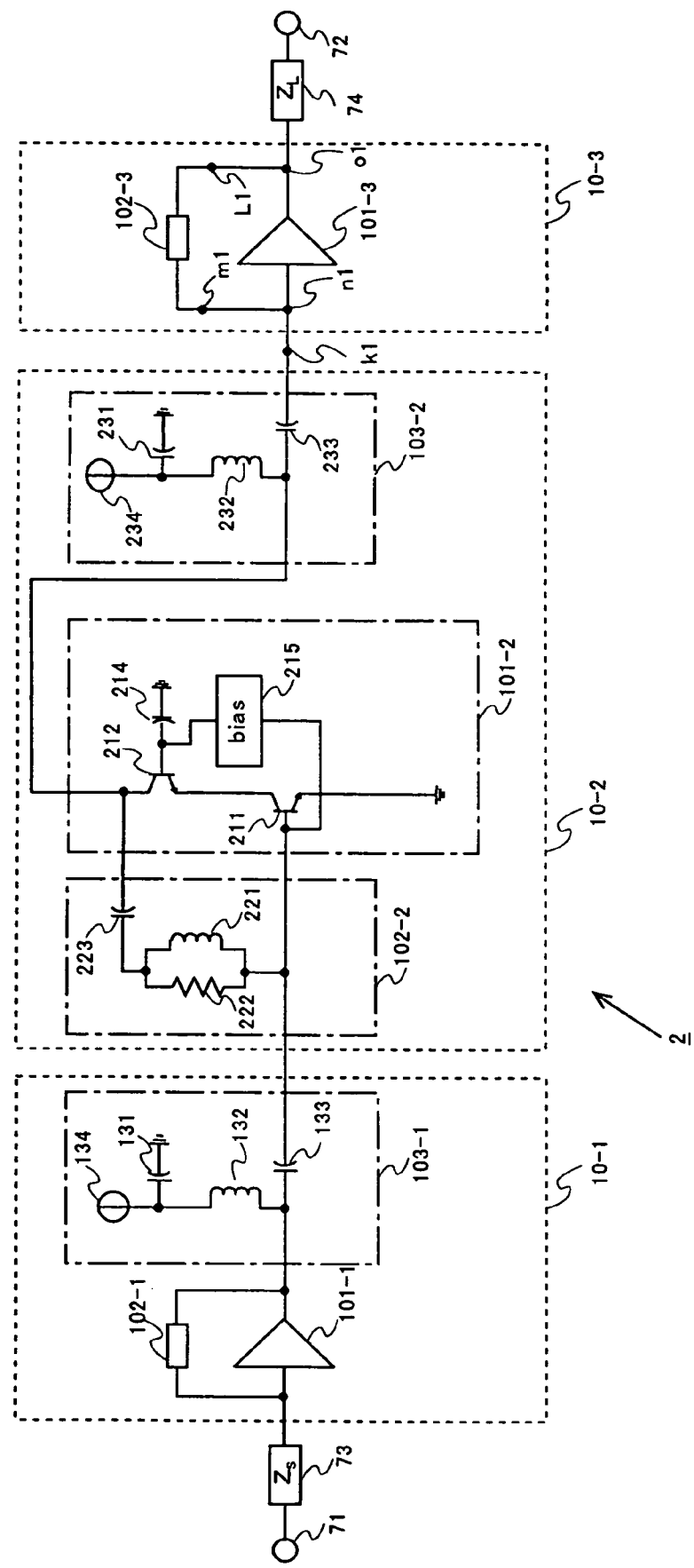
FIG. 10 is a diagram illustrating an exemplary structure of a multistage amplifying device according to a second embodiment of the present invention.

FIG. 10 is a diagram illustrating an exemplary structure of a multistage amplifying device 2 according to a second embodiment of the present invention. The multistage amplifying device 2 of the second embodiment of the present invention of FIG. 10 comprises a first parallel feedback amplifier 10-1, a second parallel feedback amplifier 10-2, and a third parallel feedback amplifier 10-3. In FIG. 10, the same components as those of the first embodiment are referenced with the same reference numerals as those of FIG. 1.

In the second parallel feedback amplifier 10-2 of FIG. 10, a bias circuit 216 is explicitly illustrated. The bias circuit 216 is connected to the base of the third transistor 211 and the base of the fourth transistor 212.

As illustrated in FIG. 10, the multistage amplifying device 2 is different from the multistage amplifying device 1 of the first embodiment in that the parallel feedback amplifier 10-3 is additionally connected in cascade. Hereinafter, an operation of the multistage amplifying device 2 will be described, especially about elements different from those of the first embodiment.

The third parallel feedback amplifier 10-3 includes a third amplification section 101-3 and a third parallel feedback section 102-3. The third amplification section 101-3 is an inverting amplifier. The third parallel feedback section 102-3 has a reactance component different from those of the first parallel feedback section 102-1 and the second parallel feedback section 102-2.

The third parallel feedback amplifier 10-3 receives a desired signal component output from the second parallel feedback amplifier 10-2. Also, the third parallel feedback amplifier 10-3 receives a first total sum IM3 component which is a combination of a first IM3 component and a second IM3 component. The third amplification section 101-3 amplifies the input desired signal component and first total sum IM3 component. When the third amplification section 101-3 amplifies the desired signal component output from the second parallel feedback amplifier 10-2, an IM3 component newly occurs. The third parallel feedback section 102-3 uses a reactance component thereof to change the phase of the amplified desired signal component, the phase of the first total sum IM3 component, and the phase of the IM3 component occurring in the third amplification section 101-3 (hereinafter referred to as a third IM3 component), and also feeds back the resultant amplified desired signal, first total sum IM3 component and third IM3 component.

An outline of an operation of the multistage amplifying device 2 of FIG. 10 will be described. Note that an operation of the multistage amplifying device 2 until the amplified desired signal and the first total sum IM3 component are output from the second parallel feedback amplifier 10-2 is basically the same as that of the multistage amplifying device 1. Therefore, a portion different from the multistage amplifying device 1 will be described.

Figure 11A:
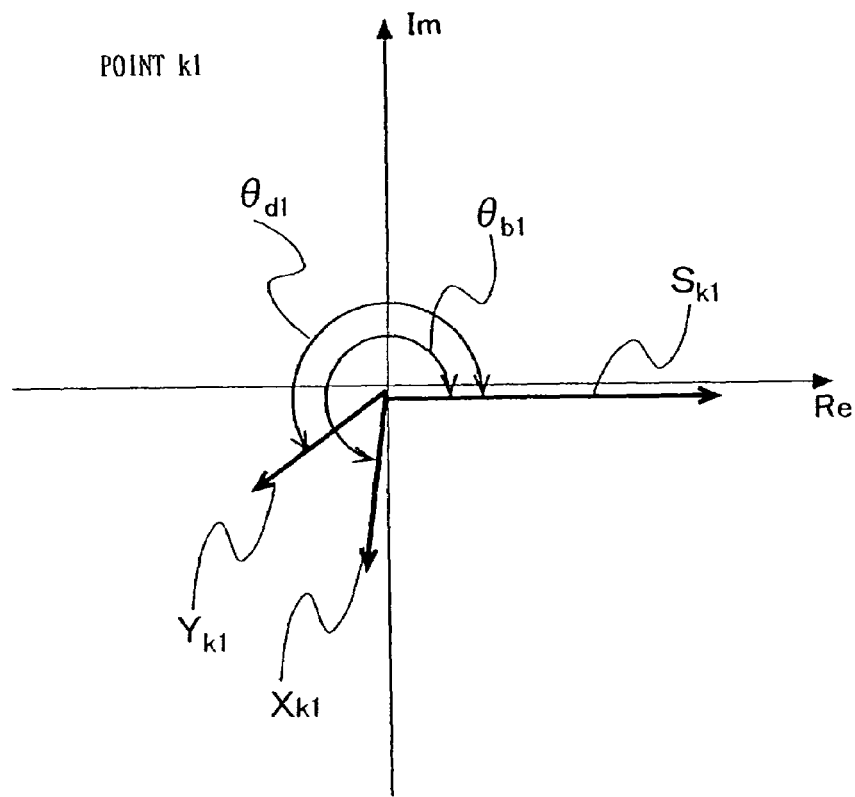
FIG. 11A is a schematic diagram illustrating a relationship between the phase of the desired signal component output from the second parallel feedback amplifier 10-2, the phase of the first IM3 component output from the second parallel feedback amplifier 10-2, and the phase of the second IM3 component output from the second parallel feedback amplifier 10-2, at a point k1 of FIG. 10.

FIG. 11A is a schematic diagram illustrating a relationship between the phase of the desired signal component output from the second parallel feedback amplifier 10-2 at a point k1 of FIG. 10 (hereinafter referred to as a desired signal component $S_{k1}$), the phase of the first IM3 component output from the second parallel feedback amplifier 10-2 at the point k1 (hereinafter referred to as a first IM3 component $X_{k1}$), and the phase of the second IM3 component output from the second parallel feedback amplifier 10-2 at the point k1 (hereinafter referred to as a second IM3 component $Y_{k1}$). As illustrated in FIG. 11A, the difference between the phase of the desired signal component $S_{k1}$ and the phase of the first IM3 component $X_{k1}$ at the point k1 is represented by $\theta_{b1}$, and the difference between the phase of the desired signal component $S_{k1}$ and the phase of the second IM3 component $Y_{k1}$ is represented by $\theta_{d1}$.

Figure 11B:
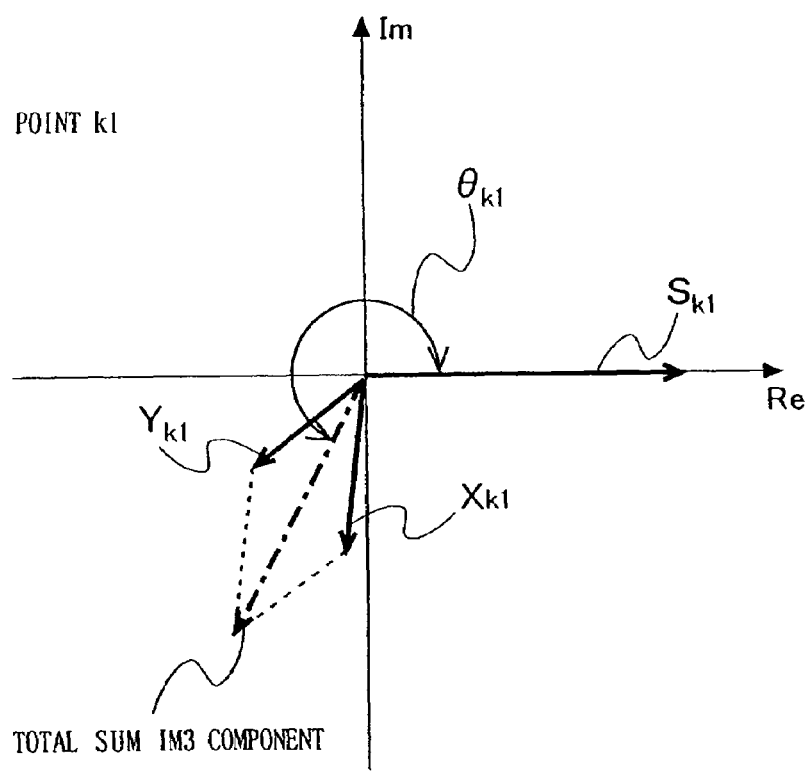
FIG. 11B is a schematic diagram illustrating how the first IM3 component and the second IM3 component are combined to generate the first total sum IM3 component.

FIG. 11B is a schematic diagram illustrating how the first IM3 component $X_{k1}$ and the second IM3 component $Y_{k1}$ are combined to generate the first total sum IM3 component. As illustrated in FIG. 11B, at the point k1, the first IM3 component $X_{k1}$ and the second IM3 component $Y_{k1}$ are combined to generate the first total sum IM3 component (hereinafter referred to as a first total sum IM3 component $C_{k1}$). A phase difference between the desired signal component $S_{k1}$ and the first total sum IM3 component $C_{k1}$ is represented by $\theta_{k1}$. The parallel feedback amplifier 10-3 receives the desired signal component $S_{k1}$ and the first total sum IM3 component $C_{k1}$. As is different from the first embodiment, the phase difference $\theta_{b1} - \theta_{d1}$ between the first IM3 component $X_{k1}$ and the second IM3 component $Y_{k1}$ has a value such that the first IM3 component and the second IM3 component are not suppressed. Conditions for $\theta_{b1} - \theta_{d1}$ will be described below.

In the third parallel feedback amplifier 10-3, the third amplification section 101-3 amplifies the desired signal component $S_{k1}$ and the first total sum IM3 component $C_{k1}$ while maintaining the phase difference $\theta_{k1}$ between the desired signal component $S_{k1}$ and the first total sum IM3 component $C_{k1}$. When the third amplification section 101-3 amplifies the desired signal component $S_{k1}$, a third IM3 component occurs. In the third amplification section 101-3, a phase difference between the amplified desired signal component $S_{k1}$ and the third IM3 component is assumed to be 180°.

Figure 12A:
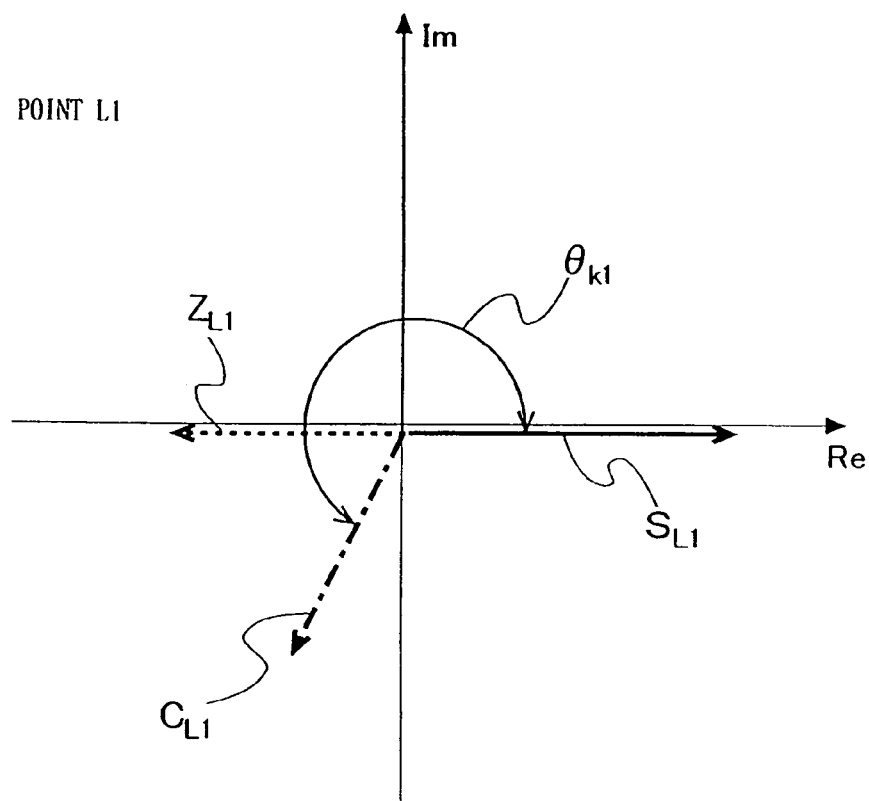
FIG. 12A is a schematic diagram illustrating a relationship between the phase of the amplified desired signal component, the phase of the amplified first total sum IM3 component, the phase of the third IM3 component, at a point L1 of FIG. 10.

FIG. 12A is a schematic diagram illustrating a relationship between the phase of the amplified desired signal component $S_{k1}$ at a point L1 of FIG. 10 (hereinafter referred to as a desired signal component $S_{L1}$), the phase of the amplified first total sum IM3 component $C_{k1}$ at the point L1 (hereinafter referred to as a combined IM3 component $C_{L1}$), and the phase of the third IM3 component at the point L1 (hereinafter referred to as a third IM3 component $Z_{L1}$). As illustrated in FIG. 12A, at the point L1, a phase difference between the desired signal component $S_{L1}$ and the first total sum IM3 component $C_{L1}$ is $\theta_{k1}$, and a phase difference between the desired signal component $S_{L1}$ and the third IM3 component $Z_{L1}$ is 180°.

The third parallel feedback section 102-3 changes the phase of the desired signal component $S_{L1}$, the phase of the first total sum IM3 component $C_{L1}$, and the phase of the third IM3 component $Z_{L1}$. In the third parallel feedback section 102-3, the frequency dependency of the phase changes of the desired signal component $S_{L1}$, the first total sum IM3 component $C_{L1}$ and the third IM3 component $Z_{L1}$ is sufficiently small and is assumed to be negligible.

Figure 12B:
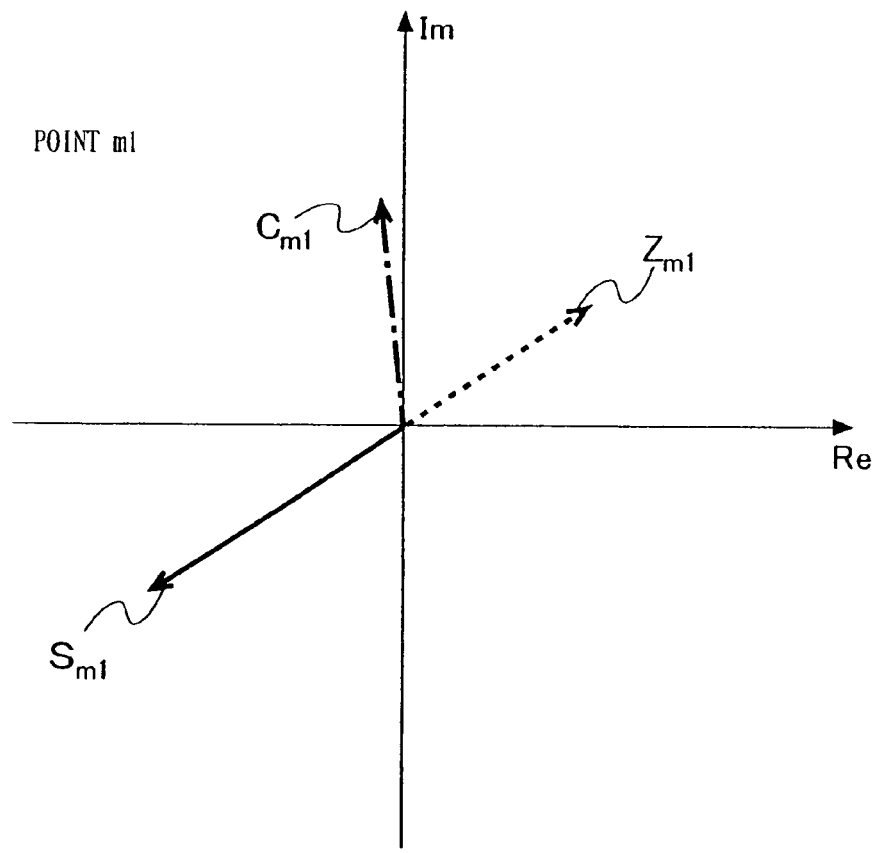
FIG. 12B is a schematic diagram illustrating a relationship between the phase of the desired signal component, the phase of the first total sum IM3 component, and the phase of the third IM3 component, at a point m1 of FIG. 10.

FIG. 12B is a schematic diagram illustrating a relationship between the phase of the desired signal component $S_{L1}$ at the point m1 of FIG. 10 (hereinafter referred to as a desired signal component $S_{m1}$), the phase of the first total sum IM3 component $C_{L1}$ at the point m1 (hereinafter referred to as a first total sum IM3 component $C_{m1}$), and the phase of the third IM3 component $Z_{L1}$ at the point m1 (hereinafter referred to as a third IM3 component $Z_{m1}$). As illustrated in FIG. 12B, at the point m1 of FIG. 10, a relationship between the phase of the desired signal component $S_{m1}$, the phase of the first total sum IM3 component $C_{m1}$, and the phase of the third IM3 component $Z_{m1}$ is not changed from that of FIG. 12A. Note that, in FIG. 12B, the desired signal component $S_{L1}$ is placed on the real axis.

Figure 12C:
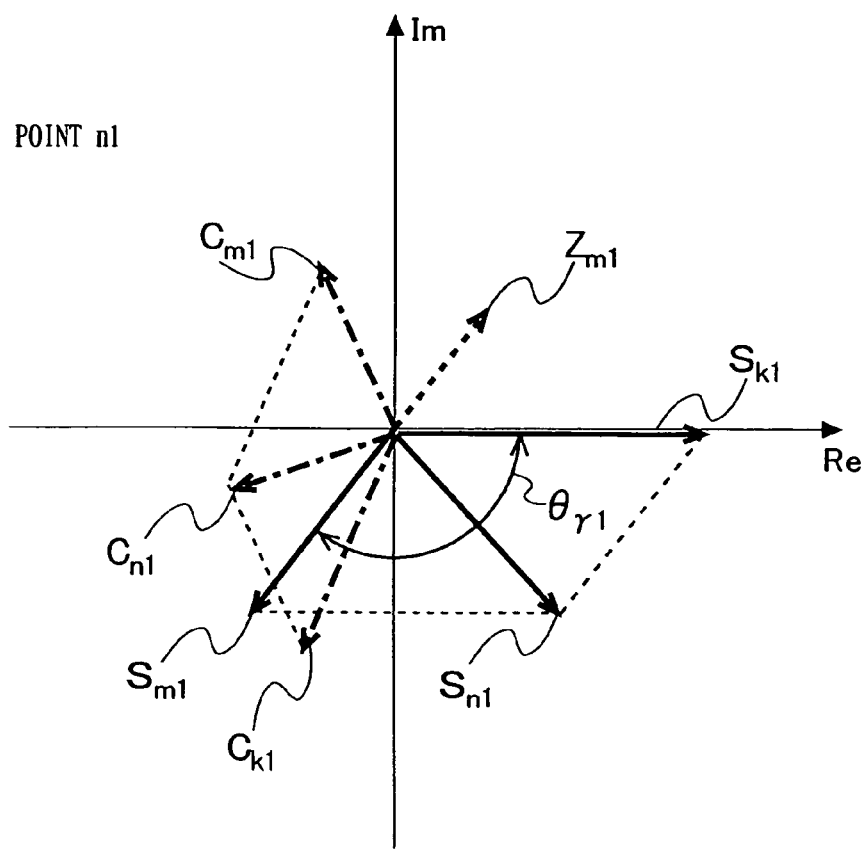
FIG. 12C is a schematic diagram illustrating a relationship between the phase of the desired signal component, the phase of the fed-back desired signal component, the phase of the first total sum IM3 component, the phase of the fed-back first total sum IM3 component, and the phase of the fed-back third IM3 component, at a point n1 of FIG. 10.

FIG. 12C is a schematic diagram illustrating a relationship between the phase of the desired signal component $S_{k1}$, the phase of the fed-back desired signal component $S_{m1}$, the phase of the first total sum IM3 component $C_{k1}$, the phase of the fed-back first total sum IM3 component $C_{m1}$, and the phase of the fed-back third IM3 component, at a point n1 of FIG. 10. Note that, in FIG. 12C, the desired signal component $S_{k1}$ is placed on the real axis. As illustrated in FIG. 12C, at the point n1, the desired signal component $S_{k1}$ and the fed-back desired signal component $S_{m1}$ are combined to generate a desired signal component $S_{n1}$. Further, the first total sum IM3 component $C_{k1}$ and the fed-back first total sum IM3 component $C_{m1}$ are combined to generate a first total sum IM3 component $C_{n1}$.

As shown in FIG. 12C, the phase of the desired signal component $S_{k1}$ and the phase of the desired signal component $S_{m1}$ are different from each other. Therefore, the phase of the desired signal component $S_{n1}$ is different from the phase of the desired signal component $S_{k1}$ and the phase of the desired signal component $S_{m1}$. The phase of the first total sum IM3 component $C_{k1}$ and the phase of the first total sum IM3 component $C_{m1}$ are different from each other. Therefore, the phase of the first total sum IM3 component $C_{n1}$ is different from the phase of the first total sum IM3 component $C_{k1}$ and the phase of the first total sum IM3 component $C_{m1}$. On the other hand, the phase of the third IM3 component $Z_{m1}$ is not changed at the point n1. Therefore, the relationship between the desired signal component, the phase of the first total sum IM3 component, and the phase of the third IM3 component is changed from the state of FIG. 12B to the state of FIG. 12D.

Figure 12D:
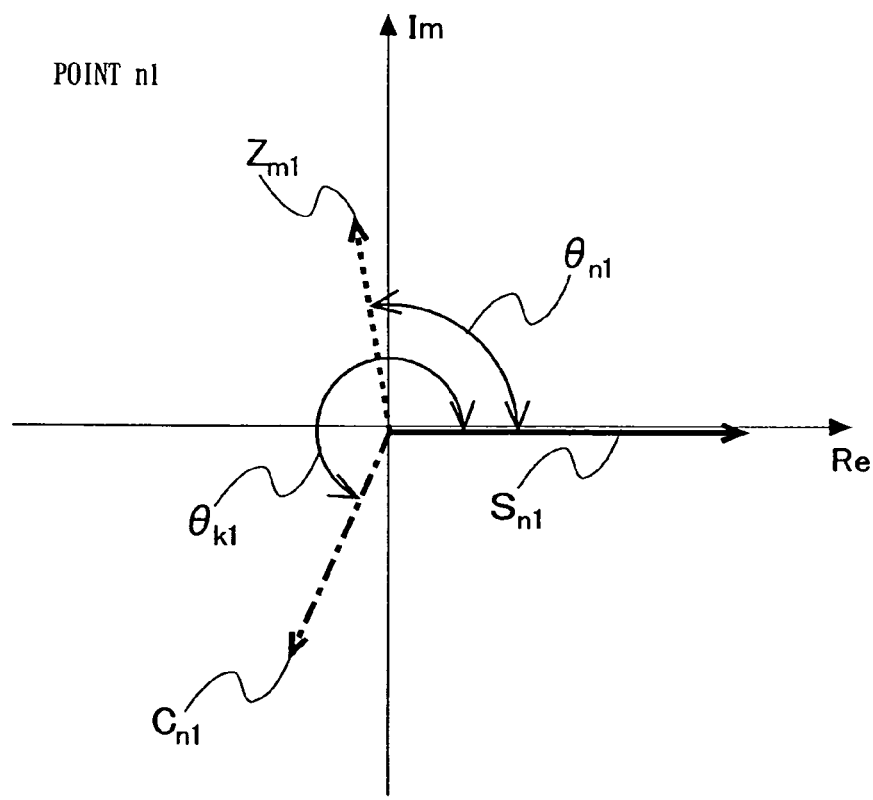
FIG. 12D is a schematic diagram illustrating a relationship between the phase of the desired signal component, the phase of the first total sum IM3 component, and the phase of the third IM3 component.

FIG. 12D is a schematic diagram illustrating a relationship between the phase of the desired signal component $S_{n1}$, the phase of the first total sum IM3 component $C_{n1}$, and the phase of the third IM3 component $Z_{m1}$. As illustrated in FIG. 12D, the difference between the phase of the desired signal component $S_{n1}$ and the phase of the first total sum IM3 component $C_{n1}$ is not changed from $\theta_{k1}$. On the other hand, the difference between the phase of the desired signal component $S_{n1}$ and the phase of the third IM3 component $Z_{m1}$ is changed from 180° to $\theta_{n1}$.

The difference between the phase of the desired signal component $S_{k1}$ and the phase of the desired signal component $S_{m1}$ at the point n1 is represented by $\theta_{\gamma 1}$. In this case, it is preferable that $\theta_{\gamma 1}$ has a value in the range of $90° \leq \theta_{\gamma 1} \leq 270°$. The reason has already been described in the first embodiment and will not be explained.

The third amplification section 101-3 amplifies the desired signal component $S_{n1}$, the first total sum IM3 component $C_{n1}$, and the third IM3 component $Z_{m1}$ while maintaining the phase relationship of FIG. 12D. When the third amplification section 101-3 amplifies the desired signal component $S_{n1}$, a third IM3 component newly occurs.

Figure 12E:
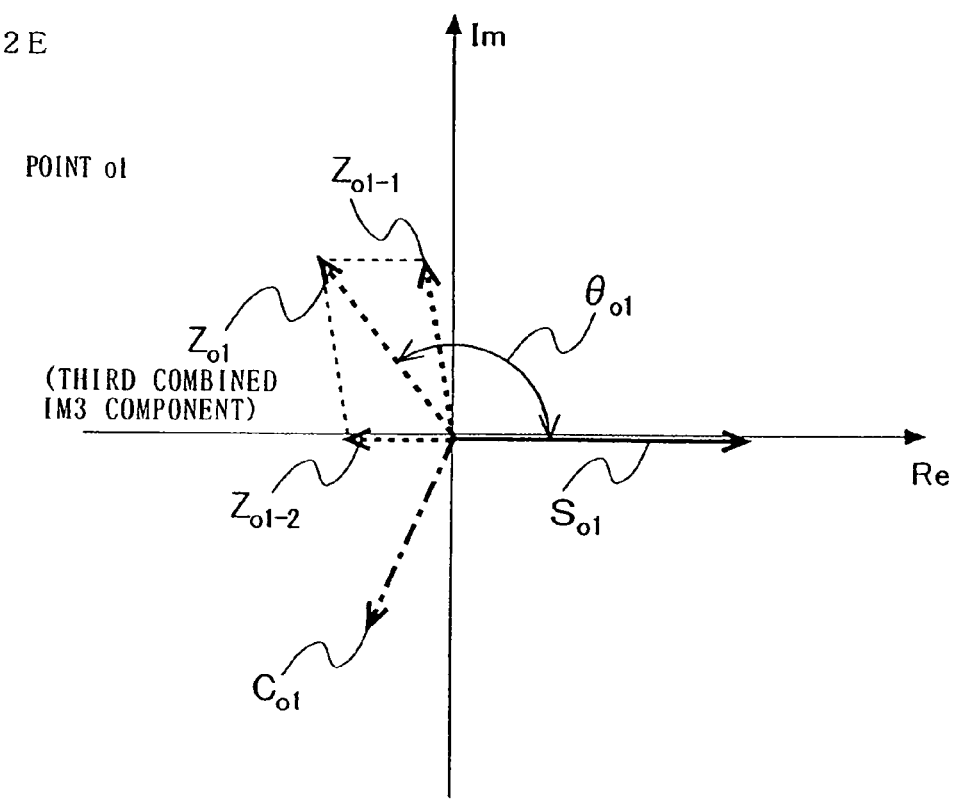
FIG. 12E is a schematic diagram illustrating a relationship between the phase of the amplified desired signal component, the phase of the amplified first total sum IM3 component, and the phase of the amplified third IM3 component, and the phase of the newly occurring third IM3 component, at a point o1 of FIG. 10.

FIG. 12E is a schematic diagram illustrating a relationship between the phase of the amplified desired signal component $S_{n1}$ at a point o1 of FIG. 10 (hereinafter referred to as a desired signal component $S_{o1}$), the phase of the amplified first total sum IM3 component $C_{n1}$ at the point o1 (hereinafter referred to as a first total sum IM3 component $C_{o1}$), the phase of the amplified third IM3 component $Z_{n1}$ at the point o1 (hereinafter referred to as a third IM3 component $Z_{o1-2}$), and the phase of the newly occurring third IM3 component at the point o1 (hereinafter referred to as a third IM3 component $Z_{o1-2}$). As illustrated in FIG. 12E, the difference between the phase of the desired signal component $S_{o1}$ and the phase of the third IM3 component $Z_{o1-2}$ is 180°. At the point o1, the third IM3 component $Z_{o1-1}$ and the third IM3 component $Z_{o1-2}$ are combined to generate a third combined IM3 component. The third combined IM3 component is hereinafter referred to as a third IM3 component $Z_{o1}$. The difference between the phase of the desired signal component $S_{o1}$ and the phase of the third IM3 component $Z_{o1}$ is represented by $\theta_{o1}$. Note that, at the point o1, the difference between the phase of the desired signal component $S_{o1}$ and the phase of the first total sum IM3 component $C_{o1}$ is not changed from $\theta_{k1}$.

Figure 12F:
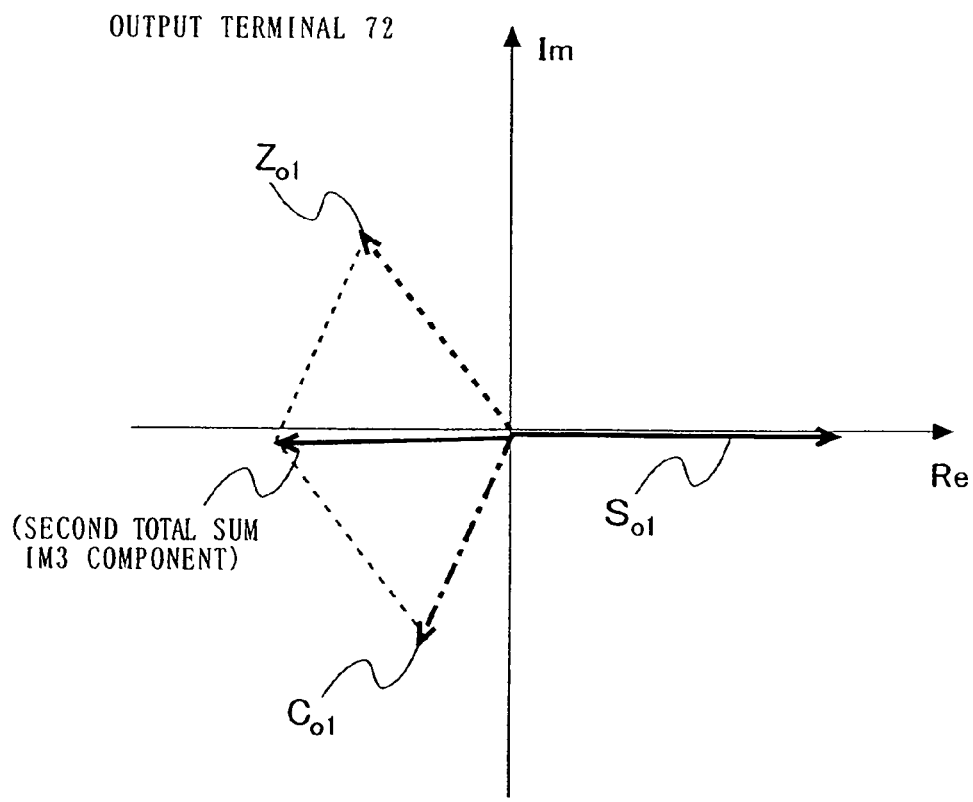
FIG. 12F is a schematic diagram illustrating a relationship between the phase of the desired signal component, the phase of the first total sum IM3 component, and the phase of the third IM3 component in the output terminal 72 of FIG. 10.

FIG. 12F is a schematic diagram illustrating a relationship between the phase of the desired signal component $S_{o1}$, the phase of the first total sum IM3 component $C_{o1}$, and the phase of the third IM3 component $Z_{o1}$ in the output terminal 72 of FIG. 10. As illustrated in FIG. 12F, the first total sum IM3 component $C_{o1}$ and the third IM3 component $Z_{o1}$ are combined to generate a second total sum IM3 component. The phase of the first total sum IM3 component $C_{o1}$ and the phase of the third IM3 component $Z_{o1}$ are reverse to each other to cancel out. The output terminal 72 outputs the desired signal component $S_{o1}$ and the second total sum IM3 component. In this manner, the multistage amplifying device 2 suppresses an IM3 component occurring in each amplifier.

As described above, the phase difference $\theta_{min1}$ between the first IM3 component and the second IM3 component is such that the first IM3 component and the second IM3 component are not suppressed. Specifically, this is achieved when the power value of the first total sum IM3 component occurring at the point k1 of FIG. 10 is larger than the sum of the power value of the first IM3 component $X_{k1}$ and the power value of the second IM3 component $Y_{k1}$. In other words, this is achieved, when, at the point k1, the phase difference $\theta_{min1}$ between the first IM3 component $X_{k1}$ and the second IM3 component $Y_h$ is 120° or less. Note that, when $\theta_{min1}=0°$, the power value of the first total sum IM3 component can be maximized.

The phase difference between the second total sum IM3 component $C_{o1}$ and the third IM3 component $Z_{o1}$ in the output terminal 72 is represented by $\theta_{min2}$, $\theta_{min2}=\theta_{o1}-\theta_{k1}$. In order that the second total sum IM3 component $C_{o1}$ and the third IM3 component $Z_{o1}$ cancel out in the output terminal 72, $\theta_{min2}>120°$ as in the first embodiment. When $\theta min2=180°$, the power value of the second total sum IM3 component is minimum.

In multistage amplifying devices, the power value of the desired signal input to the next stage amplifier is larger than the power value of the desired signal input to the previous stage amplifier. In the multistage amplifying device 2, the power value of the third IM3 component is larger than both the power value of the first IM3 component and the power value of the second IM3 component. In the multistage amplifying device 2, the power value of the first total sum IM3 component is caused to be larger than both the power value of the first IM3 component and the power value of the second IM3 component. Thereby, it is possible to reduce the power value of the second total sum IM3 component, thereby making it possible to suppress the IM3 component occurring in the multistage amplifying device 2.

Thus, in the multistage amplifying device 2 of the second embodiment of the present invention, by changing the phase of the first IM3 component, the phase of the second IM3 component, and the phase of the third IM3 component, the first IM3 component, the second IM3 component, and the third IM3 component are caused to cancel out, thereby suppressing IM3. Further, each amplifier of the multistage amplifying device 2 is a feedback-type amplifier. Therefore, an IM3 component occurring in each amplification section is suppressed as in a typical feedback-type amplifier circuit, and is canceled as described above. Therefore, IM3 can be further suppressed. White noise occurring in each amplification section of the multistage amplifying device 2 is negligible compared to the IM3 components occurring due to the amplified desired signal and the desired signal. Further, white noise occurring in each amplification section can be suppressed by negative feedback. Therefore, the multistage amplifying device 2 does not require a device for removing white noise, and therefore, can be constructed with a simple structure.

Also in FIG. 10, in the first parallel feedback section 102-1, the second parallel feedback section 102-2, and the third parallel feedback section 102-3, all feedback sections thereof may have an inductive reactance component. Alternatively, all of the feedback sections may have a capacitive reactance component.

Alternatively, in the first parallel feedback section 102-1, the second parallel feedback section 102-2, and the third parallel feedback section 102-3, any one of the feedback sections may have an inductive reactance component, while the other feedback sections may have a capacitive reactance component.

Alternatively, in the first parallel feedback section 102-1, the second parallel feedback section 102-2, and the third parallel feedback section 102-3, anyone of the feedback sections may have a capacitive reactance component, while the other feedback sections may have an inductive reactance component.

Further, in the second embodiment of the present invention, the multistage amplifying device 2 has been described as an single-end type multistage amplifying device. Alternatively, the multistage amplifying device 2 may employ a differential type amplifier circuit.

Third Embodiment

In a third embodiment of the present invention, a multistage amplifying device comprising first to N-th amplifiers (N is a natural number of 2 or more).

The k-th amplifier has a k-th amplification section and a k-th feedback section which has a reactance component, changes the phase of an output signal of the k-th amplification section, and feeds the resultant output signal back to the input side of the k-th amplification section. Note that, in the third embodiment, a multistage amplifying device 3 in which first to N-th parallel feedback amplifiers are connected in cascade will be described with reference to FIG. 13.

Figure 13:
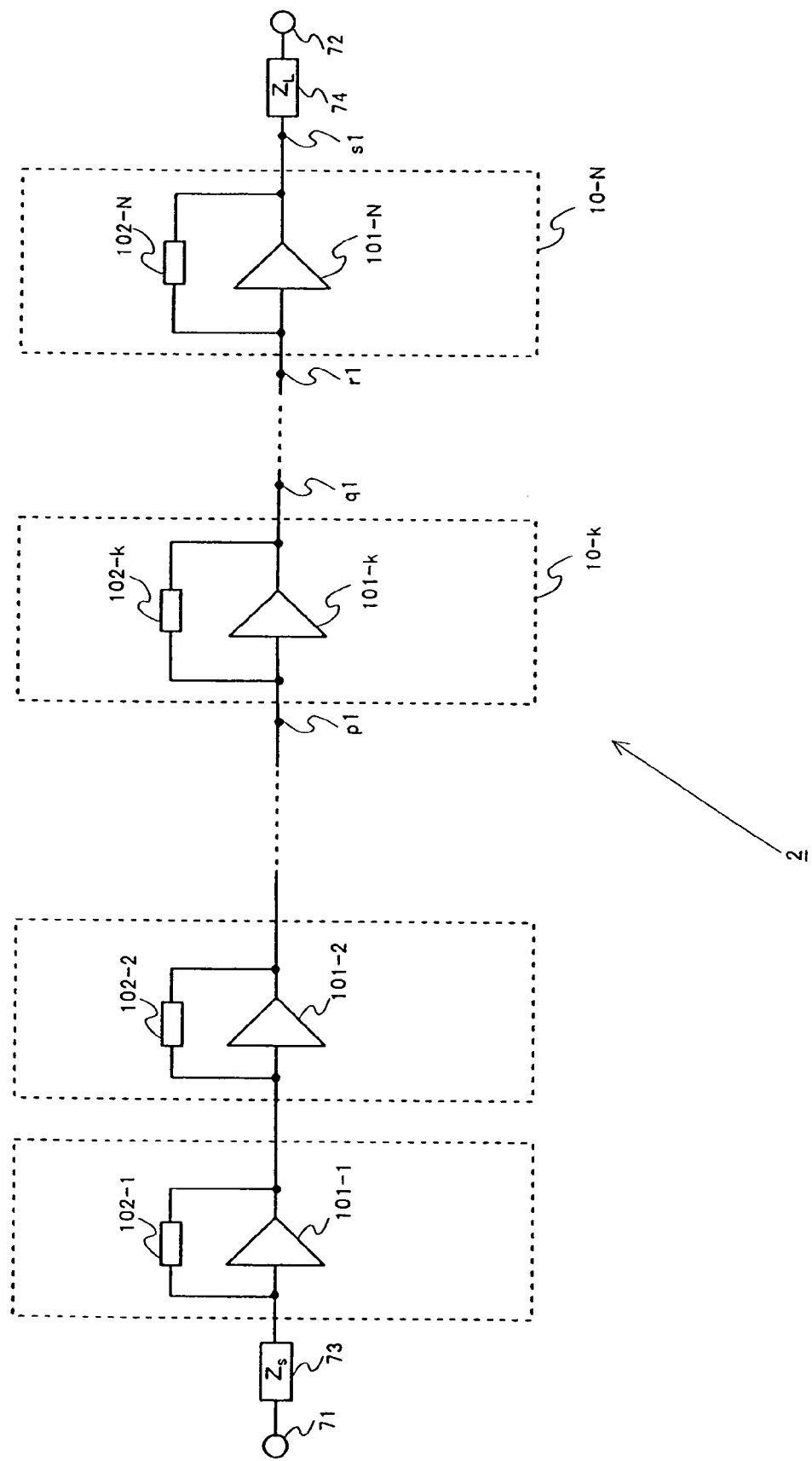
FIG. 13 is a diagram illustrating an exemplary structure of a multistage amplifying device according to a third embodiment of the present invention.

FIG. 13 is a circuit diagram illustrating a structure of the multistage amplifying device 3 of the third embodiment of the present invention. The multistage amplifying device 3 of FIG. 13 comprises the first to N-th parallel feedback amplifiers. The k-th (k is a natural number of 1 to N) parallel feedback section 10-k includes a k-th amplifier 101-k and a k-th feedback section 102-k. As illustrated in FIG. 13, the k-th parallel feedback amplifiers 10-k are connected in cascade. Whereas the multistage amplifying device 2 of the second embodiment includes three parallel feedback amplifiers connected in cascade, the multistage amplifying device 3 includes N parallel feedback amplifiers connected in cascade. Hereinafter, an operation of the multistage amplifying device 3 will be described, especially about elements different from those of the second embodiment.

A first parallel feedback amplifier 10-1 according to the third embodiment is similar to that of of the second embodiment and will not be explained. A second parallel feedback amplifier 10-2 according to the third embodiment is similar to that of the second embodiment and will not be explained.

An operation of the k-th parallel feedback amplifier 10-k will be described. An operation of the k-th parallel feedback amplifier 10-k is close to that of the second parallel feedback amplifier 10-2 of the second embodiment and will not be described in detail. Only elements different from the second parallel feedback amplifier 10-2 will be described.

Figure 14A:
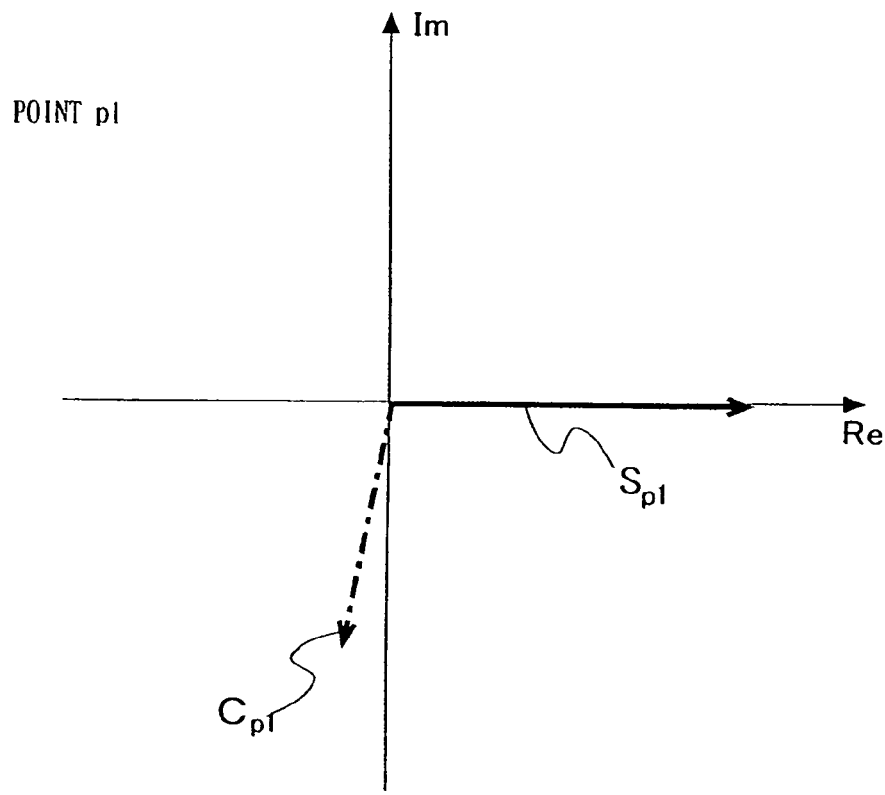
FIG. 14A is a schematic diagram illustrating a relationship between the phase of a desired signal component and the phase of a (k−2)-th total sum IM3 component, at a point p1 of FIG. 13.

FIG. 14A is a schematic diagram illustrating a relationship between the phase of a desired signal component $S_{p1}$ and the phase of a (k−2)-th total sum IM3 component $C_{p1}$, at a point p1 of FIG. 13. The (k−2)-th total sum IM3 component is a combination of IM3 components occurring in the first to (k−1)-th amplification sections. FIG. 14A corresponds to FIG. 2F described in the first embodiment. The desired signal component $S_{p1}$ corresponds to the desired signal component $S_{d1}$ of FIG. 2F. The (k−2)-th total sum IM3 component $C_{p1}$ corresponds to the first IM3 component $X_{d1}$ of FIG. 2F. As illustrated in FIG. 13, the difference between the phase of the desired signal component $S_{p1}$ and the phase of (k−2)-th total sum IM3 component $C_{p1}$ is represented by $\theta_{p1}$. $\theta_{p1}$ corresponds to $\theta_{k1}$ of the second embodiment. The desired signal component $S_{p1}$ and the (k−2)-th total sum IM3 component $C_{p1}$ are input to the k-th parallel feedback amplifier 10-k. Note that the (k−2)-th total sum IM3 component $C_{p1}$ is a third-order inter-modulation distortion which occurs due to a frequency component in the desired frequency band included in a signal output from the previous stage amplifier ((k−1)-th parallel feedback amplifier 10-k−1 (not illustrated)).

Figure 14B:
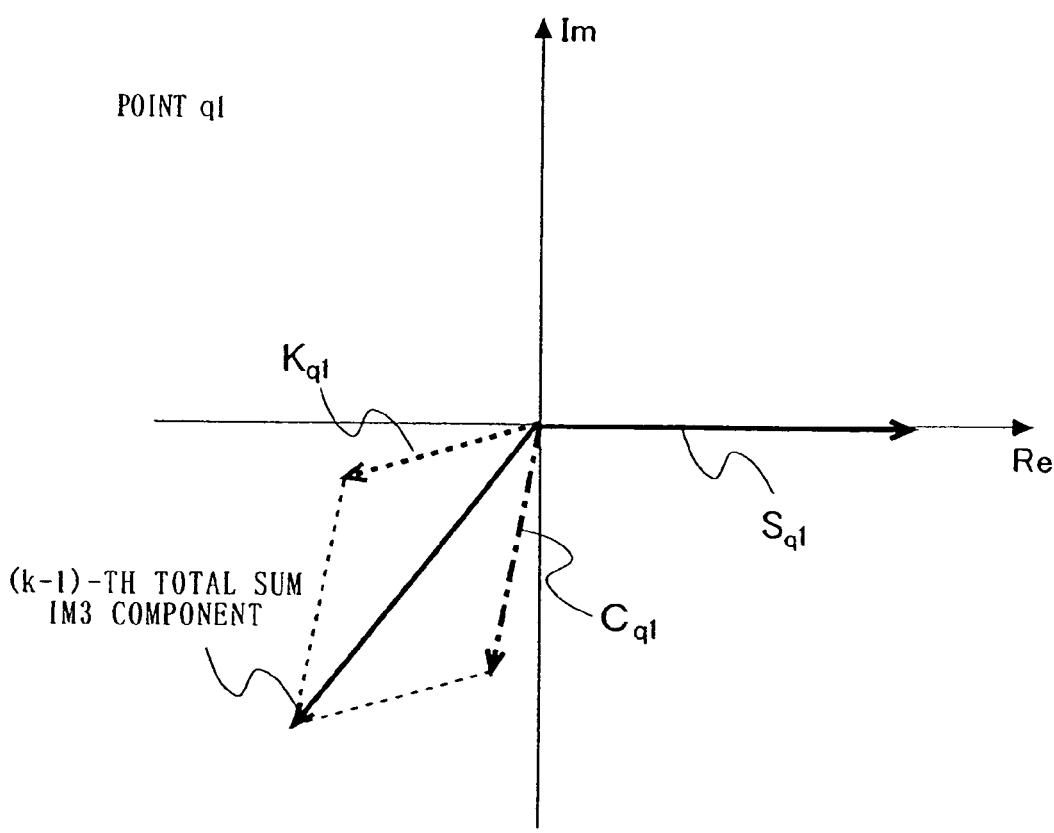
FIG. 14B is a schematic diagram illustrating a relationship between the phase of a desired signal component, the phase of the (k−2)-th total sum IM3 component, and the phase of a k-th IM3 component occurring in the k-th amplifier, at a point q1 of FIG. 13.

FIG. 14B is a schematic diagram illustrating a relationship between the phase of a desired signal component at a point q1 of FIG. 13 (hereinafter referred to as a desired signal component $S_{q1}$), the phase of the (k−2)-th total sum IM3 component at the point q1 (hereinafter referred to as a (k−2)-th total sum IM3 component $C_{q1}$), and the phase of a k-th IM3 component occurring in the k-th amplification section at the point q1 (hereinafter referred to as a k-th IM3 component $K_{q1}$). FIG. 14B corresponds to FIG. 11B described in the second embodiment. The desired signal component $S_{q1}$ corresponds to the desired signal component $S_{k1}$ of FIG. 11B. The (k−2)-th total sum IM3 component $C_{q1}$ corresponds to the first IM3 component $X_{k1}$ of FIG. 11B. The k-th IM3 component $K_{q1}$ corresponds to the third IM3 component $Y_{k1}$ of FIG. 11B.

As illustrated in FIG. 14B, at the point q1, the (k−2)-th total sum IM3 component $C_{q1}$ and the k-th IM3 component $K_{q1}$ are combined to generate a (k−1)-th total sum IM3 component. The k-th amplifier outputs the desired signal component $S_{q1}$ and the (k−1)-th total sum IM3 component to a (k+1)-th amplifier 10-(k+1) (not illustrated).

The minimum difference of the phase of the (k−2)-th total sum IM3 component $C_{q1}$ and the phase of the k-th IM3 component $K_{q1}$ is represented by $\theta_{q1}$. The (k−2)-th total sum IM3 component $C_{q1}$ and the (k−1)-th IM3 component $K_{q1}$ do not cancel out, if the power value of the k-th total sum IM3 component is larger than the sum of the power value of the (k−2)-th total sum IM3 component $C_{q1}$ and the power value of the k-th IM3 component $K_{q1}$. This is achieved when $\theta_{q1} < 120°$.

An operation of the N-th parallel feedback amplifier 10-N will be described.

The operation of the N-th parallel feedback amplifier 10-N is close to the operation of the parallel feedback amplifier 10-3 of the second embodiment and will not be described in detail. Only elements different from the second embodiment will be described.

Figure 15A:
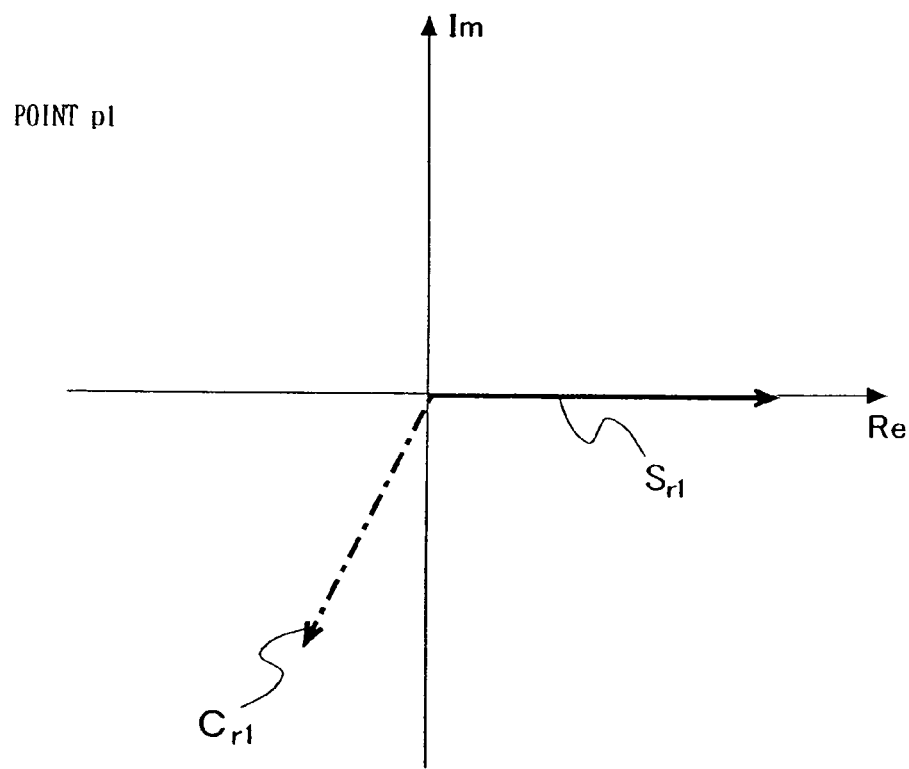
FIG. 15A is a schematic diagram illustrating a relationship between the phase of the desired signal component, and the phase of an (N−2)-th total sum IM3 component, at a point r1 of FIG. 13.

FIG. 15A is a schematic diagram illustrating a relationship between the phase of the desired signal component at a point r1 of FIG. 13 (hereinafter referred to as a desired signal component $S_{r1}$), and the phase of an (N−2)-th total sum IM3 component at the point r1 (hereinafter referred to as an (N−2)-th total sum IM3 component $C_{r1}$). FIG. 15A corresponds to FIG. 11B described in the second embodiment. The desired signal component $S_{r1}$ corresponds to the desired signal component $S_{k1}$ of FIG. 11B. The (N−2)-th total sum IM3 component corresponds to the first total sum IM3 component of FIG. 11B. The minimum difference between the phase of the desired signal component $S_{r1}$ and the phase of the (N−2)-th IM3 component $C_{r1}$ is represented by $\theta_{r1}$. $\theta_{r1}$ corresponds to $\theta_{k1}$. The N-th parallel feedback amplifier 10-N receives the desired signal component $S_{r1}$ and the (N−2)-th total sum IM3 component $C_{r1}$.

The N-th amplification section 101-N amplifies the desired signal component $S_{r1}$ and the (N−2)-th total sum IM3 component $C_{r1}$. Note that when the N-th amplification section101-N amplifies the desired signal component $S_{r1}$, an IM3 component newly occurs (hereinafter referred to as an N-th IM3 component).

Figure 15B:
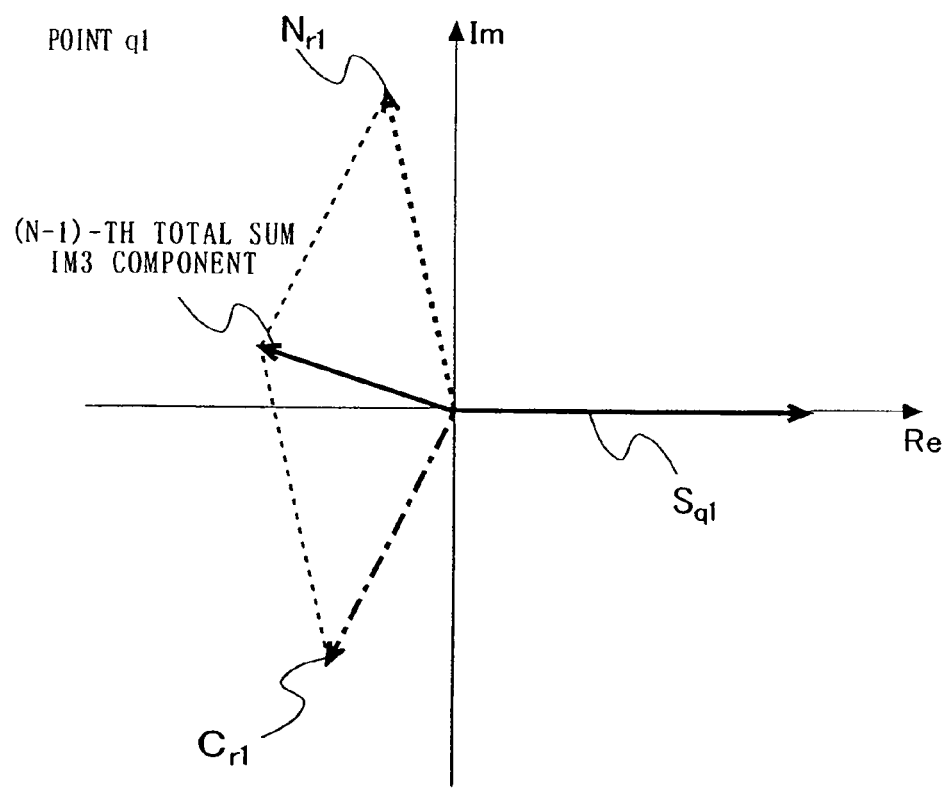
FIG. 15B is a schematic diagram illustrating a relationship between the phase of the desired signal component, the phase of the (N−2)-th total sum IM3 component, and the phase of the N-th IM3 component, at a point s1 of FIG. 13.

FIG. 15B is a schematic diagram illustrating a relationship between the phase of the desired signal component at a point s1 of FIG. 13 (hereinafter referred to as a desired signal component $S_{s1}$), the phase of the (N−2)-th total sum IM3 component at the point s1 (hereinafter referred to as an (N−2)-th total sum IM3 component $C_{s1}$), and the phase of the N-th IM3 component at the point s1 (hereinafter referred to as an N-th IM3 component $N_{s1}$). FIG. 15B corresponds to FIG. 12F described in the second embodiment. The desired signal component $S_{s1}$ corresponds to the desired signal component $S_{o1}$ of FIG. 12F. The (N−2)-th total sum IM3 component $C_{s1}$ corresponds to the first total sum IM3 component $C_{o1}$ of FIG. 12F. The N-th IM3 component $N_{s1}$ corresponds to the third IM3 componentZ o1 of FIG. 12F. The difference between the phase of the desired signal component $S_{s1}$ and the phase of the N-th IM3 component $N_{s1}$ is represented by $\theta_{s1}$.

As illustrated in FIG. 15B, at the point s1, the (N−2)-th total sum IM3 component $C_{s1}$ and the N-th IM3 component $N_{s1}$ are combined to generate an (N−1)-th IM3 component. In this case, the difference between the phase of the (N−2)-th total sum IM3 component $C_{s1}$ and the phase of the N-th IM3 component $N_{s1}$ is represented by $\theta_N$. In this case, $\theta_N=\theta_{s1}-\theta_{r1}$. Similar to $\theta_{min1}$, $\theta_N$ is 120° or more and 180° or less. Thereby, the power value of the (N−1)-th total sum IM3 component becomes smaller than both the power value of the (N−2)-th IM3 component $C_{s1}$ and the power value of the N-th IM3 component $N_{s1}$, so that the (N−2)-th total sum IM3 component $C_{s1}$ and the N-th IM3 component $N_{s1}$ cancel out. As a result, the IM3 component occurring in each amplification section of the multistage amplifying device 3 is suppressed. Note that details of $\theta_{r1}$, $\theta_{s1}$ and $\theta_N$ have described in the first embodiment and will not be described.

In multistage amplifying devices, the power value of the desired signal input to the second stage amplifier is larger than the power value of the desired signal input to the first stage amplifier. In the multistage amplifying device 3, the power value of the N-th IM3 component is larger than the power value of each of the first to (N−1)-th IM3 components. In the multistage amplifying device 3, the power value of the (N−2)-th total sum IM3 component is larger than the power value of each of the first to (N−3)-th total sum IM3 components. Thereby, it is possible to reduce the power value of the (N−1)-th total sum IM3 component, thereby making it possible to suppress the IM3 component occurring in the multistage amplifying device 3.

Thus, in the multistage amplifying device 3 of the third embodiment of the present invention, the difference between the phase of a frequency component of the desired frequency band included in a signal output from the N-th amplifier and the phase of the IM3 component included in a signal output from the (N−1)-th amplifier is referred to as a first phase, and the difference between the phase of a frequency component of the desired frequency band included in a signal output from the N-th amplifier and the phase of a combined IM3 component of an IM3 component occurring in the N-th amplification section and an IM3 component fed-back from the N-th feedback section is referred to as a second phase, the difference between the first phase and the second phase is 120° or more and 180° or less. In this case, the power value of a total sum IM3 component generated by combining the IM3 component included in a signal output from the (N−1)-th amplifier and the combined IM3 component can be made smaller than both the power value of the IM3 component included in the output signal of the (N−1)-th amplifier and the power value of the combined IM3 component. Thereby, an IM3 component generated in each amplification section of the multistage amplifying device 3 can be suppressed. The first to N-th parallel feedback amplifiers are each a feedback-type amplifier. Therefore, an IM3 component occurring in each amplification section is suppressed as in a typical feedback-type amplifier circuit, and is canceled as described above. Therefore, IM3 can be further suppressed. White noise occurring in each amplification section of the multistage amplifying device 3 is negligible compared to the IM3 components occurring due to the amplified desired signal and the desired signal. Further, white noise occurring in each amplification section can be suppressed by negative feedback. Therefore, the multistage amplifying device 3 does not require a device for removing white noise, and therefore, can be constructed with a simple structure.

In the third embodiment, the multistage amplifying device 3 in which the first to N-th parallel feedback amplifiers are connected in cascade have been illustrated. However, the multistage amplifying device of the third embodiment does not have to employ the k-th parallel feedback amplifier. Specifically, the k-th amplifier may have a reactance component, and may have a k-th feedback section which changes the phase of the output signal of the k-th amplification section and feeds the resultant signal back to the input side of the k-th amplification section. Alternatively, as the first to N-th amplifiers, amplifiers including a series feedback section described below, amplifiers having a parallel feedback section and a feedback section described below, or the like may be used.

Fourth Embodiment

Figure 16:
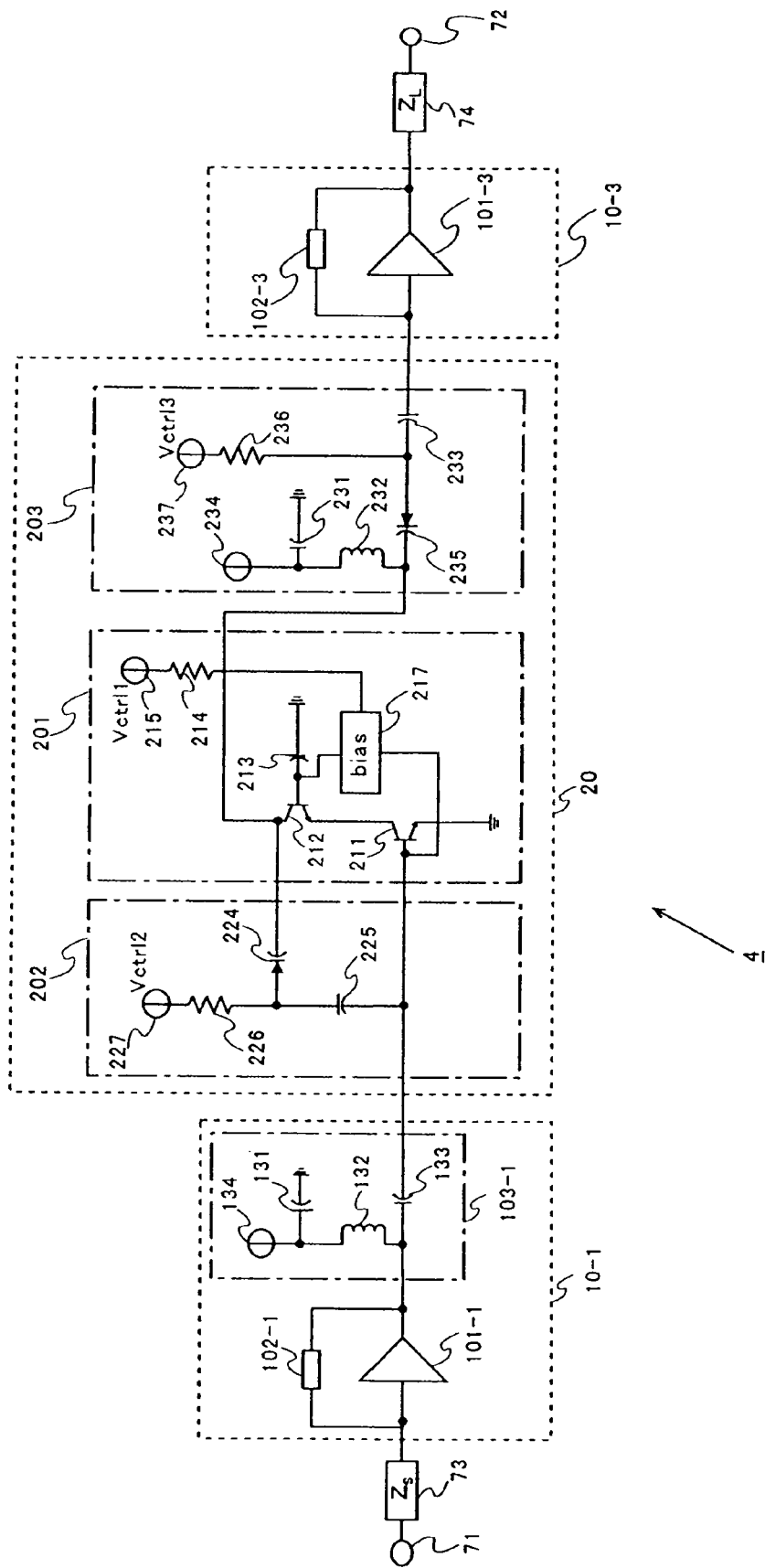
FIG. 16 is a circuit diagram illustrating an exemplary structure of a multistage amplifying device according to a fourth embodiment of the present invention.

FIG. 16 is a circuit diagram illustrating an exemplary structure of a multistage amplifying device 4 according to a fourth embodiment of the present invention. The multistage amplifying device 4 of FIG. 16 comprises a first parallel feedback amplifier 10-1, a phase control amplifier 20, and a third parallel feedback amplifier 10-3. The multistage amplifying device 4 of FIG. 16 is different from the multistage amplifying device 2 of FIG. 8 in that the phase control amplifier 20 is provided instead of the second parallel feedback amplifier 10-2. In the multistage amplifying device 4 of FIG. 16, the same components as those of the multistage amplifying device of the second embodiment are referenced with the same reference numerals as those of FIG. 8. Hereinafter, an operation of the multistage amplifying device 4 will be described, especially about elements different from those of the second embodiment.

The phase control amplifier 20 includes a phase control amplification section 201, a phase control feedback section 202, and a phase control matching circuit 203. The phase control amplification section 201 includes a third transistor 211, a fourth transistor 212, a sixth capacitor 213, a third resistor 214, a first signal internal terminal 215, and a bias circuit 216. The phase control feedback section 202 has a first varactor diode 224, a tenth capacitor 225, a fourth resistor 226, and a second signal internal terminal 227. The phase control matching circuit 203 has an eighth capacitor 231, a third inductor 232, a ninth capacitor 233, a second power source terminal 234, a second varactor diode 235, a fifth resistor 236, and a third signal internal terminal 237.

In the phase control amplification section 201, the base of the third transistor 211 is connected to the first parallel feedback amplifier 10-1. The collector of the third transistor 211 is connected to the emitter of the fourth transistor 212. The collector of the fourth transistor 212 is connected to the ninth capacitor 233. The emitter of the third transistor 211 is grounded. The base of the fourth transistor 212 is grounded via the sixth capacitor 213. The bias circuit 216 is connected to the base of the third transistor 211 and the base of the fourth transistor 212. The bias circuit 216 is also connected via the third resistor 214 to the first signal internal terminal 215.

In the phase control feedback section 202, the second signal internal terminal 227 is connected via the fourth resistor 226 to one end of the first varactor diode 224 and one end of the tenth capacitor 225. The other end of the first varactor diode 224 is connected to the base of the fourth transistor 212. The other end of the tenth capacitor 225 is connected to the base of the third transistor 211.

In the phase control matching circuit 203, one end of the ninth capacitor 233 is connected to the collector of the fourth transistor 212 and one end of the third inductor 232. The other end of the third inductor 232 is connected to a power source terminal 237 and is also grounded via the eighth capacitor 231. The other end of the ninth capacitor 233 is connected via the fifth resistor 236 to the third signal internal terminal 237, and also via the second varactor diode 235 to the parallel feedback amplifier 10-3.

A detailed operation of the multistage amplifying device 4 is similar to that of the multistage amplifying device of the second embodiment and will not be explained.

An operation of the phase control amplification section 201 will be described. The phase control amplification section 201 receives a first control signal from the first signal internal terminal 215. A value of current flowing through the third transistor 211 and the fourth transistor 212 varies depending on a voltage value $V_{ctrl1}$ of the first control signal. A change in value of the current flowing through the third transistor 211 and the fourth transistor 212 is associated with a change in current gain $\alpha_1$ of the phase control amplification section 201.

When expressions (18) and (19) representing the nonlinear closed-loop transfer function of the output current of the first parallel feedback amplifier 10-1 is applied to the phase control amplifier 20, it will be understood that the value of the phase component $\theta_1$ in the term $1/\{1-\beta(\omega_0)\cdot\alpha_1(\omega_0)\}$ of expressions (18) and (19) depends on the value of a current gain $\alpha_1(\omega_0)$ of the phase control amplification section 201. As described in the first embodiment, $\theta_1$ is a parameter which determines the difference $\Delta\phi_{1-IM3L}$ between the phase of the desired signal component of expression (21) and the phase of the IM3 component. Therefore, by controlling the voltage value $V_{ctrl1}$ of the first control signal, the difference between the phase of a desired signal component output from the phase control amplifier 20 and the phase of a second IM3 component can be controlled.

An operation of the phase control feedback section 202 will be described. The phase control feedback section 202 receives a second control signal from the second signal internal terminal 227. A capacitance value of the first varactor diode 224 varies depending on a voltage value $V_{ctrl2}$ of the second control signal. Therefore, the phase control feedback section 202 has an admittance of $Y'_{fl}$ which varies depending on a change in the capacitance value of the first varactor diode 224. As the admittance $Y'_{fl}$ of the phase control feedback section 202 is changed, a change value in the phase of each of the desired signal component, the first IM3 component and the second IM3 component is changed.

When expressions (18) and (19) representing the nonlinear closed-loop transfer function of the output current of the first parallel feed back amplifier 10-1 is applied to the phase control amplifier 20, it will be understood that the value of the phase component $\theta_1$ in the term $1/\{1-\beta(\omega_0)\cdot\alpha_1(\omega_0)\}$ of expressions (18) and (19) depends on the value of a current gain $\alpha_1(\omega_0)$ of the phase control amplification section 201. As indicated by expression (3), the feedback amount $\beta(\omega_0)$ depends on the admittance $Y'_{fl}$ of the phase control feedback section 202. Therefore, in expressions (18) and (19) representing the nonlinear closed-loop transfer function of the output current of the phase control amplifier 20, the value of the phase component $\theta_1$ in the term $1/\{1-\beta(\omega_0)\cdot\alpha_1(\omega_0)\}$ varies depending on a change in the value of the admittance $Y'_{fl}$. Thus, by controlling the voltage value $V_{ctrl2}$ of the second control signal, the difference between the phase of the desired signal component output from the phase control amplifier 20 and the phase of the second IM3 component can be controlled.

An operation of the phase control matching circuit 203 will be described. The phase control matching circuit 203 receives a third control signal from the third signal internal terminal 237. The second varactor diode 235 has a capacitance value which varies depending on a voltage value $V_{ctrl3}$ of the third control signal. The change in capacitance value of the second varactor diode 235 is associated with a change in the input admittance $Y'_L$ of the phase control matching circuit 203.

As indicated in expression (3), the feedback amount $\beta(\omega_0)$ depends on the admittance $Y'_L$ of the phase control matching circuit 203. When expressions (18) and (19) representing the nonlinear closed-loop transfer function of the output current of the first parallel feedback amplifier 10-1 is applied to the phase control amplifier 20, it will be understood that the value of the phase component $\theta_1$ in the term $1/\{1-\beta(\omega_0)\cdot\alpha_1(\omega_0)\}$ of expressions (18) and (19) varies depending on a change in the admittance $Y'_L$ of the phase control matching circuit 203. Thus, by controlling the voltage value $V_{ctrl3}$ of the third control signal, the difference between the phase of the desired signal component output from the phase control amplifier 20 and the second IM3 component can be controlled.

As described above, the multistage amplifying device 4 of the fourth embodiment of the present invention controls the current gain of the amplification section, the admittance of the feedback section, and the admittance of the matching circuit, the difference between the phase of the desired signal component and the phase of the IM3 component can be controlled. The multistage amplifying device 4 can control the difference between the phase of the desired signal component and the phase of the IM3 component, depending ont the state of the desired signal to be amplified.

For example, the multistage amplifying device 4 is useful for a mobile communication terminal or the like which switches frequency bands used, depending on the state of communication. When a susceptance component of a feedback section is constant, A desired signal of a center frequency $f_1$ and a desired signal of a center frequency $f_2$ have difference change amounts of the phase in the feedback section. Therefore, conditions for suppression of an IM3 component occurring due to the desired signal of the center frequency $f_1$ are different from conditions for suppression of an IM3 component occurring due to the desired signal of the center frequency $f_2$. Therefore, by the current gain of the amplification section, the admittance of the feedback section, and the admittance of the matching circuit, it is possible to amplify the desired signal and suppress the IM3 component, depending on the frequency band used by the mobile communication terminal.

Note that it has been described in the fourth embodiment that the multistage amplifying device 4 comprises the phase control amplifier 20 instead of the second parallel feedback amplifier 10-2 of the multistage amplifying device 2. However, the multistage amplifying device 4 may comprise a phase control amplifier 20 instead of the first parallel feedback amplifier 10-1 or the parallel feedback amplifier 10-3.

Also in the fourth embodiment, the phase control amplifier 20 may include at least one of the phase control amplification section 201, the phase control feedback section 202, and the phase control matching circuit 203.

Further, in the fourth embodiment, the three-stage multistage amplifying device has been described as an example. Alternatively, a two-stage multistage amplifying device or a four or more-stage multistage amplifying device can be used.

Fifth Embodiment

Figure 17:
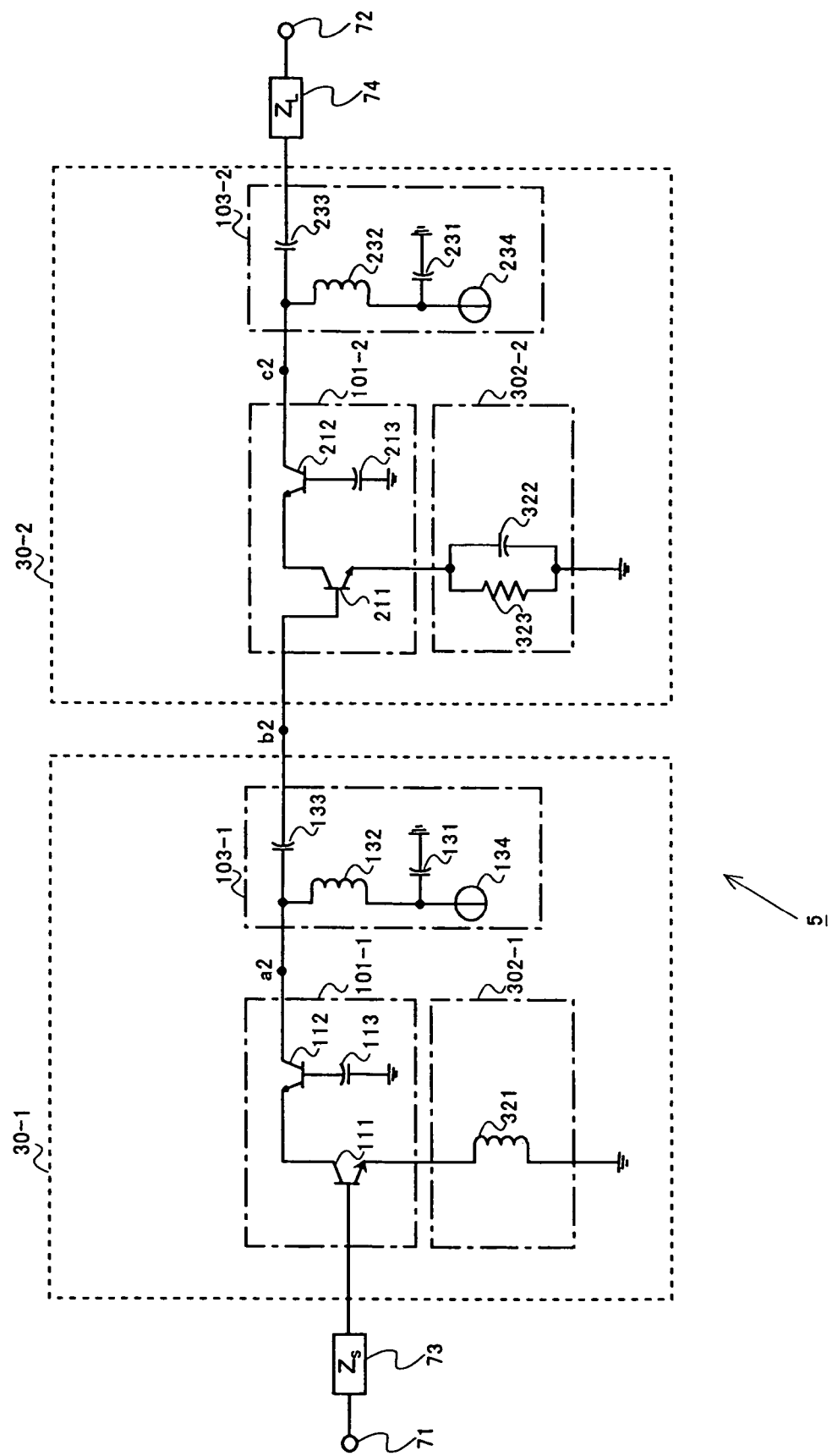
FIG. 17 is a diagram illustrating an exemplary structure of a multistage amplifying device according to a fifth embodiment of the present invention.

FIG. 17 is a diagram illustrating an exemplary structure of a multistage amplifying device 5 according to a fifth embodiment of the present invention. The multistage amplifying device 5 of FIG. 17 comprises a first series feedback amplifier 30-1 and a second series feedback amplifier 30-2. The first series feedback amplifier 30-1 includes a first amplification section 101-1, a first series feedback section 302-1, and a first matching circuit 103-1. The second series feedback amplifier 30-2 includes a second amplification section 101-2, a second series feedback section 302-2, and a second matching circuit 103-2.

As illustrated in FIG. 17, the multistage amplifying device 5 has a structure in which the first series feedback amplifier 30-1 and the second series feedback amplifier 30-2 are connected in cascade. The first series feedback section 302-1 and the second series feedback section 302-2 have reactance component different from each other. Note that FIG. 17 illustrates only an example of the multistage amplifying device 5, and the structure of the multistage amplifying device 5 is not limited to that of FIG. 17 and may have other structures.

The multistage amplifying device 5 of FIG. 17 is different from that of the multistage amplifying device 1 in two respects. One of the respects is that the first series feedback amplifier 30-1 includes the first series feedback section 302-1 instead of the first parallel feedback section 102-1 included in the first parallel feedback amplifier 10-1. The other respect is that the second series feedback amplifier 30-2 includes the second series feedback section 302-2 instead of the second parallel feedback section 102-2 included in the second parallel feedback amplifier 10-2. Note that, some components of the multistage amplifying device 5 of FIG. 17 are the same as those of the multistage amplifying device 1 of FIG. 6, and are referenced with the same reference numerals as those of the multistage amplifying device 1, and will not be explained. Hereinafter, the multistage amplifying device 5 of FIG. 17 will be described, especially about the above-described different elements.

The first series feedback section 302-1 has a the fifth inductor 321. Therefore, the first series feedback section 302-1 is an inductive series feedback section. The second series feedback section 302-2 has a fourteenth capacitor 322 and a sixth resistor 323. Therefore, the second series feedback section 302-2 is a capacitive series feedback section.

In the first series feedback amplifier 30-1, the emitter of the first transistor 111 is grounded via the fifth inductor 321. In the second series feedback amplifier 30-2, the emitter of the third transistor 211 is grounded via the fourteenth capacitor 322. The sixth resistor 323 and the fourteenth capacitor 322 are connected in parallel.

Figure 19:
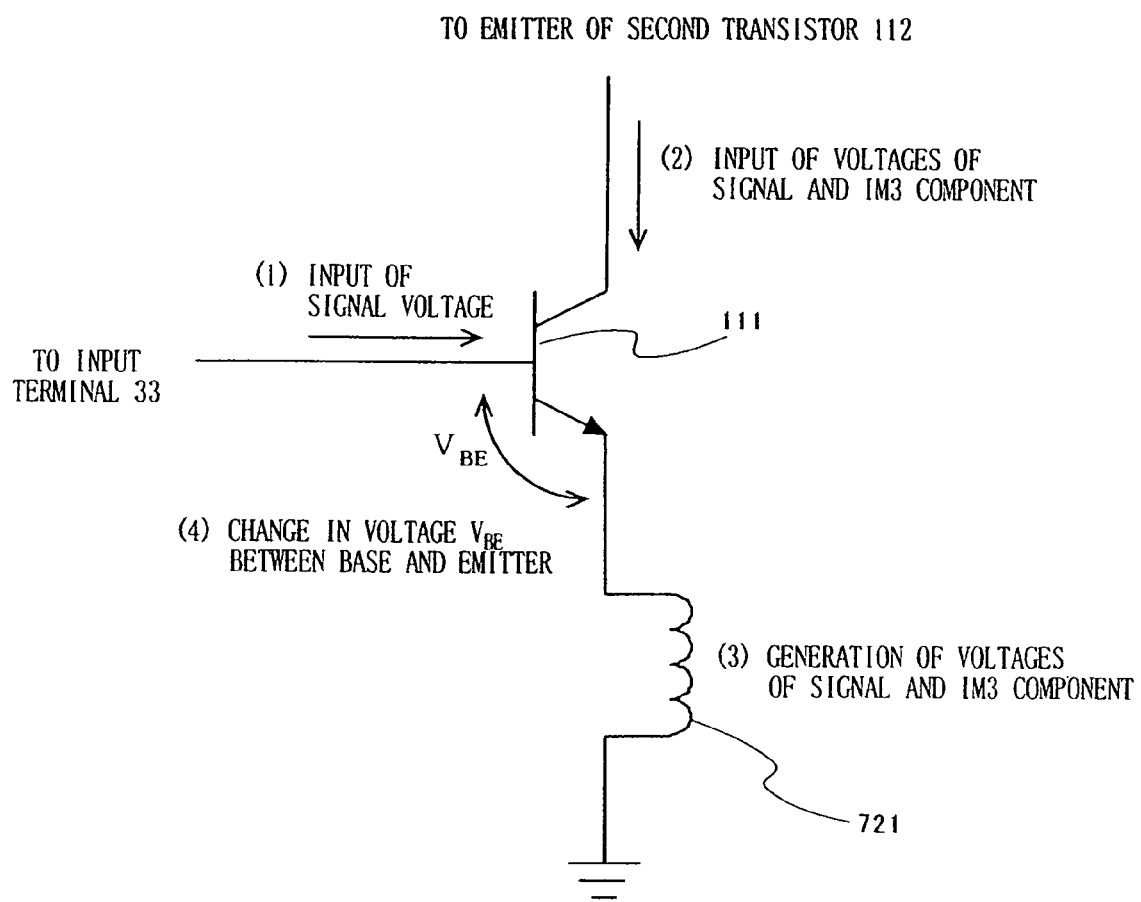
FIG. 19 is a diagram for explaining an operation of the first transistor 111 of the first series feedback amplifier 30-1.

An operating principle of series feedback amplifiers will be described with reference to FIG. 19. Note that the first series feedback amplifier 30-1 is used as an example. FIG. 19 is a diagram for explaining an operation of the first transistor 111 of the first series feedback amplifier 30-1. A voltage of a desired signal component is input to the base of the first transistor 111 ((1) of FIG. 19). The first transistor 111 amplifies the desired signal component. When the desired signal component is amplified, a first IM3 component occurs in the first transistor 111. Also, when the first transistor 111 amplifies the desired signal component, a current of the amplified signal component and a current of the IM3 component are input to the collector of the first transistor 111 ((2) of FIG. 19). Due to the current of the amplified desired signal component and the current of the IM3 component, a voltage of the amplified desired signal component and a voltage of the IM3 component occurs at the emitter of the first transistor 111 ((3) of FIG. 19). A voltage which is actually amplified by the first transistor 111 is a voltage between the base and the emitter. Therefore, the voltage between the base and the emitter of the first transistor 111 is added to the desired signal component which is input to the base of the first transistor 111, where the phase of the voltage is reverse to that of the desired signal component. In other words, the voltage is smaller than when the desired signal component is input to the base of the first transistor 111 ((4) of FIG. 19). In this manner, the input current to the collector of the first transistor 111 is fed back as a voltage of the desired signal component to be input to the base. The second series feedback amplifier 30-2 performs a similar operation. Note that, in the series feedback amplifier, the phase of a feedback amount depends on the device connected to the emitter of the first transistor 111. A change in the phase of the feedback amount due to the device connected to the first transistor 111 will be described below.

The first series feedback amplifier 30-1 operates in a manner similar to that of the first parallel feedback amplifier 10-1. Also, the second series feedback amplifier 30-2 operates in a manner similar to that of the second parallel feedback amplifier 10-2. The reason will be described with reference to FIG. 18.

Figure 18:
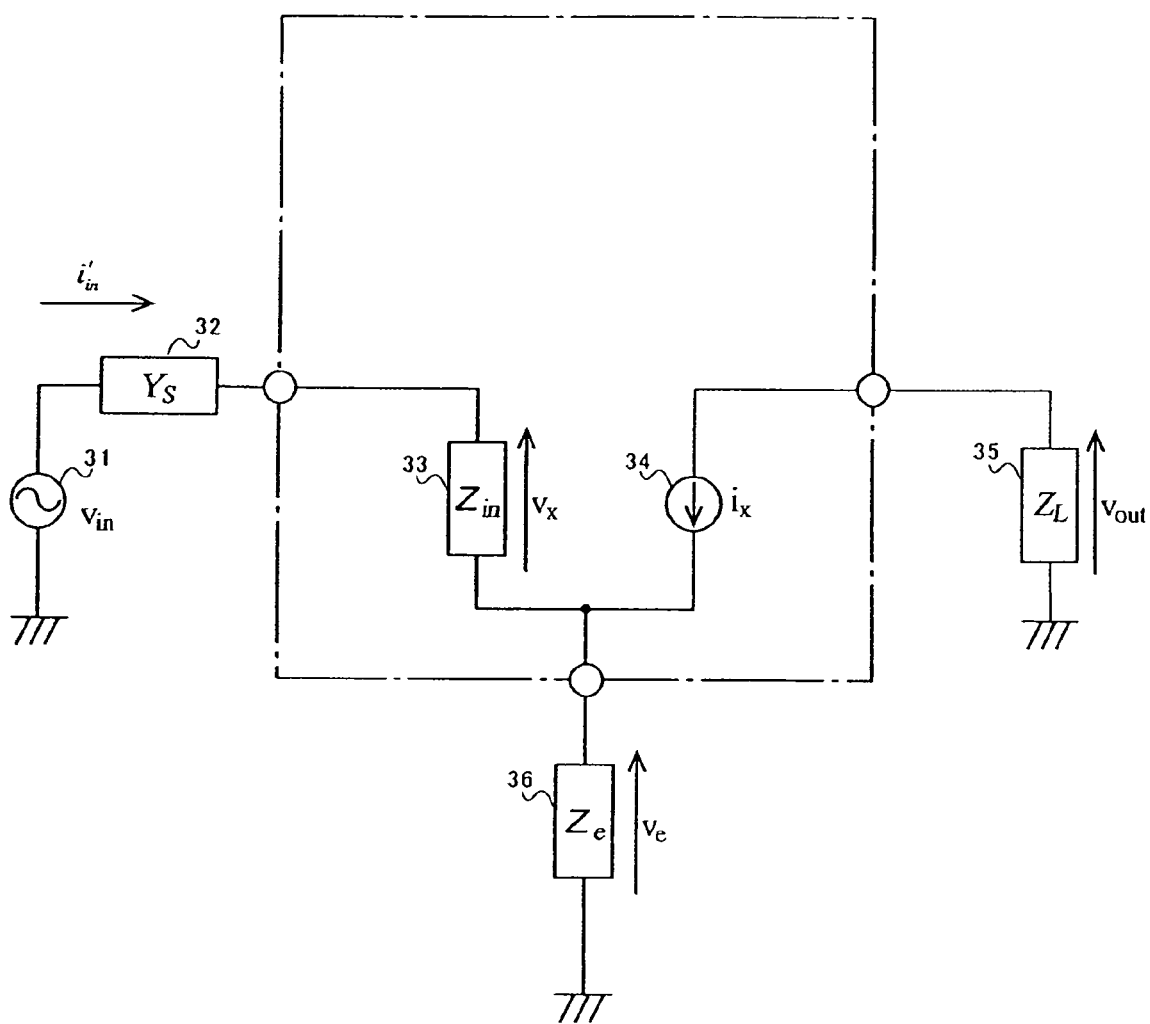
FIG. 18 is a diagram illustrating an equivalent circuit of the first series feedback amplifier 30-1.

FIG. 18 is a diagram illustrating an equivalent circuit of the first series feedback amplifier 30-1. With reference to FIG. 18, it will be described that the first series feedback amplifier 30-1 is equivalent to the first parallel feedback amplifier 10-1. The equivalent circuit of FIG. 18 comprises a signal source 31, an input impedance element 32, an internal impedance element 33, a constant current source 34, an output impedance element 35, and a series feedback impedance element 36.

One end of the input impedance element 32 is grounded via the signal source 31. One end of the output impedance element 35 is grounded. The internal impedance element 33 and the constant current source 34 are connected in cascade between the other end of the input impedance element 32 and the other end of the output impedance element 35. One end of the series feedback impedance element 36 is connected to the internal impedance element 33 and the constant current source 34. The other end of the series feedback impedance element 36 is grounded. In the equivalent circuit, a circuit having the internal impedance element 33 and the constant current source 34 corresponds to the first amplification section 101-1.

The series feedback amplifier is a voltage feedback amplifier. Therefore, input-output voltage characteristics of the series feedback amplifier are obtained. A current $i_y$ flowing through the constant current source 34 is represented by expression (28) below, taking into consideration the third-order nonlinearity of the first series feedback amplifier 30-1:

$$i_y = g_1 \cdot v_x + g_2 \cdot v_x^2 + g_3 \cdot v_x^3 \tag{28}$$

where $g_1$, $g_2$ and $g_3$ represent first-, second- and third-order transconductors, $v_x$ represents a voltage of the internal impedance element 33.

An output voltage $v_{out}$ of the first series feedback amplifier 30-1 and the current $i_y$ of the constant current source 34 satisfy a relationship represented by expression (29) according to Ohm's law:

$$v_{out} = -Z_L \cdot i_y \tag{29}$$

Also, according to Kirchhoff's law, expression (30) is satisfied:

$$v_e/Z_e = i_y + v_x/Z_{in}$$

$$v_{in} = Z_s \cdot v_x/Z_{in} + v_x + v_e \quad (30)$$

where $Z_e$ represents the impedance of the series feedback impedance element 36, $v_e$ represents a voltage (feedback voltage) applied to the series feedback impedance element 36, $Z_s$ represents the impedance of the input impedance element 32, $v_{in}$ represents an input voltage from the signal source 31, $Z_{in}$ represents the impedance of the internal impedance element 33, and $v_x$ represents a voltage applied to the internal impedance element 33.

Expressions (29) and (30) are solved for $v_x$. $v_x$ is represented by:

$$v_x = \frac{Z_{in}}{Z_{in} + Z_e + Z_s}\left(v_{in} + \frac{Z_e}{Z_L} \cdot v_{out}\right). \quad (31)$$

Expressions (28), (29) and (31) are solved for $v_{out}$. $v_{out}$ is represented by:

$$v_{out} = -Z_L \cdot \left[ g_1 \cdot \frac{Z_{in}}{Z_{in} + Z_e + Z_s}\left(v_{in} + \frac{Z_e}{Z_L} \cdot v_{out}\right) + \right.$$

$$g_2 \cdot \left\{ g_1 \cdot \frac{Z_{in}}{Z_{in} + Z_e + Z_s}\left(v_{in} + \frac{Z_e}{Z_L} \cdot v_{out}\right) \right\}^2 +$$

$$\left. g_3 \cdot \left\{ g_1 \cdot \frac{Z_{in}}{Z_{in} + Z_e + Z_s}\left(v_{in} + \frac{Z_e}{Z_L} \cdot v_{out}\right) \right\}^3 \right]. \quad (32)$$

Assuming that $\eta = Z_{in}/(Z_{in}+Z_L+Z_s)$, $\alpha_1 = -Z_L \cdot g_1$, $\alpha_2 = -Z_L \cdot g_2$, $\alpha_3 = -Z_L \cdot g_3$, and $\beta = \eta \cdot Z_e/(\eta \cdot Z_e + Z_L)$, expression (32) is represented by:

$$v_{out} = \alpha_1 \cdot (\eta \cdot v_{in} + \beta/1 - \beta \cdot v_{out}) + \alpha_2 \cdot (\eta \cdot v_{in} + \beta/1 - \beta \cdot v_{out})^2 + \alpha_3 \cdot (\eta \cdot v_{in} + \beta/1 - \beta \cdot v_{out})^3 \quad (33).$$

Ohm's law is applied to expression (33). The resultant expression (33) becomes substantially the same as expression (7) described in the first embodiment. Hereinafter, the nonlinear closed-loop transfer function of the first series feedback amplifier 30-1 can be obtained in a manner simiar to that of the first embodiment. Therefore, the first series feedback amplifier 30-1 inherently performs the same operation as that of the first parallel feedback amplifier 10-1. The second series feedback amplifier 30-2 also inherently performs an operation similar to that of the second parallel feedback amplifier 10-2. Therefore, the detailed description of the operation of the series feedback amplifier is similar to that of the parallel feedback amplifier of the first embodiment and will not be explained.

An operation of the first series feedback amplifier 30-1 will be described. When an input desired signal is input to the first series feedback amplifier 30-1, the first amplification section 101-1 amplifies the input desired signal. Note that, when the first amplification section 101-1 amplifies the desired signal, a first IM3 component occurs in the first amplification section 101-1.

The fifth inductor 321 is connected to the emitter of the first transistor 111. Therefore, a feedback amount β(ω) from the first series feedback section 302-1 has an advanced phase, and the phase of an output current of the first transistor 111 is a delayed phase. As a result, the difference between the phase of the amplified desired signal component and the phase of the first IM3 component is output as a value different from 180°.

Figure 20A:
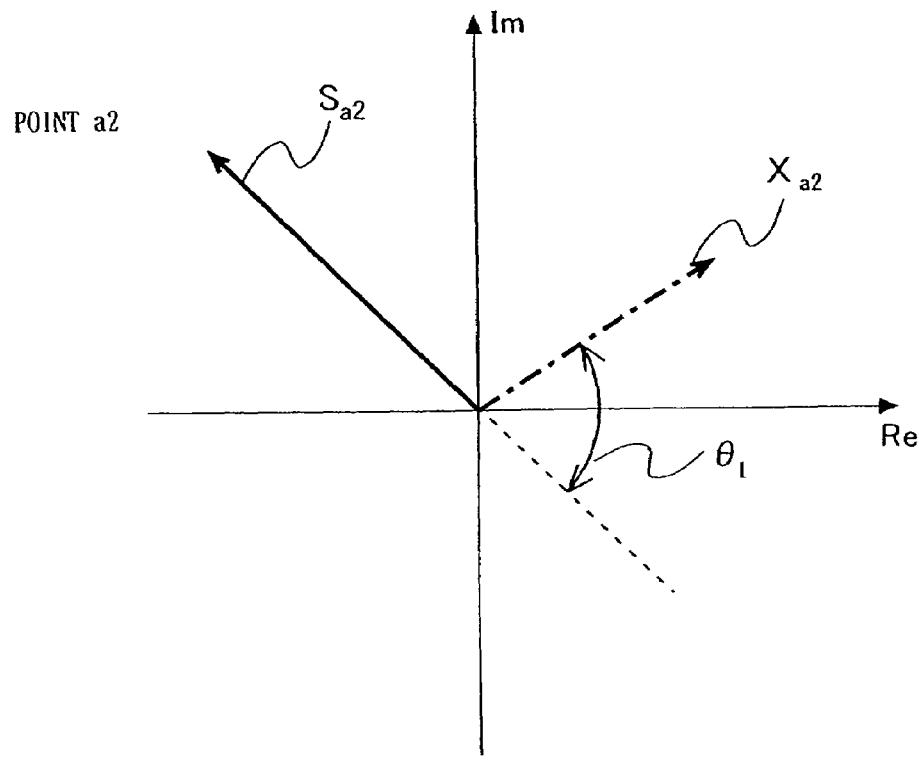
FIG. 20A is a schematic diagram illustrating a relationship between the phase of an amplified desired signal component and the phase of the first IM3 component, at the point a2 of FIG. 17.

FIG. 20A is a schematic diagram illustrating a relationship between the phase of a desired signal component amplified in the first amplification section 101-1 at the point a2 of FIG. 17 (hereinafter referred to as a desired signal component $S_{a2}$) and the phase of the first IM3 component at the point a2 (hereinafter referred to as a first IM3 component $X_{a2}$). Note that, in FIG. 20A, the input desired signal is placed on the real axis. In this manner, in order for the first series feedback section 302-1 to operate in a manner similar to that of the first parallel feedback section 102-1, the difference between the phase of the desired signal component $S_{a2}$ output from the first series feedback amplifier 30-1 and the phase of the first IM3 component $X_{a2}$ is represented by expression (21) as with the first parallel feedback amplifier 10-1.

Figure 20B:
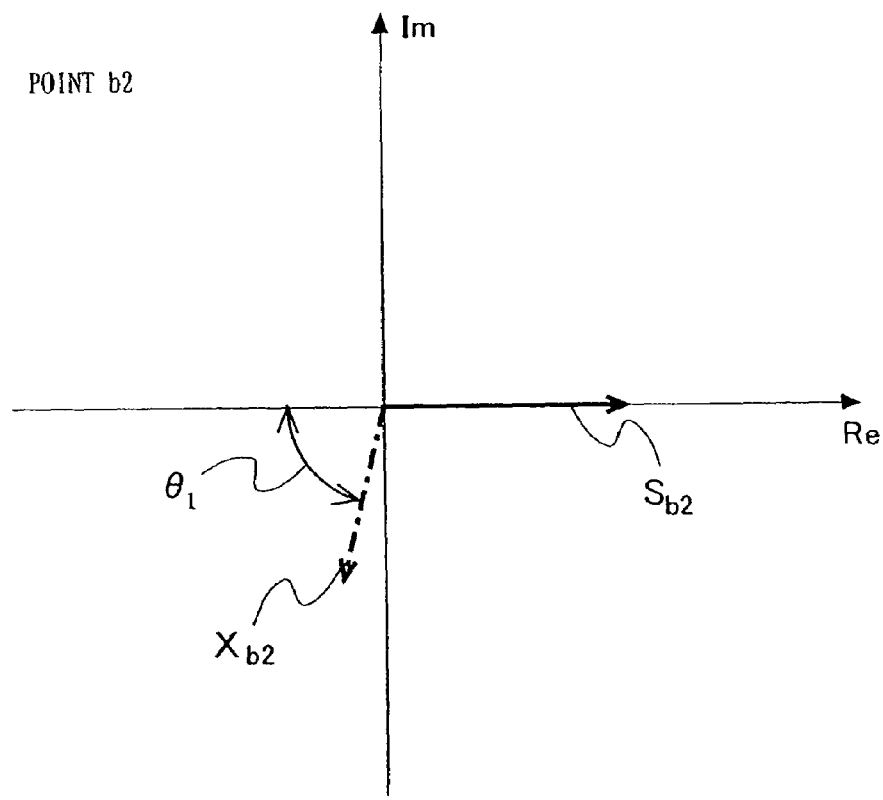
FIG. 20B is a schematic diagram illustrating a relationship between the phase of the desired signal component input to the second series feedback amplifier 30-2 and the phase of the first IM3 component input to the second series feedback amplifier 30-2, at a point b2 of FIG. 17.

FIG. 20B is a schematic diagram illustrating a relationship between the phase of the desired signal component input to the second series feedback amplifier 30-2 at a point b2 of FIG. 17 (hereinafter referred to as a desired signal component $S_{b2}$) and the phase of the first IM3 component input to the second series feedback amplifier 30-2 at the point b2 (hereinafter referred to as a first IM3 component $X_{b2}$). FIGS. 20A and 20B illustrate the same relationship between the phase of the desired signal component and the phase of the first IM3 component. However, FIG. 20B is different from FIG. 20A in that the desired signal component amplified in the first amplification section 101-1 is placed on the real axis.

An operation of the second series feedback amplifier 30-2 will be described. The second amplification section 101-2 amplifies the desired signal component $S_{b2}$ and the first IM3 component $X_{b2}$ while maintaining the phase relationship of FIG. 20B. When the second amplification section 101-2 amplifies the desired signal component $S_{b2}$, a second IM3 component occurs in the second amplification section 101-2.

Figure 20C:
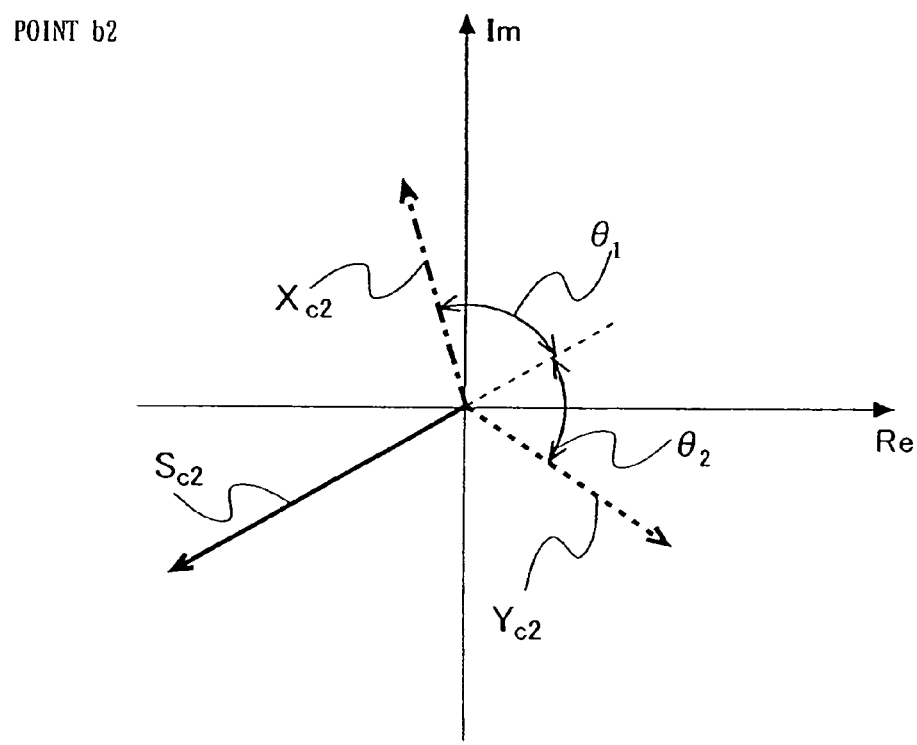
FIG. 20C is a schematic diagram illustrating a relationship between the phase of the amplified desired signal component, the phase of the amplified first IM3 component, and the phase of the second IM3 component, at a point c2 of FIG. 17.

When the fourteenth capacitor 322 and the sixth resistor 323 are connected in parallel to the emitter of a second transistor 211 as in the second series feedback section 302-2, a feedback amount β(ω) of the second series feedback section 302-2 is a delayed phase. Therefore, the phase of an output current of the second series feedback amplifier 30-2 has an advanced phase. FIG. 20C is a schematic diagram illustrating a relationship between the phase of the amplified desired signal component $S_{b2}$ at the point c2 of FIG. 17 (hereinafter referred to as a desired signal component $S_{c2}$), the phase of the amplified first IM3 component $X_{b2}$ at the point c2 (hereinafter referred to as a first IM3 component $X_{c2}$), the phase of the second IM3 component at the point c2 (hereinafter referred to as a second IM3 component $Y_{c2}$). Note that, in FIG. 20C, the desired signal component $S_{b2}$ is placed on the real axis. In this manner, the second series feedback section 302-2 operates in the same manner as that of the second parallel feedback section 102-2. Therefore, the difference between the phase of the desired signal component of the second series feedback amplifier 30-2 and the phase of the second IM3 component can be represented by expression (22).

Figure 20D:
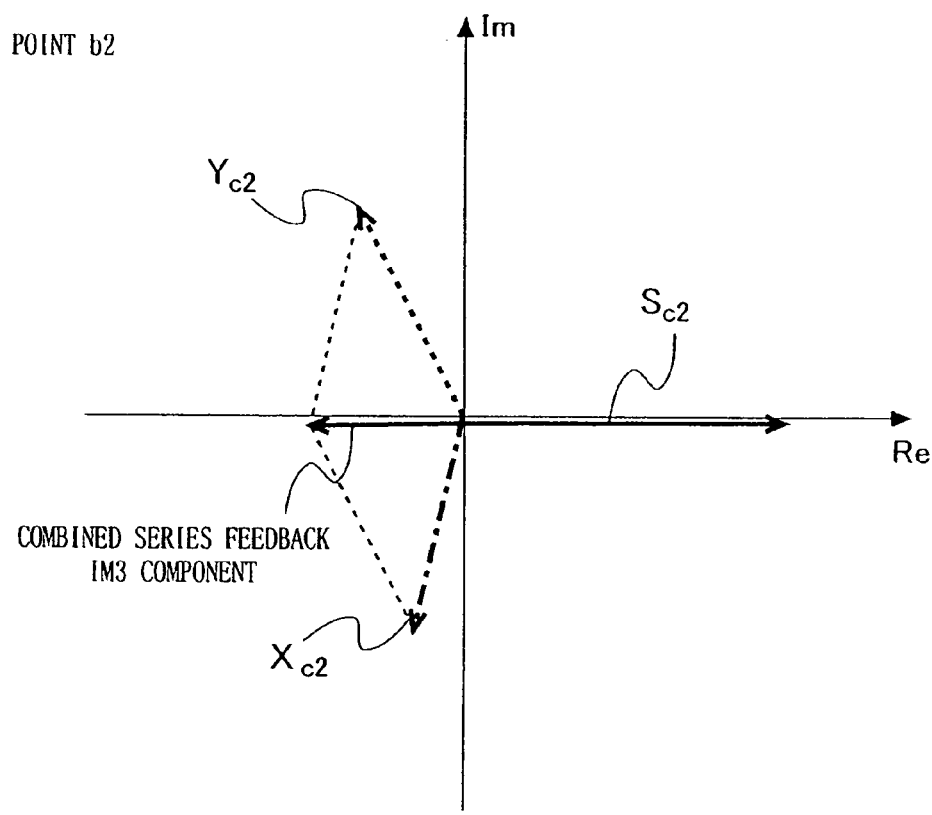
FIG. 20D is a diagram illustrating a relationship between the phase of the desired signal component, the phase of the first IM3 component, and the phase of the second IM3 component, at the output terminal 72.
Figure 21:
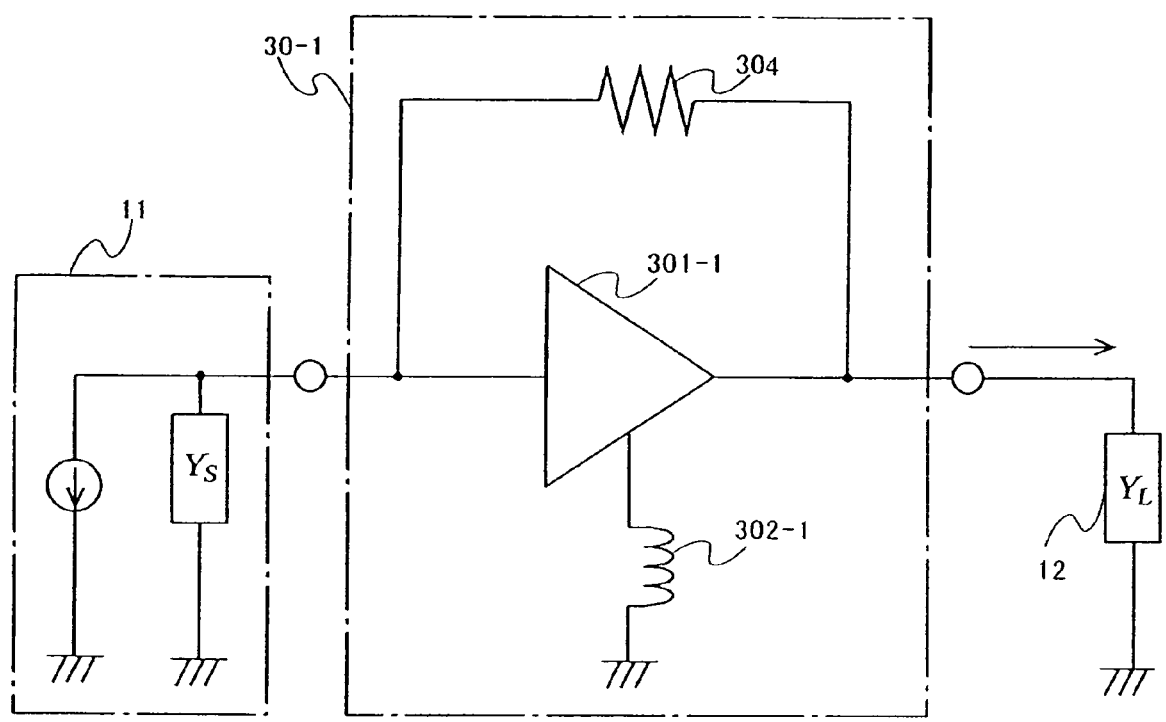
FIG. 21 is a diagram illustrating a first series feedback amplification section 30-1 comprising a parallel feedback section using a resistor.

FIG. 20D is a diagram illustrating a relationship between the phase of the desired signal component $Sc_2$, the phase of the first IM3 component $X_{c2}$, and the phase of the second IM3 component $Y_{c2}$, at the output terminal 72. Conditions under which the first IM3 component $X_{c2}$ and the second IM3 component $Y_{c2}$ are combined and IM3 is suppressed are the same as those of the first embodiment and will not be explained.

A change in gain of the first series feedback amplifier 30-1 and the second series feedback amplifier 30-2 will be described.

In the first series feedback amplifier 30-1, when the first series feedback section 302-1 has a inductive reactance component, the gain of the first series feedback amplifier 30-1 decreases with an increase in the frequency component of a frequency band used. This is because the feedback amount increases with an increase in the frequency. In the second series feedback amplifier 30-2, when the second series feedback section 302-2 has an capacitive reactance component, the gain of the second series feedback amplifier 30-2 increases with an increase in the frequency component of a frequency band used. This is because the feedback amount decreases with an increase in the frequency.

In the multistage amplifying device 5, when the gain decrease rate of the first series feedback amplifier 30-1 is equivalent to the gain increase rate of the second series feedback amplifier 30-2, both the flatness of the gain and the suppression of IM3 can be obtained. The definition of the equivalence of the gain increase rate and the gain decrease rate has been described above and will not be explained.

As described above, in the multistage amplifying device 5 of the fifth embodiment of the present invention, the first series feedback amplifier 30-1 changes the difference between the phase of the desired signal component to be amplified and the phase of the first IM3 component, and outputs the resultant components. Also, the second series feedback amplifier 30-2 changes the difference between the desired signal component to be amplified and the phase of the second IM3 component. Thereby, the multistage amplifying device 5 can cause the first IM3 component and the second IM3 component to cancel out to suppress IM3. Each amplifier of the multistage amplifying device is a feedback-type amplifier. Therefore, the IM3 component occurring in each amplification section can be suppressed as in typical feedback-type amplifier circuits and, in addition, the IM3 components cancel out as described above. Therefore, IM3 is further suppressed. Further, white noise occurring in each amplification section of the multistage amplifying device 5 is negligible compared to the IM3 components occurring due to the amplified desired signal and the desired signal. Furthermore, white noise occurring in each amplification section can be suppressed by negative feedback. Therefore, the multistage amplifying device 5 does not require a device for removing white noise, and therefore, can be constructed with a simple structure.

In the fifth embodiment, the multistage amplifying device includes two amplifiers connected in series, each of which includes a series feedback section. Alternatively, the multistage amplifying device may include three or more amplifiers connected in cascade, each of which includes a series feedback section. Also in this case, IM3 can be suppressed. The multistage amplifying device which includes three or more amplifiers connected in cascade, each of which includes a series feedback section, has an operation similar to that of the multistage amplifying device 2 of the second embodiment and will not be explained.

Also in the fifth embodiment, the second series feedback section 302-2 of the second series feedback amplifier 30-2 includes a resistor. Therefore, the second series feedback amplifier 30-2 has noise and maximum output power characteristics poorer than that of the first series feedback amplifier 30-1. Therefore, when the multistage amplifying device 5 is used in a reception circuit, it is preferable that the first stage of the multistage amplifying device 5 is the first series feedback amplifier 30-1 and the second stage thereof is the second series feedback amplifier 30-2. On the other hand, when the multistage amplifying device 5 is used in a transmission circuit, it is preferable that the first stage of the multistage amplifying device 5 is the second series feedback amplifier 30-2 and the second stage thereof is the first series feedback amplifier 30-1. Note that, when the multistage amplifying device of the fifth embodiment which has three or more stages connected in cascade is used in a reception circuit, it is preferable that the last stage amplifier is the second series feedback amplifier 30-2. Also, when the multistage amplifying device of the fifth embodiment which has three or more stages connected in cascade is used in a signal transmission circuit, it is preferable that the first amplifier is the second series feedback amplifier 30-2. Thereby, deterioration of the noise and maximum output power characteristics of the multistage amplifying device can be prevented.

Sixth Embodiment

Figure 22:
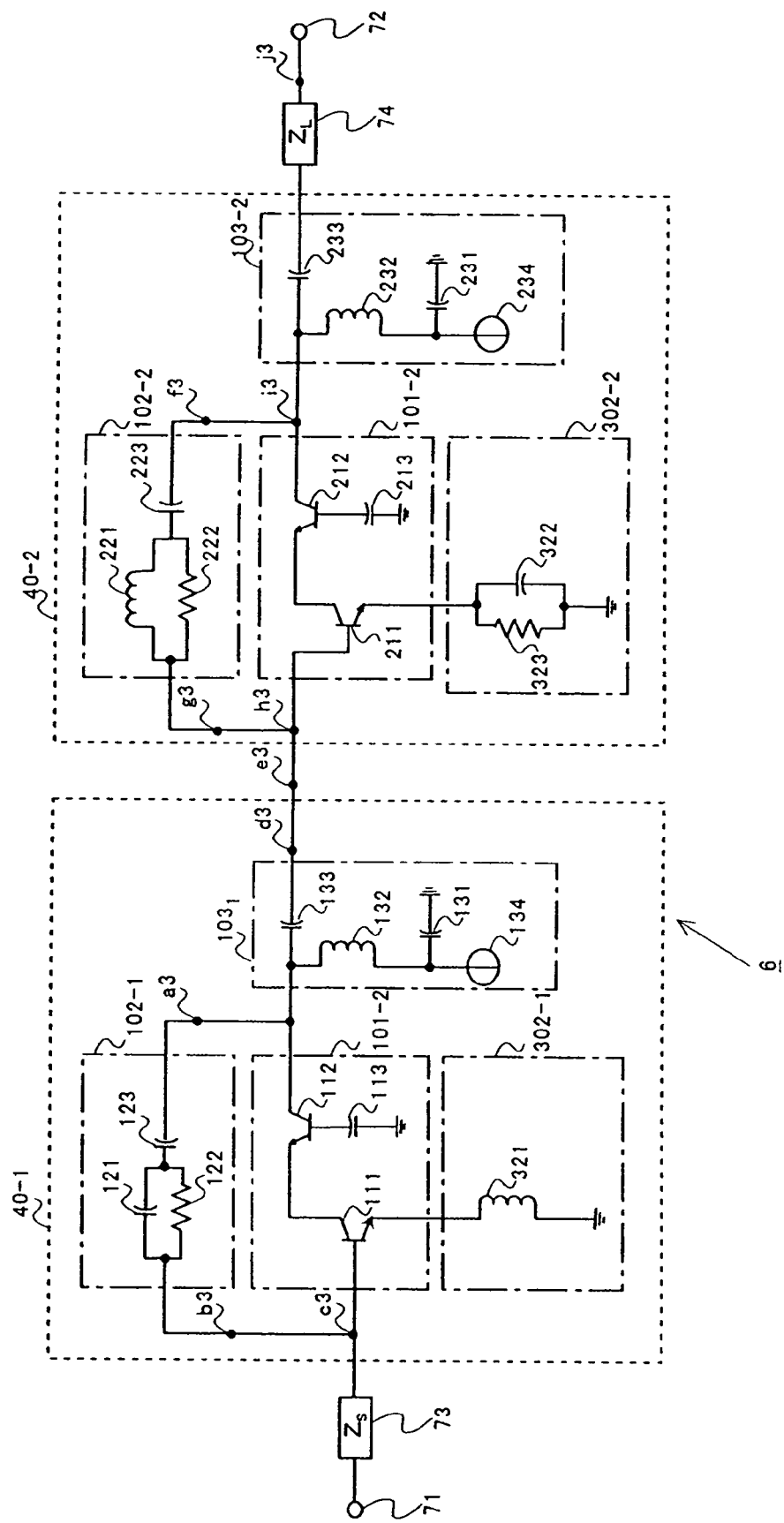
FIG. 22 is a circuit diagram illustrating an exemplary structure of a multistage amplifying device according to a sixth embodiment of the present invention.

FIG. 22 is a circuit diagram illustrating an exemplary structure of a multistage amplifying device 6 according to a sixth embodiment of the present invention. The multistage amplifying device 6 of FIG. 22 comprises an internal terminal 71, an input impedance matching circuit 73, a first combined feedback amplifier 40-1 and a second combined feedback amplifier 40-2, an output impedance matching circuit 74, and an output terminal 72. The first combined feedback amplifier 40-1 includes a first amplification section 101-1, a first parallel feedback section 102-1, a first matching circuit 103-1, and a first series feedback section 302-1. The second combined feedback amplifier 40-2 includes a second amplification section 101-2, a second parallel feedback section 102-2, a second matching circuit 103-2, and a second series feedback section 302-2.

As illustrated in FIG. 22, in the multistage amplifying device 6, the two amplifiers, each of which includes a parallel feedback section and a series feedback section, are connected in cascade. The first combined feedback amplifier 40-1 is obtained by adding the first series feedback section 302-1 to the first parallel feedback amplifier 10-1. The second combined feedback amplifier 40-2 is obtained by adding the second series feedback section 302-2 to the second parallel feedback amplifier 10-2. Note that function blocks and circuit elements of the multistage amplifying device 6 of FIG. 22 which are the same as those included in the multistage amplifying device 1 of FIG. 6 or the multistage amplifying device 5 of FIG. 17 are referenced with the same reference numerals and will not be explained. Although FIG. 22 illustrates an exemplary structure of the multistage amplifying device 6, the structure of the multistage amplifying device 6 is not limited to the structure of FIG. 22 and may be other structures.

An outline of an operation of the multistage amplifying device 6 will be described.

An operation of the first combined feedback amplifier 40-1 will be described. The first amplification section 101-1 amplifies an input desired signal component. When the first amplification section 101-1 amplifies the desired signal component, a first IM3 component occurs. The first series feedback section 302-1 changes the phase of the desired signal component to be amplified and the phase of the first IM3 component. Therefore, when the amplified desired signal component and the first IM3 component are output from the first amplification section 101-1, the phase difference therebetween is 180°.

Figure 23A:
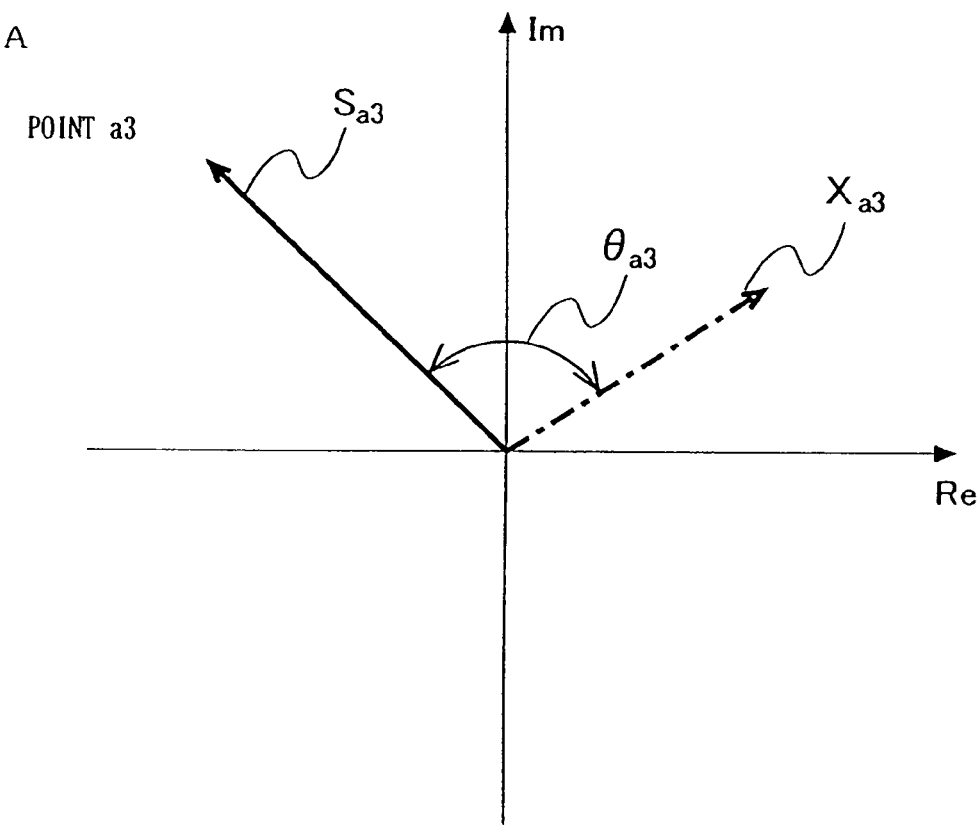
FIG. 23A is a schematic diagram illustrating a relationship between the phase of the amplified desired signal component and the phase of the first IM3 component, at the point a3 of FIG. 22.

FIG. 23A is a schematic diagram illustrating a relationship between the phase of the amplified desired signal component at the point a3 of FIG. 22 (hereinafter referred to as a desired signal component $S_{a3}$) and the phase of the first IM3 component at the point a3 (hereinafter referred to as a first IM3 component $X_{a3}$). Note that, in FIG. 23A, the input desired signal component is placed on the real axis. As illustrated in FIG. 23A, the difference between the phase of the desired signal component $S_{a3}$ and the phase of the first IM3 component $X_{a3}$ at the point a3 is represented by $\theta_{a3}$. In this case, $\theta_{a3}+\theta_1=180°$.

The first parallel feedback section 102-1 changes the phase of the desired signal component $S_{a3}$ and the phase of the first IM3 component $X_{a3}$ while mainintaining the phase relationship of FIG. 23A.

Figure 23B:
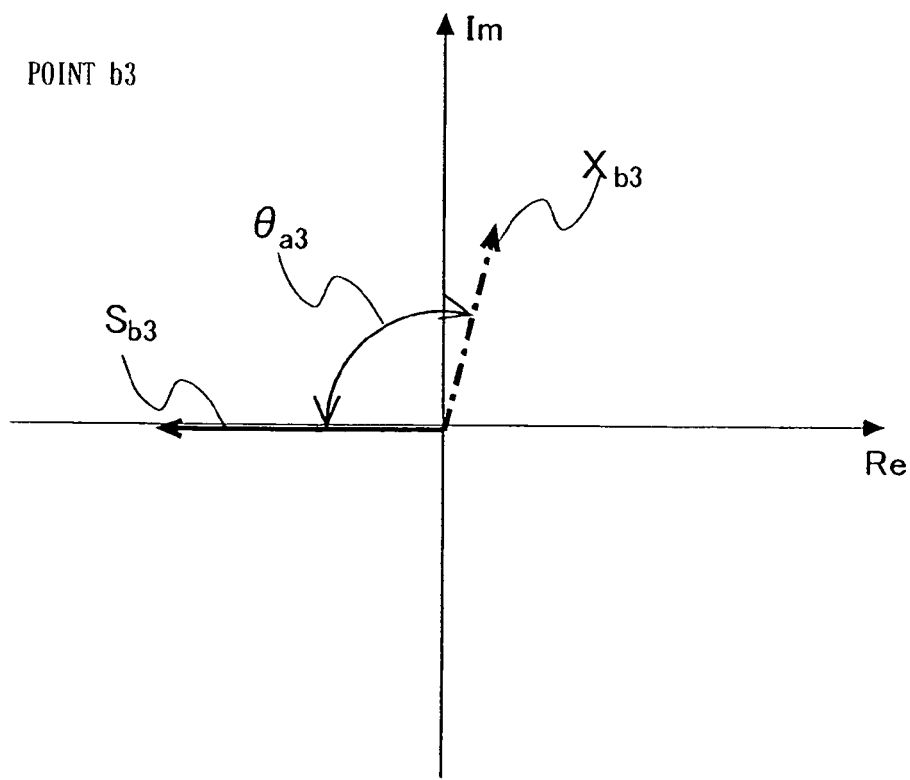
FIG. 23B is a schematic diagram illustrating a relationship between the phase of the desired signal component whose phase has been changed and the phase of the first IM3 component whose phase has been changed, at a point b3 of FIG. 22.

FIG. 23B is a schematic diagram illustrating a relationship between the phase of the desired signal component $S_{a3}$ whose phase has been changed at a point b3 of FIG. 22 (hereinafter referred to as a desired signal component $S_{b3}$) and the phase of the first IM3 component $X_{a3}$ whose phase has been changed at the point b3 (hereinafter referred to as a first IM3 component $X_{b3}$). Note, in FIG. 23B, the input desired signal component is place on the real axis. As illustrated in FIG. 23B, the first parallel feedback section 102-1 changes, using its reactance component, the phase of the desired signal component $S_{b3}$ and the phase of the input desired signal component so that the phase difference therebetween is 180°.

In this case, the difference between the phase of the desired signal component $S_{b3}$ and the phase of the first IM3 component $X_{b3}$ is not changed from $\theta_{a3}$.

Figure 23C:
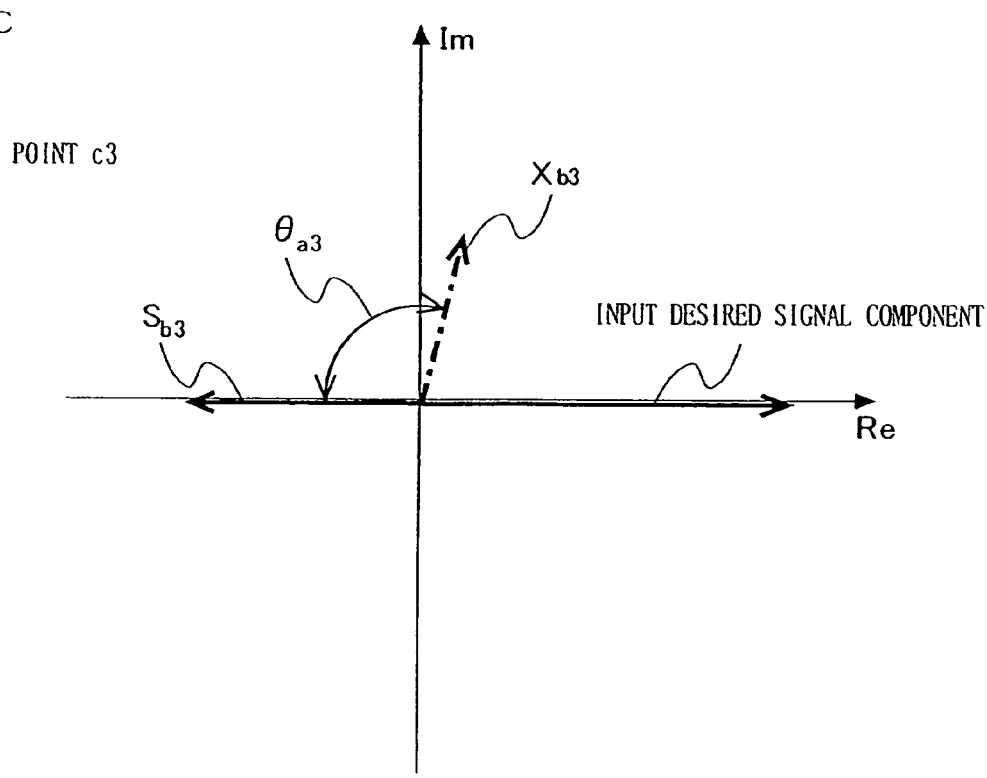
FIG. 23C is a schematic diagram illustrating a relationship between the phase of the desired signal component of the input signal, the phase of the desired signal component, and the phase of the first IM3 component, at a point c3 of FIG. 22.

FIG. 23C is a schematic diagram illustrating a relationship between the phase of the desired signal component of the input signal, the phase of the desired signal component $S_{b3}$, and the phase of the first IM3 component $X_{b3}$, at a point c3 of FIG. 22. As illustrated in FIG. 23C, at the point c3, the input desired signal component, the desired signal component $S_{b3}$ and first IM3 component $X_{b3}$ are input. The difference between the phase of the input desired signal component and the phase of the desired signal component $S_{b3}$ is 180°. At the point c3, the input desired signal component and the desired signal component $S_{b3}$ are combined. However, the relationship between the phase of the desired signal component and the phase of the first IM3 component will be hereinafter described, assuming that the input desired signal component and the desired signal component $S_{b3}$ are not combined at the point c3.

The first amplification section 101-1 amplifies each of the input desired signal component, the desired signal component $S_{b3}$, and the first IM3 component $X_{b3}$. When the first amplification section 101-1 amplifies the input desired signal, a first IM3 component newly occurs. The first series feedback section 302-1 changes the phase of the input desired signal component, the phase of the desired signal component $S_{b3}$, and the phase of the first IM3 component $X_{b3}$.

Figure 23D:
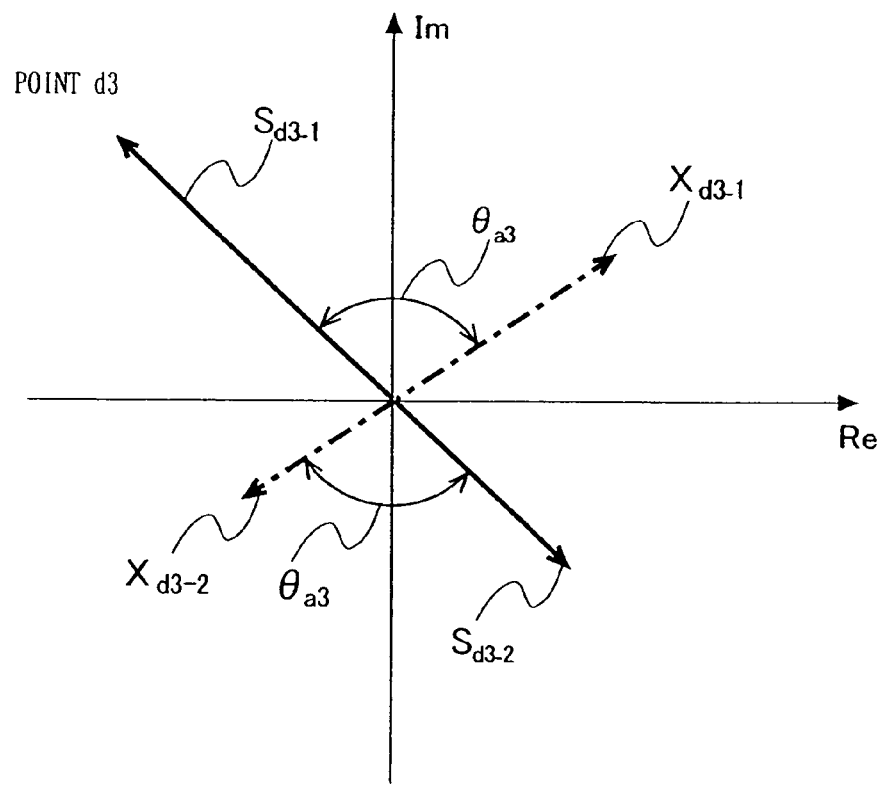
FIG. 23D is a schematic diagram illustrating a relationship between the phase of the amplified input desired signal component, the phase of the amplified desired signal component, the phase of the amplified first IM3 component, and the phase of the newly occurring first IM3 component (hereinafter referred to as a first IM3 component $X_{d3-1}$), at a point d3 of FIG. 22.

FIG. 23D is a schematic diagram illustrating a relationship between the phase of the amplified input desired signal component at a point d3 of FIG. 22 (hereinafter referred to as a desired signal component $S_{d3-1}$), the phase of the amplified desired signal component $S_{b3}$ at the point d3 (hereinafter referred to as a desired signal component $S_{d3-2}$), the phase of the amplified first IM3 component $X_3$ at the point d3 (hereinafter referred to as a first IM3 component $X_{d3-2}$), and the phase of the newly occurring first IM3 component at the point d3 (hereinafter referred to as a first IM3 component $X_{d3-1}$). As illustrated in FIG. 23D, the difference between the phase of the desired signal component $S_{d3-2}$ and the phase of the first IM3 component $X_{d3-2}$ is not changed from $\theta_{a3}$. The difference between the phase of the desired signal component $S_{d3-1}$ and the phase of the first IM3 component $X_{d3-1}$ becomes $\theta_{a3}$. In other words, the relationship between the phase of the desired signal component $S_{d3-1}$ and the phase of the first IM3 component $X_{d3-1}$ is similar to that of FIG. 23A.

Figure 23E:
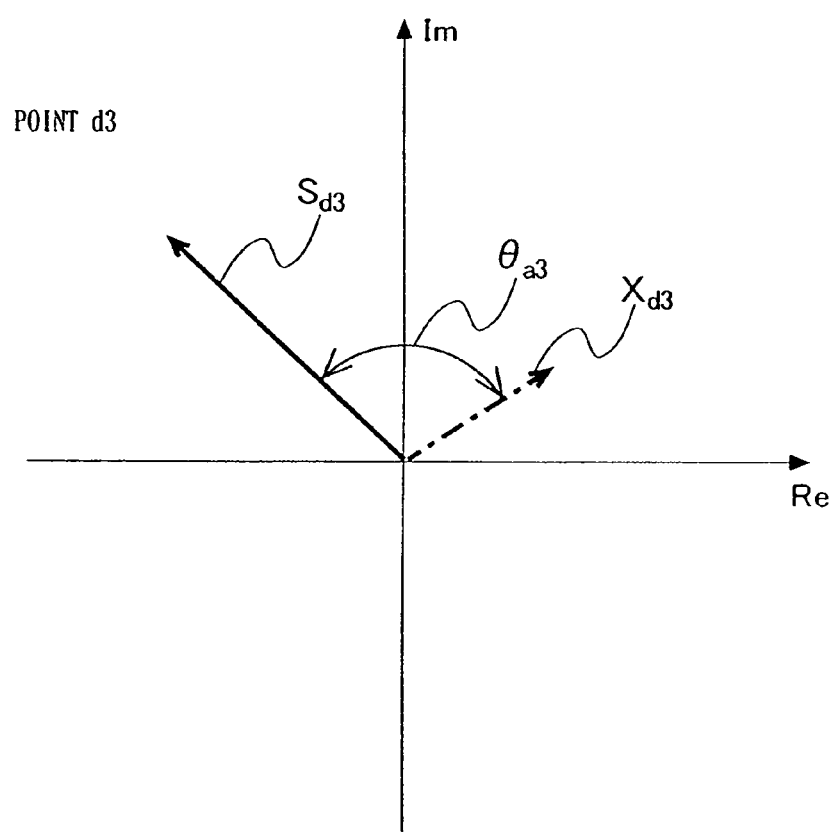
FIG. 23E is a schematic diagram illustrating a result of combination of the desired signal component and the desired signal component and combination of the first IM3 component and the first IM3 component, at the point d3 of FIG. 22.

FIG. 23E is a schematic diagram illustrating a result of combination of the desired signal component $S_{d3-1}$ and the desired signal component $S_{d3-2}$ and combination of the first IM3 component $X_{d3-1}$ and the first IM3 component $X_{d3-2}$, at the point d3 of FIG. 22. As illustrated in FIG. 23E, at the point d3, the desired signal component $S_{d3-1}$ and the desired signal component $S_{d3-2}$ are combined to generate a desired signal component $S_{d3}$. The first IM3 component $X_{d3-1}$ and the first IM3 component $X_{d3-2}$ are combined to generate a first IM3 component $X_{d3}$. In this manner, the first combined feedback amplifier 40-1 suppresses the first IM3-component. Note that, in FIG. 23E, the input desired signal component is placed on the real axis.

In the first combined feedback amplifier 40-1, the phase of the desired signal component $S_{a3}$ may be delayed by 90° or more due to the first series feedback section 302-1. The phase of the desired signal component $S_{a3}$ is increasingly delayed with an increase in the inductance of the fifth inductor 321. However, the first parallel feedback section 102-1 changes, using its reactance component, the phase of the desired signal component $S_{b3}$ and the phase of the input desired signal component so that the phase difference therebetween becomes 180°. Thereby, the first combined feedback amplifier 40-1 can achieve negative feedback without an influence of the phase of the desired signal component $S_{a2}$ changed by the first series feedback section 302-1, resulting in a stable operation.

Figure 24A:
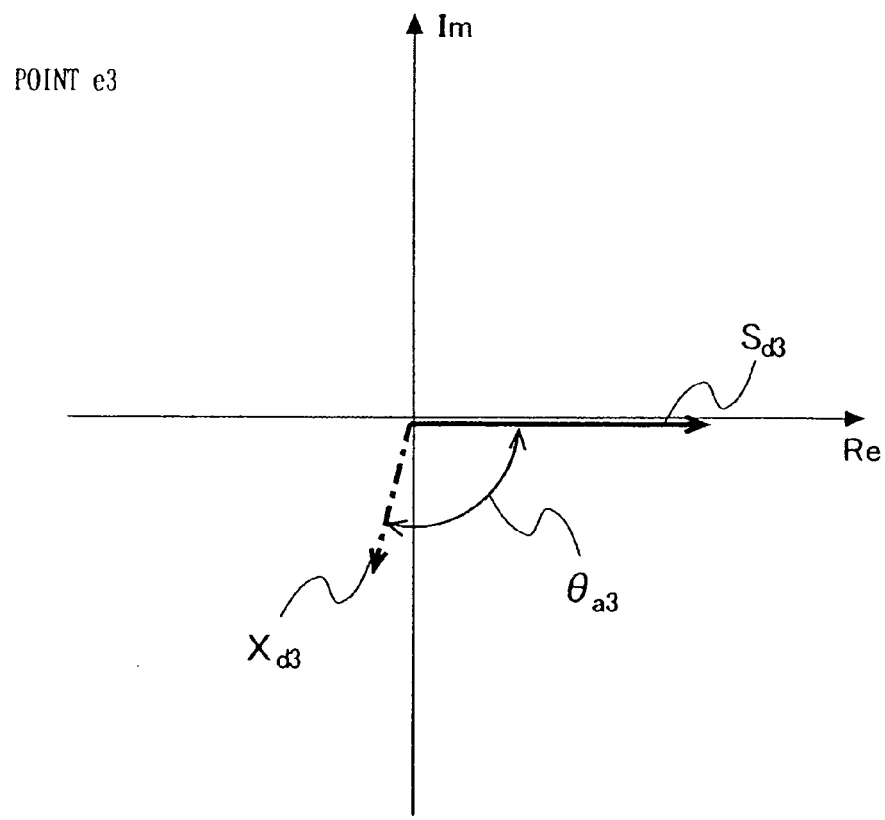
FIG. 24A is a schematic diagram illustrating a relationship between the phases of the desired signal component and the first IM3 component which are input to the second combined feedback amplifier 40-2.

Next, an operation of the second combined feedback amplifier 40-2 will be described. FIG. 24A is a schematic diagram illustrating a relationship between the phases of the desired signal component $S_{d3}$ and the first IM3 component $X_{d3}$ which are input to the second combined feedback amplifier 40-2. In FIG. 24A, the desired signal component $S_{a2}$ is placed on the real axis.

The second amplification section 101-2 amplifies the desired signal component $S_{d3}$ and the first IM3 component $X_{d3}$. When the second amplification section 101-2 amplifies the desired signal component $S_{d3}$, a second IM3 component occurs. The second series feedback section 302-2 changes the phase of the amplified desired signal component $S_{d3}$, the phase of the amplified first IM3 component $X_{d3}$, and the second IM3 component. In this case, the difference between the phase of the amplified desired signal component $S_{d3}$ and the phase of the amplified first IM3 component $X_{d3}$ is not changed. The difference between the phase of the amplified desired signal component $S_{d3}$ and the phase of the second IM3 component is output as a value different from 180°.

Figure 24B:
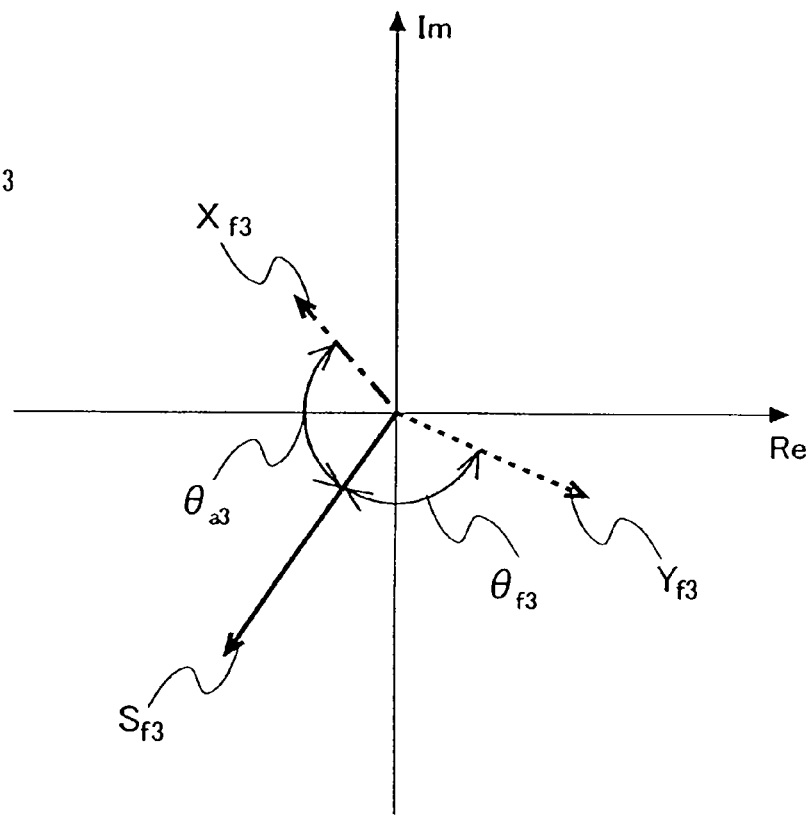
FIG. 24B is a schematic diagram illustrating a relationship between the phase of the amplified desired signal component, the phase of the amplified first IM3 component, and the phase of the newly occurring second IM3 component, at a point f3 of FIG. 22.

FIG. 24B is a schematic diagram illustrating a relationship between the phase of the amplified desired signal component $S_{d3}$ at a point f3 of FIG. 22 (hereinafter referred to as a desired signal component $S_{f3}$), the phase of the amplified first IM3 component $X_{d3}$ at the point f3 (hereinafter referred to as a first IM3 component $X_{f3}$), and the phase of the newly occurring second IM3 component at the point f3 (hereinafter referred to as a second IM3 component $Y_{f3}$). As illustrated in FIG. 24B, at the point f3, the difference between the phase of the desired signal component $S_{f3}$ and the phase of the first IM3 component $X_{f3}$ is not changed from the phase difference $\theta_{a3}$. The difference between the phase of the desired signal component $S_{f3}$ and the phase of the second IM3 component $Y_{f3}$ is $\theta_{f3}$. In this case, $\theta_{f3}+\theta_2=180°$. Note that, in FIG. 24B, the desired signal component $S_{d3}$ is placed on the real axis.

The second parallel feedback section 102-2 changes the phase of the desired signal component $S_{f3}$, the phase of the first IM3 component $X_{f3}$, and the phase of the second IM3 component $Y_{f3}$ while maintaining the phase relationship of FIG. 24B.

Figure 24C:
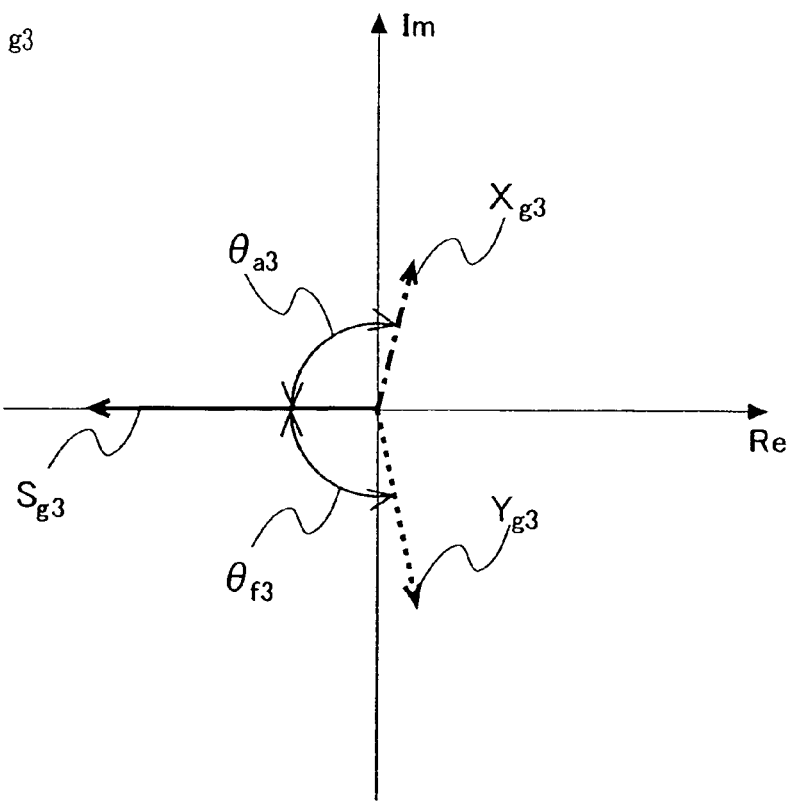
FIG. 24C is a schematic diagram illustrating a relationship between the phase of the desired signal component, the phase of the first IM3 component whose phase has been changed, and the phase of the second IM3 component whose phase has been changed, at a point g3 of FIG. 22.

FIG. 24C is a schematic diagram illustrating a relationship between the phase of the desired signal component $S_{f3}$ whose phase has been changed at a point g3 of FIG. 22 (hereinafter referred to as a desired signal component $S_{g3}$), the phase of the first IM3 component $X_{f3}$ whose phase has been changed at the point g3 (hereinafter referred to as a first IM3 component $X_{g3}$), and the phase of the second IM3 component $Y_3$ whose phase has been changed at the point g3 (hereinafter referred to as a second IM3 component $Y_{g3}$). Note that, in FIG. 24C, the desired signal component $S_{d3}$ is placed on the real axis. As illustrated in FIG. 24C, the second parallel feedback section 102-2 changes the phase of the desired signal component $S_{g3}$ and the phase of the desired signal component $S_{d3}$ so that the phase difference therebetween becomes 180°.

In the second combined feedback amplifier 40-2, the phase of the desired signal component $S_{f3}$ may be advanced by 90° or more due to the second series feedback section 302-2. As the capacitance of the fourteenth capacitor 322 is increased, the advance of the phase of the desired signal component $S_{f3}$ increases. However, the second parallel feedback section 102-2 changes, using its reactance component, the phase of the desired signal component $S_{g3}$ and the phase of the desired signal component $S_{d3}$ so that the phase difference therebetween becomes 180°. Thereby, the second combined feedback amplifier 40-2 can achieve negative feedback without an influence of the phase of the desired signal component $X_{f3}$ changed by the second series feedback section 302-2, resulting in a stable operation.

Figure 24D:
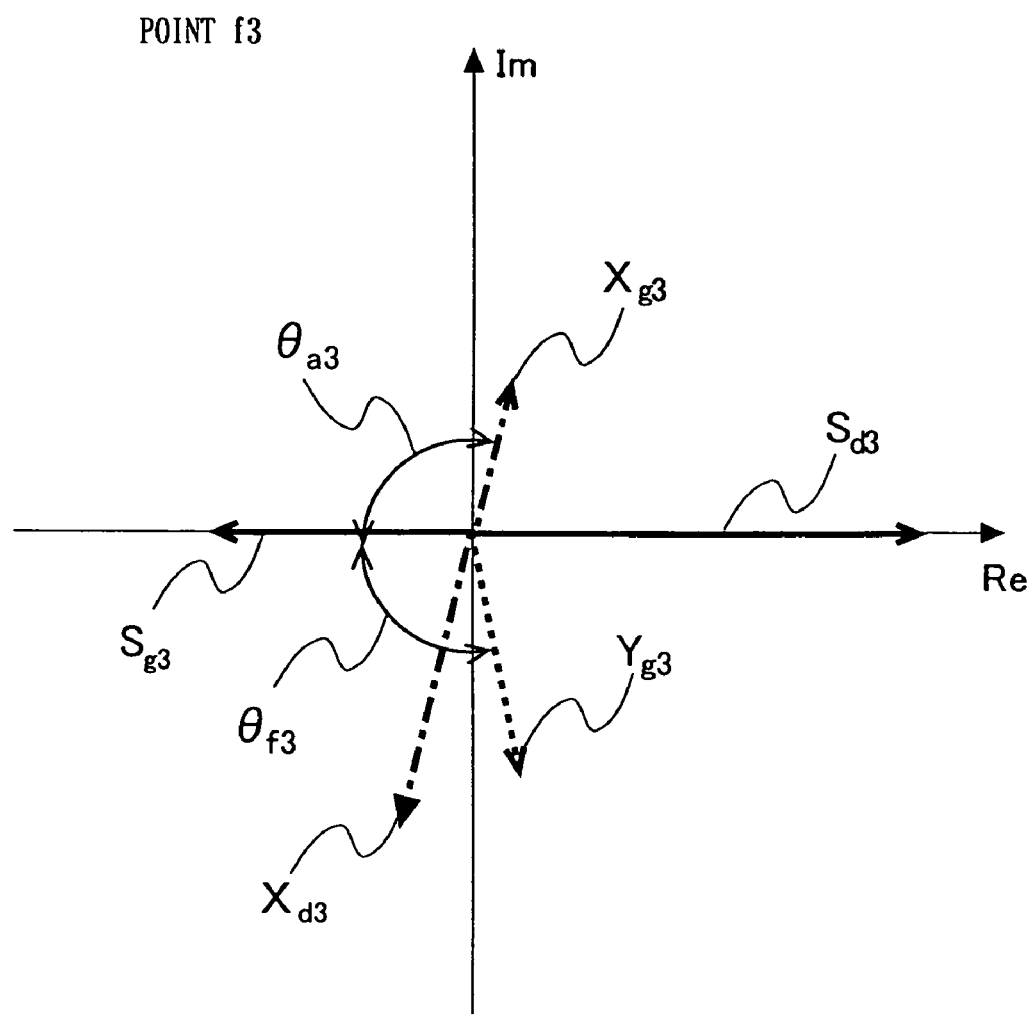
FIG. 24D is a schematic diagram illustrating a relationship between the phases of the desired signal component, the first IM3 component, and the second IM3 component which are input at a point h3 of FIG. 22.

FIG. 24D is a schematic diagram illustrating a relationship between the phases of the desired signal component $S_{d3}$, the first IM3 component $X_{d3}$, the desired signal component $S_{g3}$, the first IM3 component $X_{g3}$, and the second IM3 component $Y_{g3}$ which are input at a point h3 of FIG. 22. As illustrated in FIG. 24D, the difference between the phase of the desired signal component $S_{d3}$ and the phase of the desired signal component $S_{g3}$ is 180°, and the difference between the phase of the first IM3 component $X_{d3}$ and the phase of the first IM3 component $X_{g3}$ is 180°.

At the point h3, the desired signal component $S_{d3}$ and the desired signal component $S_{g3}$ are combined. Also, the first IM3 component $X_{d3}$ and the first IM3 component $X_{g3}$ are combined. However, for the description of the relationship between the phase of the desired signal component, the phase of the first IM3 component, and the phase of the second IM3 component, it is assumed that the desired signal and the first IM3 component are not combined at the point h3.

The second amplification section 101-2 amplifies each of the desired signal component $S_{d3}$, the desired signal component $S_{g3}$, the first IM3 component $X_{d3}$, the first IM3 component $X_{g3}$, and the second IM3 component $Y_{g3}$. When the second amplification section 101-2 amplifies the desired signal component $S_{d3}$, a second IM3 component newly occurs. The second series feedback section 302-2 changes the phase of each of the desired signal component $S_{d3}$, the desired signal component $S_{g3}$, the first IM3 component $X_{d3}$, the first IM3 component $X_{g3}$, and the second IM3 component $Y_{g3}$.

Figure 24E:
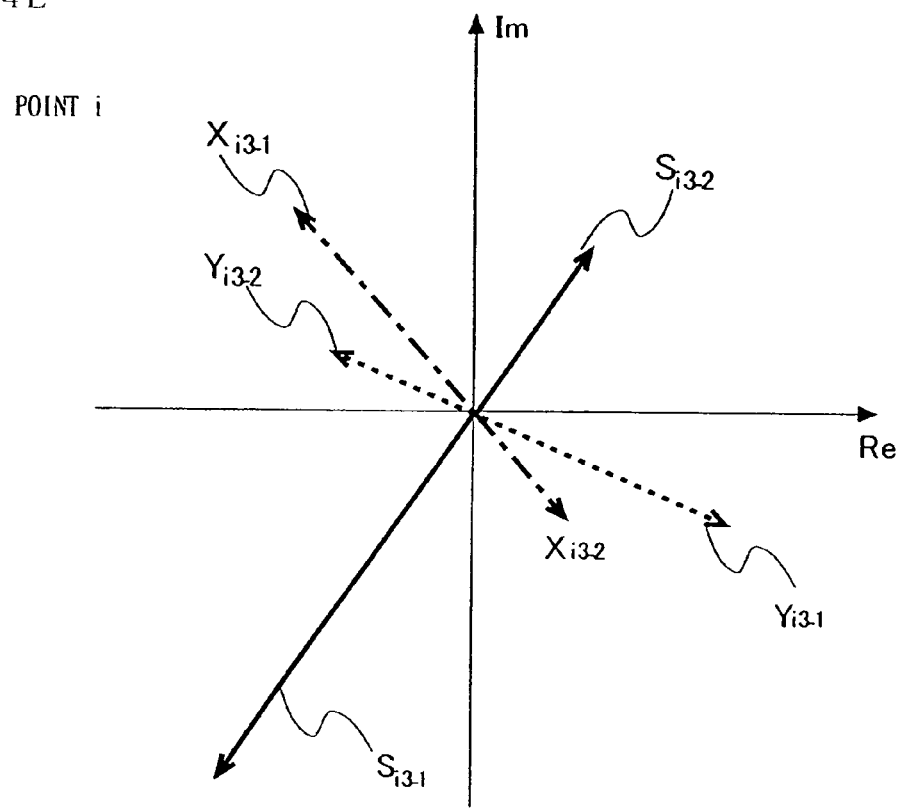
FIG. 24E is a schematic diagram illustrating a relationship between the phase of the amplified desired signal component, the phase of the amplified first IM3 component, the phase of the amplified second IM3 component, and the phase of the newly occurring second IM3 component, at a point i3 of FIG. 22.

FIG. 24E is a schematic diagram illustrating a relationship between the phase of the amplified desired signal component $S_{d3}$ at a point i3 of FIG. 22 (hereinafter referred to as a desired signal component $S_{i3-1}$), the phase of the amplified desired signal component $S_{g3}$ at point i3 (hereinafter referred to as a desired signal component $S_{i3-2}$), the phase of the amplified first IM3 component $X_{d3}$ point i3 (hereinafter referred to as a first IM3 component $X_{i3-1}$), the phase of the amplified first IM3 component $X_{g3}$ at the point i3 (hereinafter referred to as a first IM3 component $X_{i3-2}$), the phase of the amplified second IM3 component $Y_{g3}$ at the point i3 (hereinafter referred to as a second IM3 component $Y_{i3-2}$), and the phase of the newly occurring second IM3 component at the point i3 (hereinafter referred to as a second IM3 component $Y_{i3-1}$). Note that, in FIG. 24E, the desired signal component $S_{d3}$ is placed on the real axis.

As illustrated in FIG. 24E, the difference between the phase of the desired signal component $S_{i3-1}$ and the phase of the first IM3 component $X_{i3-1}$ is not changed from $\theta_{a3}$. Similarly, the difference between the phase of the desired signal component $S_{i3-2}$ and the phase of the first IM3 component $X_{i3-2}$ is not changed from $\theta_{a3}$. The difference between the phase of the desired signal component $S_{i3-2}$ and the phase of the second IM3 component $Y_{i3-2}$ is not changed from $\theta_{f3}$. The difference between the phase of the desired signal component $S_{i3-1}$ and the second IM3 component $Y_{i3-2}$ is $\theta_{f3}$. Thus, the relationship between the phase of the desired signal component $S_{i3-1}$ and the phase of the second IM3 component $Y_{i3-1}$ is similar to that of FIG. 24B.

Figure 24F:
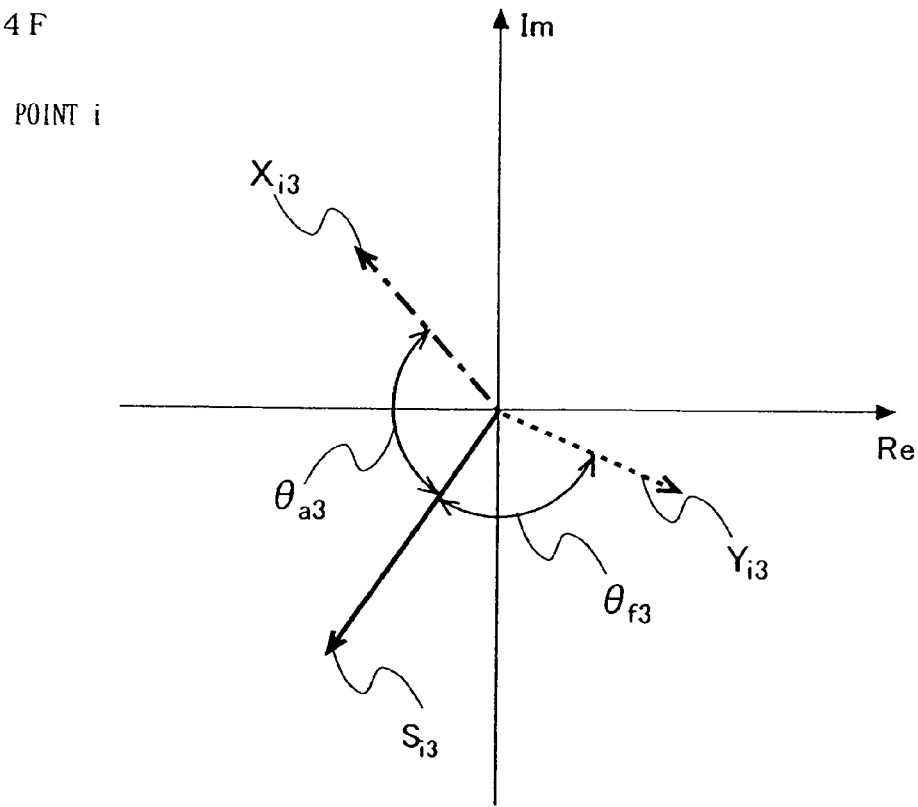
FIG. 24F is a schematic diagram illustrating a state that the desired signal component, the first IM3 component and the second IM3 component of FIG. 24E are combined.

FIG. 24F is a schematic diagram illustrating a state that the desired signal component, the first IM3 component and the second IM3 component of FIG. 24E are combined. The phase of the desired signal component $S_{i3-1}$ is reverse to the phase of the desired signal component $S_{i3-2}$. Therefore, the desired signal component $S_{i3-1}$ and the desired signal component $S_{i3-2}$ cancel out to generate a desired signal component $S_{i3}$. The phase of the first IM3 component $X_{i3-1}$ is reverse to the phase of the first IM3 component $X_{i3-2}$. Therefore, the first IM3 component $X_{i3-1}$ and the first IM3 component $X_{i3-2}$ cancel out to generate a first IM3 component $X_{i3}$. The phase of the second IM3 component $Y_{i3-1}$ is reverese to the phase of the second IM3 component $Y_{i3-2}$. Therefore, the second IM3 component $Y_{i3-1}$ and the second IM3 component $Y_{i3-2}$ cancel out to generate a second IM3 component $Y_{i3}$.

Figure 24G:
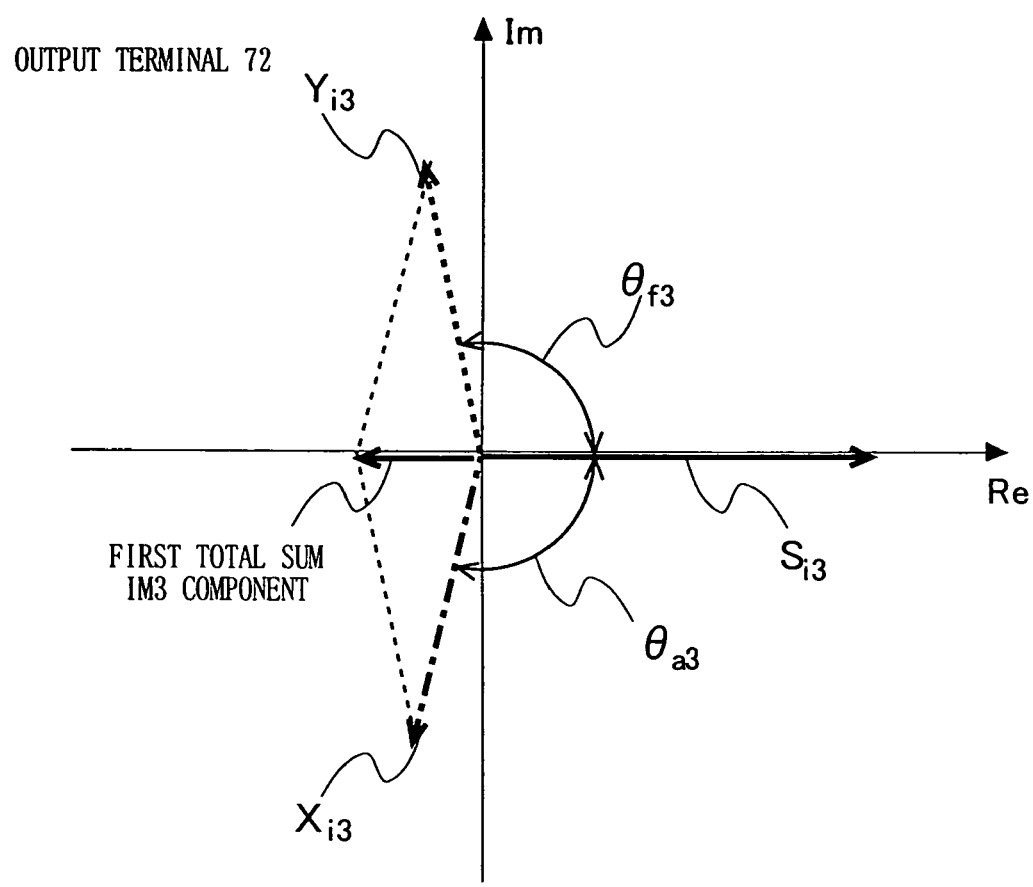
FIG. 24G is a schematic diagram illustrating how the first IM3 component and the second IM3 component cancel out.

FIG. 24G is a schematic diagram illustrating how the first IM3 component $X_{i3}$ and the second IM3 component $Y_{i3}$ cancel out. The first IM3 component $X_{i3}$ and the second IM3 component $Y_{i3}$ are combined to generate a first total sum IM3 component. As a result, IM3 occurring in each amplifier of the multistage amplifying device 6 is suppressed.

Changes in the phase of the desired signal component to be amplified and the phase of the first IM3 component in each amplification section have been described in the first embodiment and the sixth embodiment and will not be explained.

Changes in the gains of the first combined feedback amplifier 40-1 and the second combined feedback amplifier 40-2 will be described.

The gain of the first combined feedback amplifier 40-1 decreases with an increase in the frequency component of a desired frequency band. This is because the first parallel feedback section 102-1 has a capacitive reactance component and the first series feedback section 302-1 has an inductive reactance component, so that the feedback amount increases with an increase in the frequency. Therefore, the feedback section of the first combined feedback amplifier 40-1 functions as a feedback amount increasing feedback section which includes a capacitive parallel feedback section which has a capacitive reactance component and performs parallel feedback and an inductive series feedback section which has an inductive reactance component and perform series feedback. Note that the gain decrease rate is preferably smaller than or equal to −12 dB/OCT (40 dB/dec).

The gain of the second combined feedback amplifier 40-2 decreasesincreases with an increase in the frequency component of a desired frequency band. This is because the second parallel feedback section 102-2 has an inductive reactance component and the second series feedback section 302-2 has a capacitive reactance component, so that the feedback amount decreases with an increase in the frequency. Therefore, the feedback section of the second combined feedback amplifier 40-2 functions as a feedback amount decreasing feedback section which includes an inductive parallel feedback section which has an inductive reactance component and performs parallel feedback and a capacitive series feedback section which has a capacitive reactance component and perform series feedback. Note that the gain increase rate is preferably smaller than or equal to 12 dB/OCT (40 dB/dec).

In the multistage amplifying device 6, when the gain decrease rate of the first combined feedback amplifier 40-1 is equivalent the gain increase rate of the second combined feedback amplifier 40-2, a desired gain can be obtained. The definition of the equivalence of the gain increase rate and the gain decrease rate has been described above and will not be explained.

As described above, in the multistage amplifying device 6 of the sixth embodiment of the present invention, the combined feedback amplifier changes the phase of the signal to be amplified, and changes the phase of the desired signal component to be fed back and the phase of the input desired signal component so that the phase difference therebetween becomes 180°. Thereby, the multistage amplifying device 6 can set the difference between the phase of the desired signal component and the phase of the IM3 component more easily than the multistage amplifying device 1 and the multistage amplifying device 5, and can provide a stable amplifier.

Note that, in the sixth embodiment, a multistage amplifying device in which two combined feedback amplifier including a parallel feedback section and a series feedback section are connected in cascade have been described. Alternatively, a multistage amplifying device in which three or more combined feedback amplifiers are connected in cascade can suppress IM3.

Also in the sixth embodiment, it has been described that the first parallel feedback section 102-1 and the second parallel feedback section 102-2 cause the difference between the phase of the desired signal component input to each amplifier and the phase of the desired signal component to be fed back to be 180°. The present invention is not limited to this. The first parallel feedback section 102-1 and the second parallel feedback section 102-2 may cause the difference between the phase of the desired signal component input to each amplifier and the phase of the desired signal component to be fed back to be nearly 180°, thereby achieving a similar effect of the phase of the desired signal component input to each amplifier and the phase of the desired signal component to be fed back.

Seventh Embodiment

Figure 25:
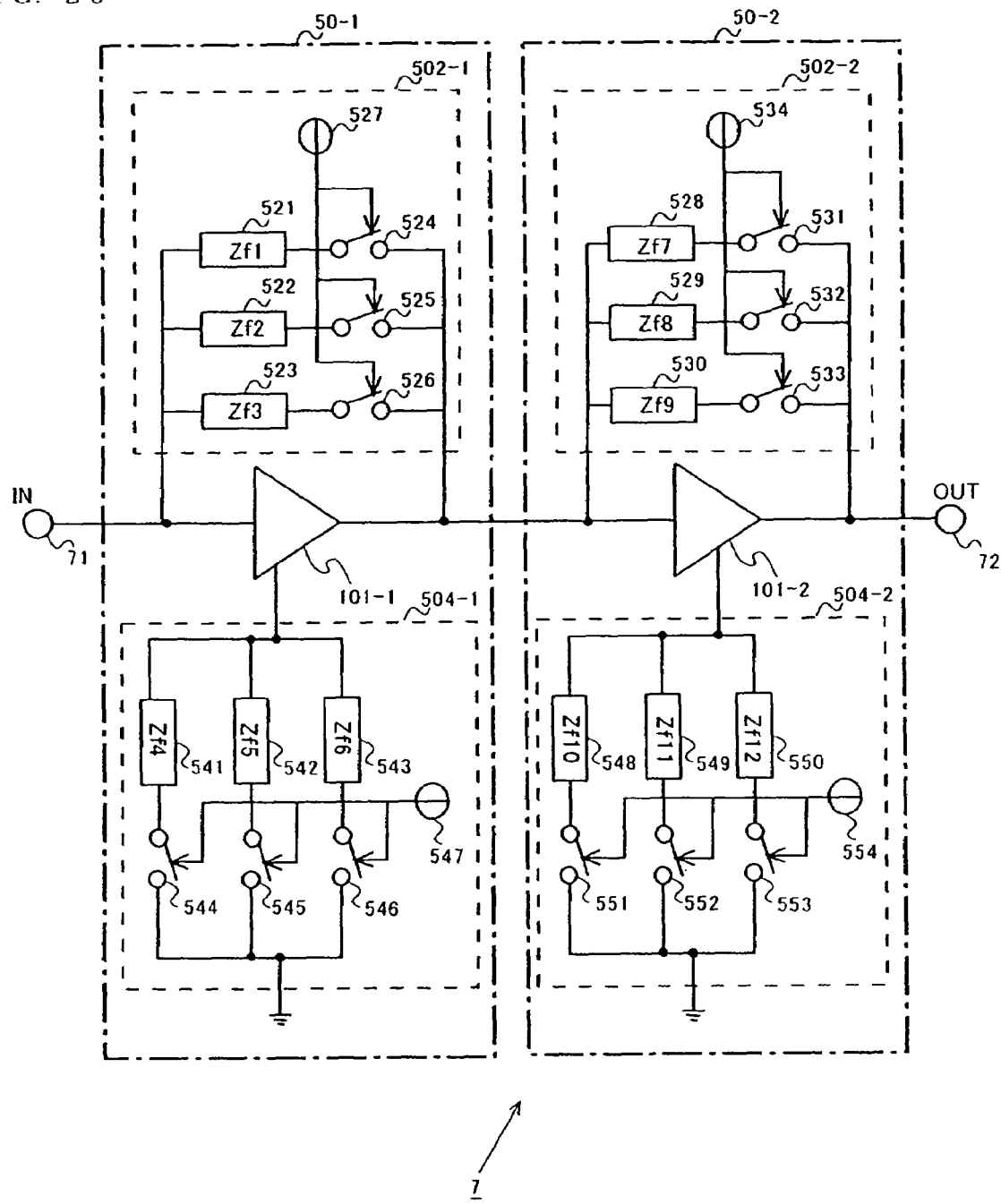
FIG. 25 is a diagram illustrating a structure of a multistage amplifying device according to a seventh embodiment of the present invention.

FIG. 25 is a diagram illustrating a structure of a multistage amplifying device 7 according to a seventh embodiment of the present invention. The multistage amplifying device 7 of FIG. 25 comprises an internal terminal 71, an input impedance matching circuit 73, an output impedance matching circuit 74, an output terminal 72, a first combined feedback amplifier 50-1, and a second combined feedback amplifier 50-2.

In the multistage amplifying device 7 of FIG. 25, the first combined feedback amplifier 50-1 includes a first reactance control parallel feedback section 502-1 and a first reactance control series feedback section 504-1 instead of the first parallel feedback section 102-1 and the first series feedback section 302-1 of the first combined feedback amplifier 40-1. The second combined feedback amplifier 50-2 includes a second reactance control parallel feedback section 502-2 and a second reactance control series feedback section 504-2 instead of the second parallel feedback section 102-2 and the second series feedback section 302-2 of the second combined feedback amplifier 40-2. Hereinafter, an operation of the multistage amplifying device 7 will be described, especially about elements different from those of the multistage amplifying device 6.

The first combined feedback amplifier 50-1 includes a first amplification section 101-1, the first reactance control parallel feedback section 502-1, and the first reactance control series feedback section 504-1. The first reactance control parallel feedback section 502-1 has a first reactance circuit 521, a second reactance circuit 522, a third reactance circuit 523, a first switching element 524, a second switching element 525, a third switching element 526, and a first control signal internal terminal 527. The first reactance control series feedback section 504-1 has a fourth reactance circuit 541, a fifth reactance circuit 542, a sixth reactance circuit 543, a fourth switching element 544, a fifth switching element 545, a sixth switching element 546, and a second control signal internal terminal 547.

The second combined feedback amplifier 50-2 includes a second amplification section 101-2, the second reactance control parallel feedback section 502-2, and the second reactance control series feedback section 504-2. The second reactance control parallel feedback section 502-2 has a the seventh reactance circuit 528, an eighth reactance circuit 529, a ninth reactance circuit 530, a seventh switching element 531, an eighth switching element 532, a ninth switching element 533, and a third control signal internal terminal 534. The second reactance control series feedback section 504-2 includes a tenth reactance circuit 548, an eleventh reactance circuit 549, a twelfth reactance circuit 550, a tenth switching element 551, an eleventh switching element 552, a twelfth switching element 553, and a fourth control signal internal terminal 554.

The first reactance control parallel feedback section 502-1 receives a first control signal through the first control signal internal terminal 527. The first control signal is a signal which is input, depending on the frequency band or the level of the input desired signal. The first reactance control parallel feedback section 502-1 switches ON/OFF the first switching element 524, the second switching element 525, and the third switching element 526, depending on the first control signal. Thereby, the reactance of the first reactance control parallel feedback section 502-1 is changed, so that change amounts of the phases of the desired signal component and the first IM3 component can be controlled.

The first reactance control series feedback section 504-1 receives a second control signal through the second control signal internal terminal 547. The second control signal is a signal which is input, depending on the frequency band or the level of the input desired signal. The first reactance control series feedback section 504-1 switches ON/OFF the fourth switching element 544, the fifth switching element 545, and the sixth switching element 546, depending on the first control signal. Thereby, the reactance of the first reactance control series feedback section 504-1 is changed, so that change amounts of the phases of the desired signal component and the first IM3 component can be controlled.

The second reactance control parallel feedback section 502-2 receives a third control signal through the third control signal internal terminal 534. The third control signal is a signal which is input, depending on the frequency band or the level of the input desired signal. The second reactance control parallel feedback section 502-2 switches ON/OFF the seventh switching element 531, the eighth switching element 532, and the ninth switching element 533, depending on the first control signal. Thereby, the reactance component of the second reactance control parallel feedback section 502-2 is changed, so that change amounts of the phases of the desired signal component, the first IM3 component and the second IM3 component can be controlled.

The second reactance control series feedback section 504-2 receives a fourth control signal through the fourth control signal internal terminal 554. The fourth control signal is a signal which is input, depending on the frequency band or the level of the input desired signal. The second reactance control series feedback section 504-2 switches ON/OFF the tenth switching element 551, the eleventh switching element 552, and the twelfth switching element 553, depending on the fourth control signal. Thereby, the reactance of the second reactance control series feedback section 504-2 is changed, so that change amounts of the phases of the desired signal component and the first IM3 component can be controlled.

In this manner, the multistage amplifying device 7 of the seventh embodiment uses the switches to switch the reactance of the parallel feedback section and the series feedback section of the combined feedback amplifier. Thereby, the reactance of each feedback section can be controlled, depending on the frequency band and the level of the input desired signal. Therefore, an amplifier circuit which has a wide band and a wide dynamic range and can suppress IM3 can be achieved.

Although the number of reactance circuits included in each feedback section is three in the seventh embodiment, the number of reactance circuits may be any number other than three. A single control signal internal terminal may be used to control the switches of all of the feedback sections.

In the multistage amplifying device 7 of the seventh embodiment, two combined feedback amplifiers are connected in cascade. Alternatively, the multistage amplifying device 7 may be composed of three or more combined feedback amplifiers.

Eighth Embodiment

Figure 26:
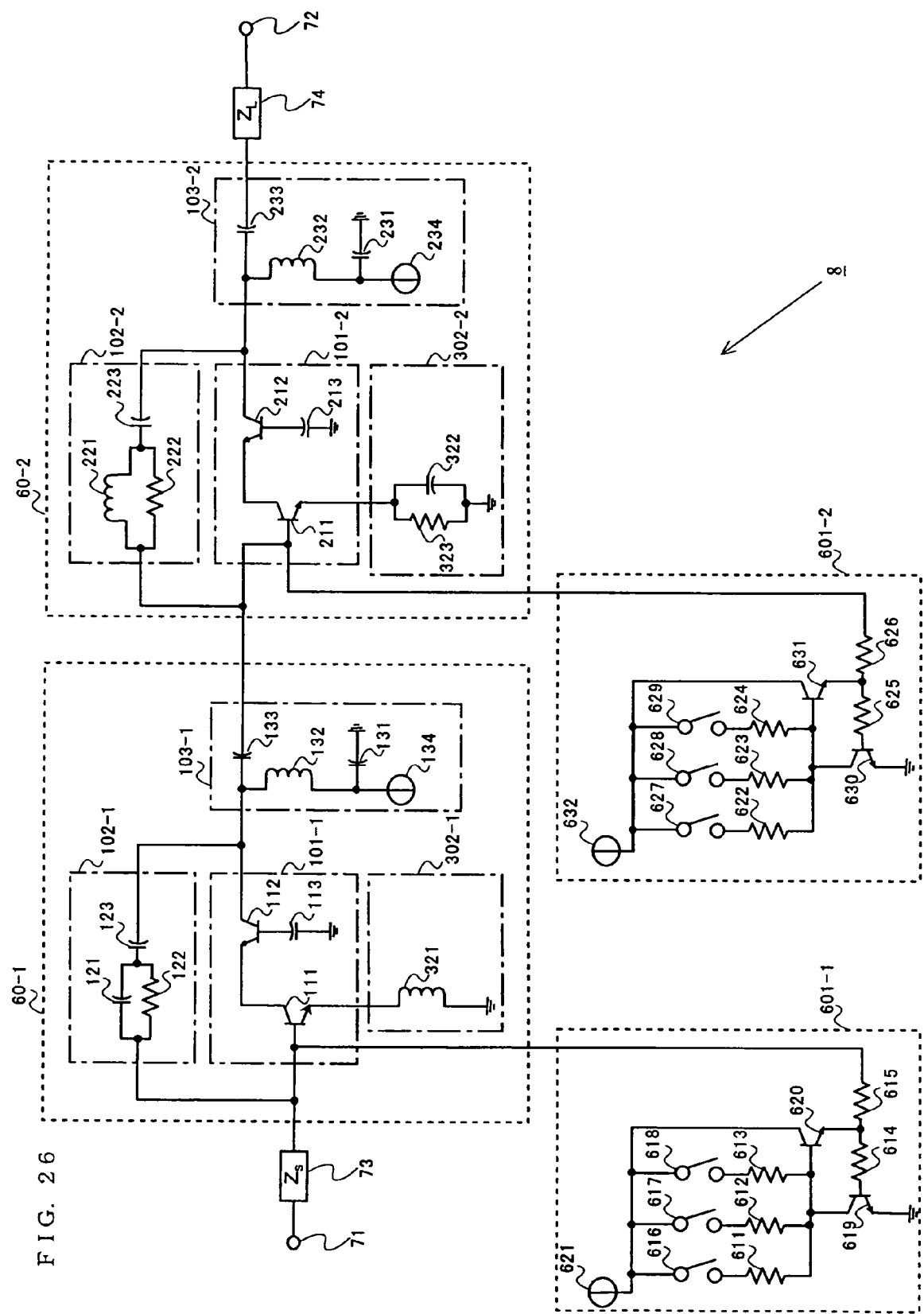
FIG. 26 is a diagram illustrating a structure of a multistage amplifying device according to an eighth embodiment of the present invention.

FIG. 26 is a diagram illustrating an exemplary structure of a multistage amplifying device 8 according to an eighth embodiment of the present invention. The multistage amplifying device 8 of FIG. 26 comprises an internal terminal 71, an input impedance matching circuit 73, an output impedance matching circuit 74, an output terminal 72, a first combined feedback amplifier 60-1, and a second combined feedback amplifier 60-2.

In the multistage amplifying device 8 of FIG. 26, the first combined feedback amplifier 60-1 is obtained by adding a first bias control circuit 601-1 to the first combined feedback amplifier 40-1. The second combined feedback amplifier 60-2 is obtained by adding a second bias control circuit 601-2 to the second combined feedback amplifier 40-2. Hereinafter, an operation of the multistage amplifying device 8 will be described, especially about elements different from those of the multistage amplifying device 6.

The first bias control circuit 601-1 has a seventh resistor 611, an eighth resistor 612, a ninth resistor 613, a tenth resistor 614, an eleventh resistor 615, a first switching element 616, a second switching element 617, a third switching element 618, a seventh transistor 619, an eighth transistor 620, and a fifth control signal integral terminal 621.

The second bias control circuit 601-2 has a twelfth resistor 622, a thirteenth resistor 623, a fourteenth resistor 624, a fifteenth resistor 625, a sixteenth resistor 626, a fourth switching element 627, a fifth switching element 628, a sixth switching element 629, a ninth transistor 630, a tenth transistor 631, and a sixth control signal internal terminal 632.

The fifth control signal integral terminal 621 is connected to the collector of the eighth transistor 620. One end of the seventh resistor 611 and one end of the first switching element 616 are connected in cascade. One end of the eighth resistor 612 and one end of the second switching element 617 are connected in cascade. One end of the ninth resistor 613 and one end of the third switching element 618 are connected in cascade. The other end of each of the first switching element 616, the second switching element 617 and the third switching element 618 is connected to the fifth control signal integral terminal 621. The other end of each of the seventh resistor 611, the eighth resistor 612 and the ninth resistor 613 is connected to the collector of the seventh transistor 619 and the base of the eighth transistor 620. The tenth resistor 614 is connected between the base of the seventh transistor 619 and the emitter of the eighth transistor 620. The eleventh resistor 615 is connected between the emitter of the eighth transistor 620 and the first transistor 111. The emitter of the seventh transistor 619 is grounded.

The sixth control signal internal terminal 632 is connected to the collector of the tenth transistor 631. One end of the twelfth resistor 622 and one end of the fourth switching element 627 are connected in cascade. One end of the thirteenth resistor 623 and one end of the fifth switching element 628 are connected in cascade. One end of the fourteenth resistor 624 and one end of the sixth switching element 629 are connected in cascade. The other end of each of the fourth switching element 627, the fifth switching element 628 and the sixth switching element 629 is connected to the sixth control signal internal terminal 632. The other end of each of the twelfth resistor 622, the thirteenth resistor 623 and the fourteenth resistor 624 is connected to the collector of the ninth transistor 630 and the base of the tenth transistor 631. The fifteenth resistor 625 is connected between the base of the ninth transistor 630 and the emitter of the tenth transistor 631. The sixteenth resistor 626 is connected between the emitter of the tenth transistor 631 and the third transistor 211. The emitter of the ninth transistor 630 is grounded.

In the first combined feedback amplifier 60-1, the first bias control circuit 601-1 turns the switches ON/OFF, depending on a fifth control signal which is input through the fifth control signal integral terminal 621, thereby changing a bias current of the first amplification section 101-1. The current gain of the first amplification section 101-1 varies depending on a change in the bias current of the first amplification section 101-1. Thereby, it is possible to control a change amount of the phase of the desired signal component and the phase of the first IM3 component. A change in the phases of the desired signal component and the first IM3 component due to a change in the current gain of the first amplification section 101-1 has been described in the fourth embodiment and will not be explained.

In the second combined feedback amplifier 60-2, the second bias control circuit 601-2 turns the switches ON/OFF, depending on the sixth control signal input from the sixth control signal internal terminal 632, thereby changing the bias current of the second amplification section 101-2. An operation of the second bias control circuit 601-2 is similar to that of the first bias control circuit 601-1 and will not be explained.

In this manner, the multistage amplifying device 8 of the eighth embodiment switches the bias current of the combined feedback amplifier using the switches. Thereby, the current gain of each amplification section can be controlled, depending on the frequency band and the level of the input desired signal. Therefore, an amplifier circuit which has a wide band and a wide dynamic range and can suppress IM3 can be achieved.

Note that, in the eighth embodiment, the bias control circuit may be composed of any circuit which can control the bias currents of the first amplification section 101-1 and the second amplification section 101-2. Alternatively, a single control signal internal terminal may be used to control the switches of all of the bias control circuits.

In the eighth embodiment, the multistage amplifying device 8 includes two combined feedback amplifiers connected in cascade. Alternatively, the multistage amplifying device 8 may include three or more combined feedback amplifiers according to the eighth embodiment.

Ninth Embodiment

Figure 27:
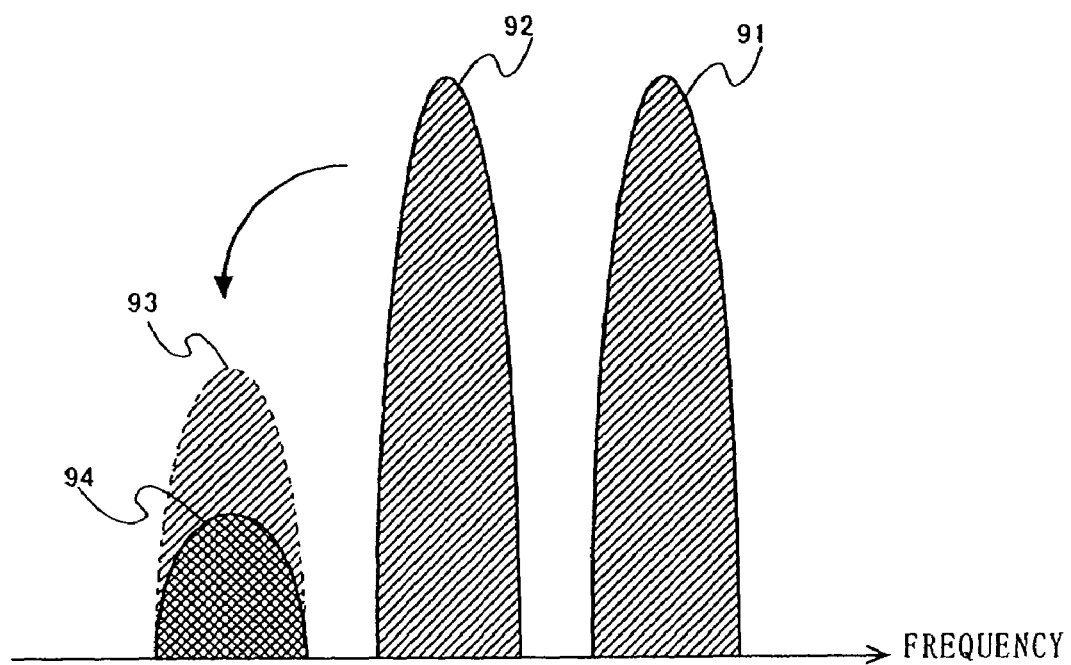
FIG. 27 is a diagram for explaining an influence of IM3 on a desired signal in a general reception circuit.

FIG. 27 is a diagram for explaining an influence of IM3 on a desired signal in a general reception circuit. As illustrated in FIG. 27, it is assumed that two different frequency interference waves, i.e., a first interference wave 91 and a second interference wave 92, are input along with a desired signal to a reception circuit. A general reception circuit comprises circuit elements, such as an amplifier, a mixer, a bandpass filter and the like. These circuit elements have nonlinear characteristics. An IM3 component 93 occurs when the first interference wave 91 and the second interference wave 92 are input to a circuit element having nonlinear characteristics. As illustrated in FIG. 27, when the frequency band of the IM3 component 93 and the frequency band of a desired signal 94 matches each other, the IM3 component 93 cannot be removed by a bandpass filter. As a result, the S/N ratio and reception sensitivity of the desired signal are deteriorated, for example. The reception circuit of the ninth embodiment of the present invention suppresses the IM3 component due to the two different frequency interference waves, thereby reducing an influence thereof on the desired signal.

Figure 28:
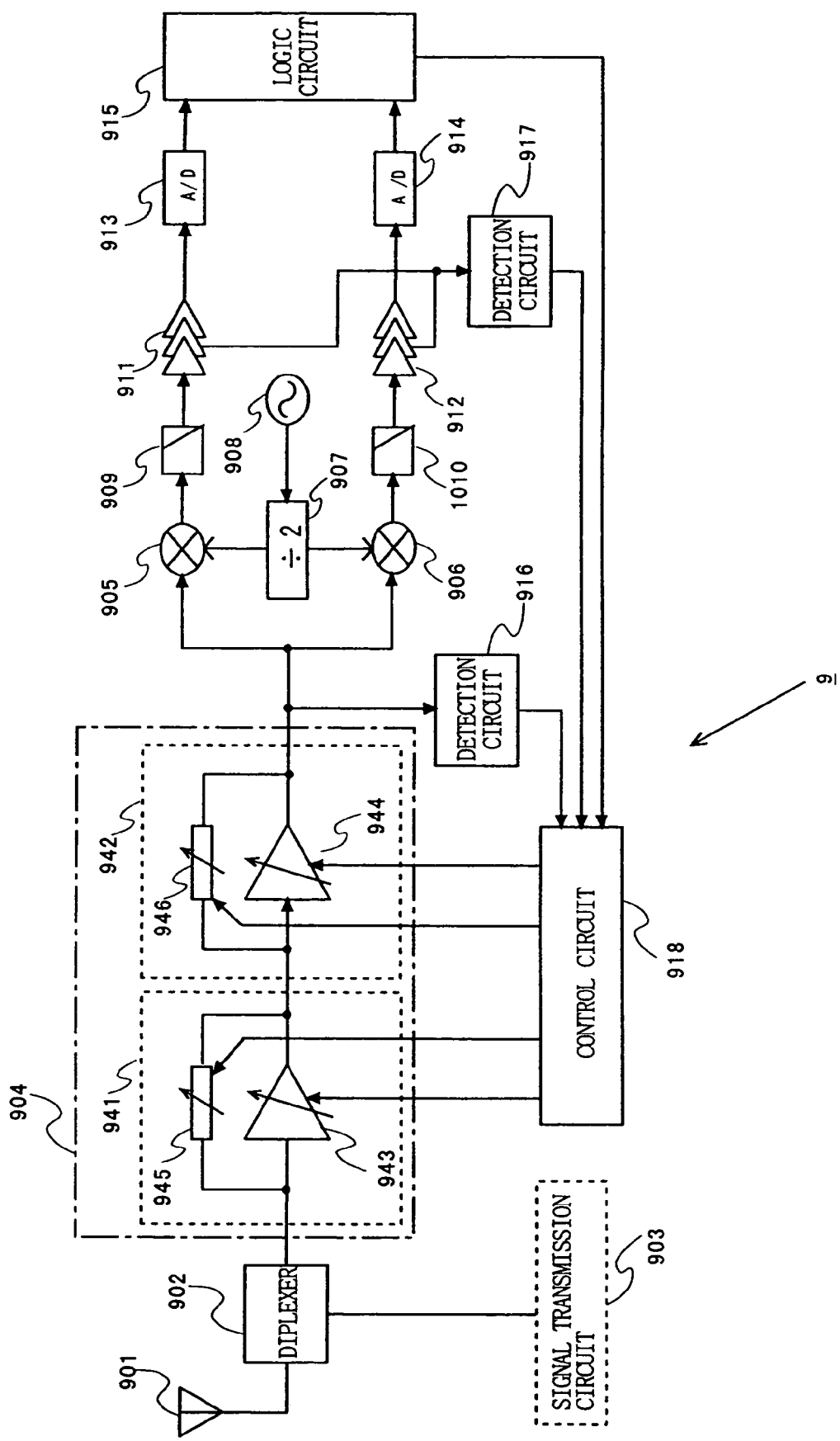
FIG. 28 is a block diagram illustrating a reception circuit according to a ninth embodiment of the present invention.

FIG. 28 is a block diagram illustrating a reception circuit 9 according to the ninth embodiment of the present invention. The reception circuit 9 comprises an antenna 901, a diplexer 902, a multistage amplifying device 904, a first mixer 905, a second mixer 906, a splitter 907, a local oscillator 908, a first bandpass filter 909, a second bandpass filter 910, a first AGC circuit 911, a second AGC circuit 912, a first A/D converter 913, a second A/D converter 914, a logic circuit 915, a first detection circuit 916, a second detection circuit 917, and a control circuit 918. The multistage amplifying device 904 includes a first amplifier 941 and a second amplifier 942. The first amplifier 941 has a first amplification section 943 and a first feedback section 945. The second amplifier 942 has a second amplification section 944 and a second feedback section 946. The first amplifier 941 and the second amplifier 942 are the phase control amplifier of the third embodiment, the combined feedback amplifier of the seventh embodiment, or the combined feedback amplifier of the eighth embodiment.

An operation of the reception circuit 9 of FIG. 28 will be described. A desired signal received by the antenna 901 is input via the diplexer 902 to the multistage amplifying device 904. The desired signal is amplified by the multistage amplifying device 904. The first mixer 905 and the second mixer 906 down-converts the amplified desired signal to a base-band signal. The first bandpass filter 909 and the second bandpass filter 910 extracts a desired band from the base-band signal. The first AGC circuit 911 and the second AGC circuit 912 adjust the gain of the base-band signal. The first A/D converter 913 and the second A/D converter 914 convert the base-band desired signal from an analog desired signal to a digital desired signal, and inputs the resultant signal to the logic circuit 915. The local oscillator 908 generates a signal which is used when the desired signal is down-converted in the first mixer 905 and the second mixer 906. The splitter 907 splits the signal generated in the local oscillator 908, and inputs the resultant signals to the first mixer 905 and the second mixer 906.

The control circuit 918 previously holds a table relating to the impedances of the amplifiers and the feedback sections of the multistage amplifying device 904 and the amounts of changes in phase. The control circuit 918 controls the impedances of the amplifiers and the feedback sections of the multistage amplifying device 904 based on detection signals from the logic circuit 915, the first detection circuit 916 and the second detection circuit 917, and the table. Specifically, when determining that suppression of an IM3 component is required, the control circuit 918 controls the impedances of the amplifiers and the feedback sections of the multistage amplifying device 904 so that the difference between the phase of the first IM3 component and the second IM3 component is 120° or more and 180° or less.

The first detection circuit 916 detects and inputs the power value of the desired signal amplified by the multistage amplifying device 904 to the control circuit 918. When the power value of the amplified desired signal is larger than a predetermined value, the control circuit 918 determines that the IM3 component occurring in the multistage amplifying device 904 is suppressed. On the other hand, when the power value of the amplified desired signal is smaller than the predetermined value, the control circuit 918 determines that the IM3 component occurring in the multistage amplifying device 904 needs to be suppressed.

The second detection circuit 917 detects and inputs the power value of a base-band signal output from the multistage amplifying device 904 to the control circuit 918. When the power value of the base-band signal is larger than a predetermined value, the control circuit 918 determines that the IM3 component occurring in the multistage amplifying device 904 is suppressed. On the other hand, when the power value of the base-band signal is smaller than the predetermined value, the control circuit 918 determines that the IM3 component occurring in the multistage amplifying device 904 needs to be suppressed.

The logic circuit 915 detects the bit error rate of the base-band signal and inputs the bit error rate as a detection signal to the control circuit 918. When the value of the bit error rate is smaller than a predetermined value, the control circuit 918 determines that the IM3 component occurring in the multistage amplifying device 904 is suppressed. On the other hand, when the value of the bit error rate is larger than the predetermined value, the control circuit 918 determines that the IM3 component occurring in the multistage amplifying device 904 needs to be suppressed.

As described above, the reception circuit of the ninth embodiment of the present invention can prevent deterioration of the quality of the desired signal by removing the IM3 component occurring due to the two different frequency interference waves.

Note that the reception circuit 9 may not include the control circuit 918, the logic circuit 915, and the second detection circuit 917. In this case, the multistage amplifying device 904 may employ the multistage amplifying device 1 of the first embodiment and the multistage amplifying device 2 of the second embodiment.

Tenth Embodiment

Figure 29:
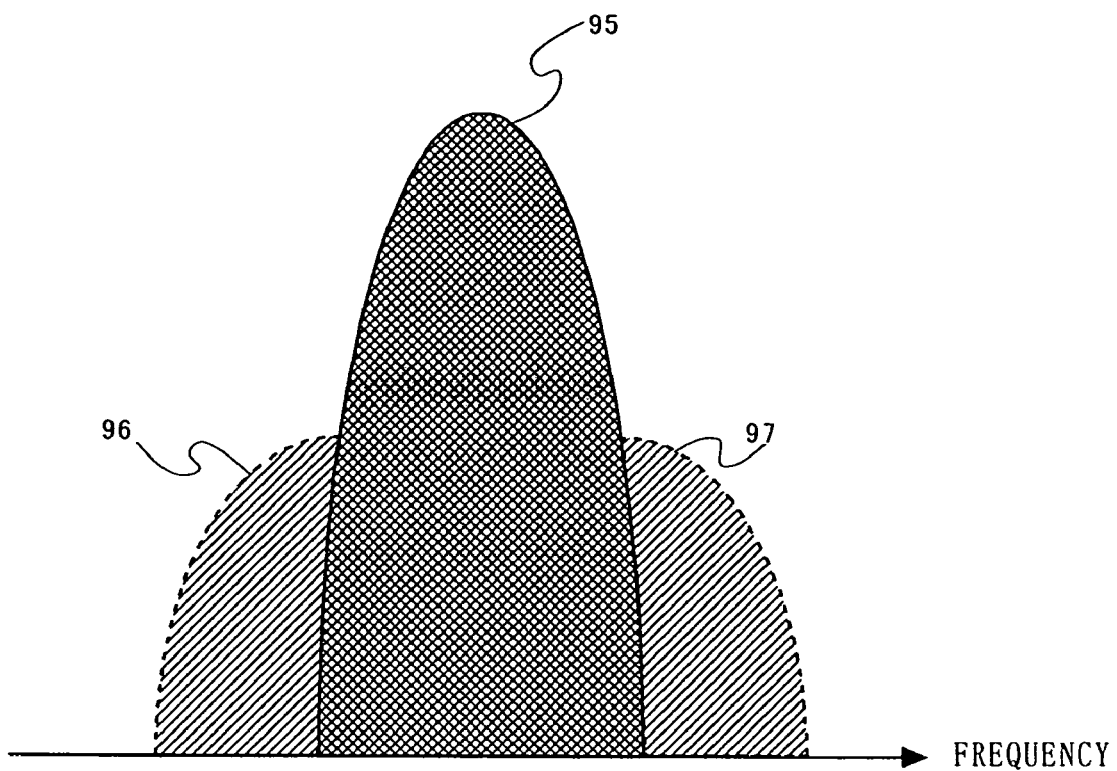
FIG. 29 is a diagram for explaining an influence of IM3 occurring in a general transmission circuit on a desired signal.

FIG. 29 is a diagram for explaining an influence of IM3 occurring in a general transmission circuit on a desired signal. A desired signal 96 is a modulated wave which is spread in the frequency. Therefore, the desired signal 96 can be considered to be two signals whose frequency bands are adjacent to each other. When the desired signal 96 is input to the general transmission circuit, IM3 occurs due to the nonlinearity of the base-band filter, the mixer and the amplifier in the transmission circuit.

A first IM3 component 97 and a second IM3 component 98 occurring in a transmission circuit are spread in channels adjacent to a channel which is used by the desired signal 96 as illustrated in FIG. 29. When the first IM3 component 97 and the second IM3 component 98 are emitted from an antenna, the first IM3 components 97 and the second IM3 component 98 become interference waves with respect to other communication terminals which use the adjacent channels. Therefore, the power value of the IM3 component needs to be suppressed to a predetermined value or less. The transmission circuit of the tenth embodiment suppresses an IM3 component occurring in a nonlinear circuit of a transmission circuit, thereby removing an influence of the IM3 component.

Figure 30:
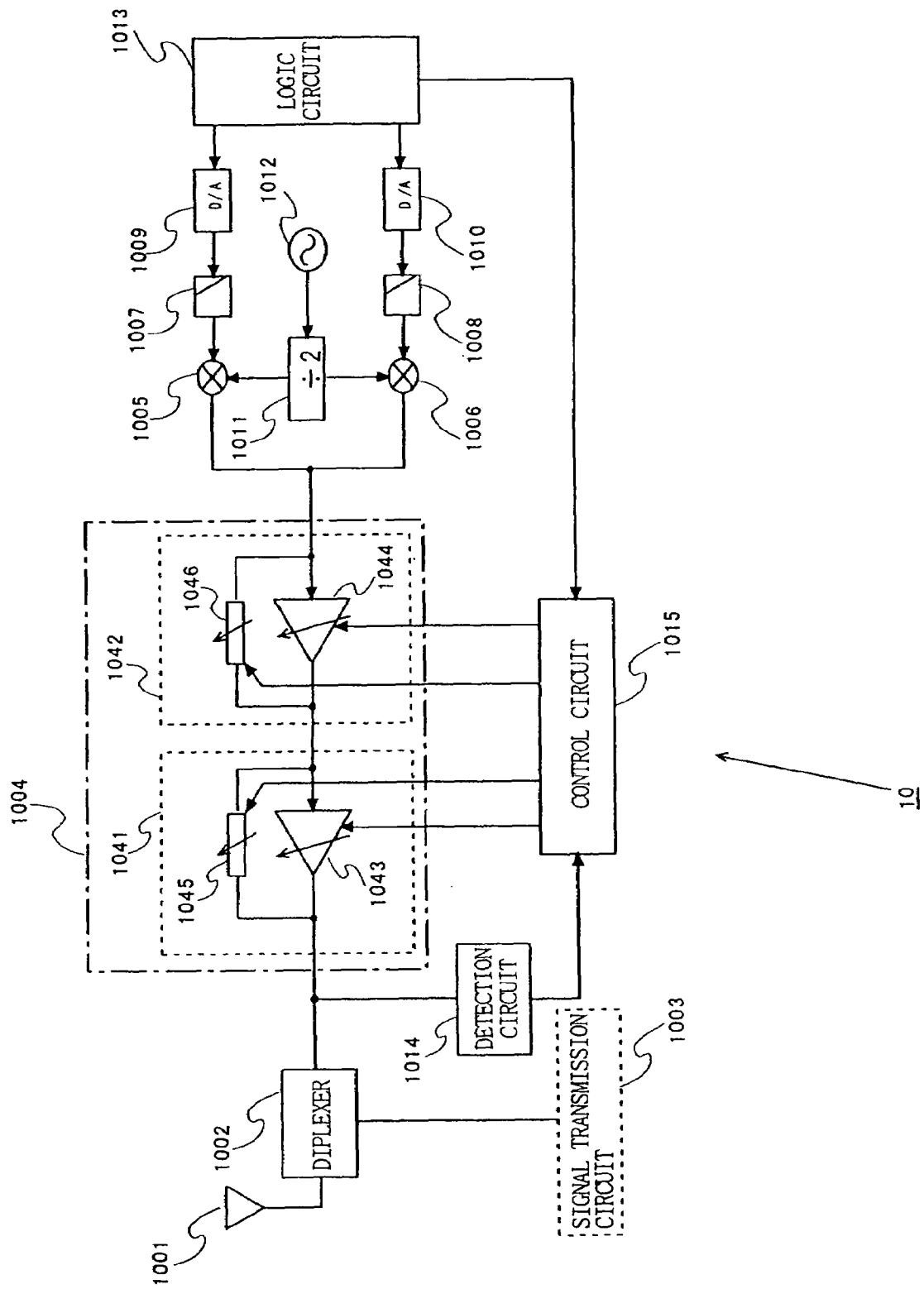
FIG. 30 is a block diagram illustrating a transmission circuit according to a tenth embodiment of the present invention.

FIG. 30 is a block diagram illustrating a transmission circuit 10 according to the tenth embodiment of the present invention. In FIG. 30, the transmission circuit 10 comprises an antenna 1001, a diplexer 1002, a multistage amplifying device 1004, a first mixer 1005, a second mixer 1006, a first base-band filter 1007, a second base-band filter 1008, a first D/A converter 1209, a second D/A converter 1010, a splitter 1011, a local oscillator 1012, a logic circuit 1013, a detection circuit 1014, and a control circuit 1015. The multistage amplifying device 1004 includes a first amplifier 1041 and a second amplifier 1042. The first amplifier 1041 has a first amplification section 1043 and a first feedback section 1045. The second amplifier 1042 has a second amplification section 1044 and a second amplification section 1046. The first amplifier 1041 and the second amplifier 1042 are the phase control amplifier of the third embodiment, the combined feedback amplifier of the seventh embodiment, or the combined feedback amplifier of the eighth embodiment.

An operation of the transmission circuit of FIG. 30 will be described. The logic circuit 1013 outputs a base-band signal to a first D/A converter 1009 and the second D/A converter 1010. The first D/A converter 1009 and the second D/A converter 1010 convert the base-band signal from a digital signal to an analog signal. The first base-band filter 1007 and the second base-band filter 1008 extracts the frequency band of a desired signal from the base-band signal. The local oscillator 1012 generates a signal which is used when the base-band signal is up-converted to an RF signal in the first mixer 1005 and the second mixer 1006. The splitter 1011 outputs the signal generated by the local oscillator 1012 to the first mixer 1005 and the second mixer 1006. The first mixer 1005 and the second mixer 1006 up-converts the base-band signal to a radio signal. The multistage amplifying device 1004 amplifies the radio signal. The diplexer 1002 outputs the signal received by the antenna to the reception circuit and outputs the radio signal output by the transmission circuit to the antenna. The antenna 1001 emits the radio signal.

The control circuit 1015 previously holds a table relating to the impedances of the amplifiers and the feedback sections of the multistage amplifying device 1004 and the amounts of changes in phase. The control circuit 1015 controls the impedances of the amplifiers and the feedback sections of the multistage amplifying device 1004 in accordance with the logic circuit 1013, the detection circuit 1014 and the table. Specifically, when determining that suppression of an IM3 component is required, the control circuit 1015 controls the impedances of the amplifiers and the feedback sections of the multistage amplifying device 1004 so that the difference between the phase of the first IM3 component and the second IM3 component is 120° or more and 180° or less.

The logic circuit 1013 outputs power information of the base-band signal to the control circuit 1015. For example, when a mobile communication terminal employs the transmission circuit 10, the logic circuit 1013 detects a distance between the mobile communication terminal and a station from a control signal included in a received signal. The logic circuit 1013 determines the level of a radio signal, depending on the distance between the mobile communication terminal and the station, and outputs it as a level adjustment signal to the control circuit.

The detection circuit 1014 extracts an IM3 component from the radio signal amplified by the multistage amplifying device 1004, and outputs the power value of the IM3 component to the control circuit 1015. The control circuit 1015 controls the impedances of the amplification section and the feedback section of the multistage amplifying device 1004 so that the power value of the IM3 component always becomes smaller than a predetermined value.

As described above, the transmission circuit of the tenth embodiment of the present invention can remove the IM3 component occurring in the transmission circuit, depending on the level of the IM3 component. Therefore, an influence of the IM3 component on other channels can be reduced.

Note that the detection circuit 1014 may detect the level of the radio signal amplified by the multistage amplifying device 1004 and inputs it to the control circuit 1015. In this case, when the level of the amplified radio signal is lower than a predetermined value, the control circuit 1015 may determine that the IM3 component is suppressed. On the other hand, when the level of the amplified signal is higher than the predetermined value, the control circuit 1015 may determine that the IM3 component needs to be suppressed.

The control circuit 1015 may control the multistage amplifying device 1004 without using the level adjustment signal output from the logic circuit 1013.

The control circuit 1015 may control the multistage amplifying device 1004 without the power information of the radio signal amplified by multistage amplifying device 1004, which is output from the detection circuit 1014.

Further, the transmission circuit 10 may not include the control circuit 1015 and the detection circuit 1014. In this case, the multistage amplifying device 1004 may employ the multistage amplifying device 1 of the first embodiment and the multistage amplifying device of the second embodiment.

As described above, the transmission circuit of the tenth embodiment of the present invention can prevent deterioration of the quality of a radio signal to be transmitted, by suppressing an IM3 component which occurs when, for example, a modulated wave having a frequency spread is amplified.

Eleventh Embodiment

Figure 31:
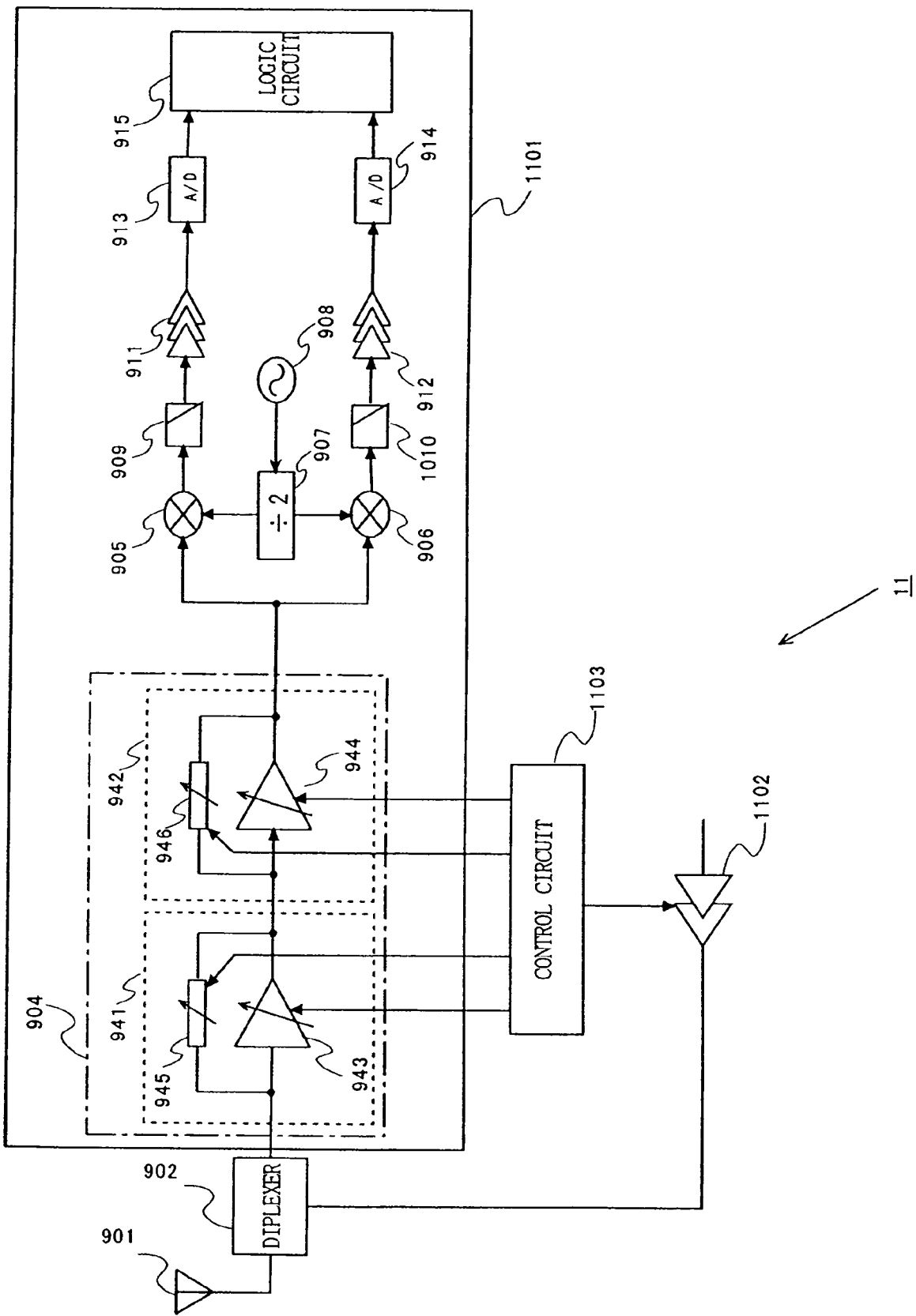
FIG. 31 is a block diagram illustrating a structure of a radio communication device according to an eleventh embodiment of the present invention.
Figure 32:
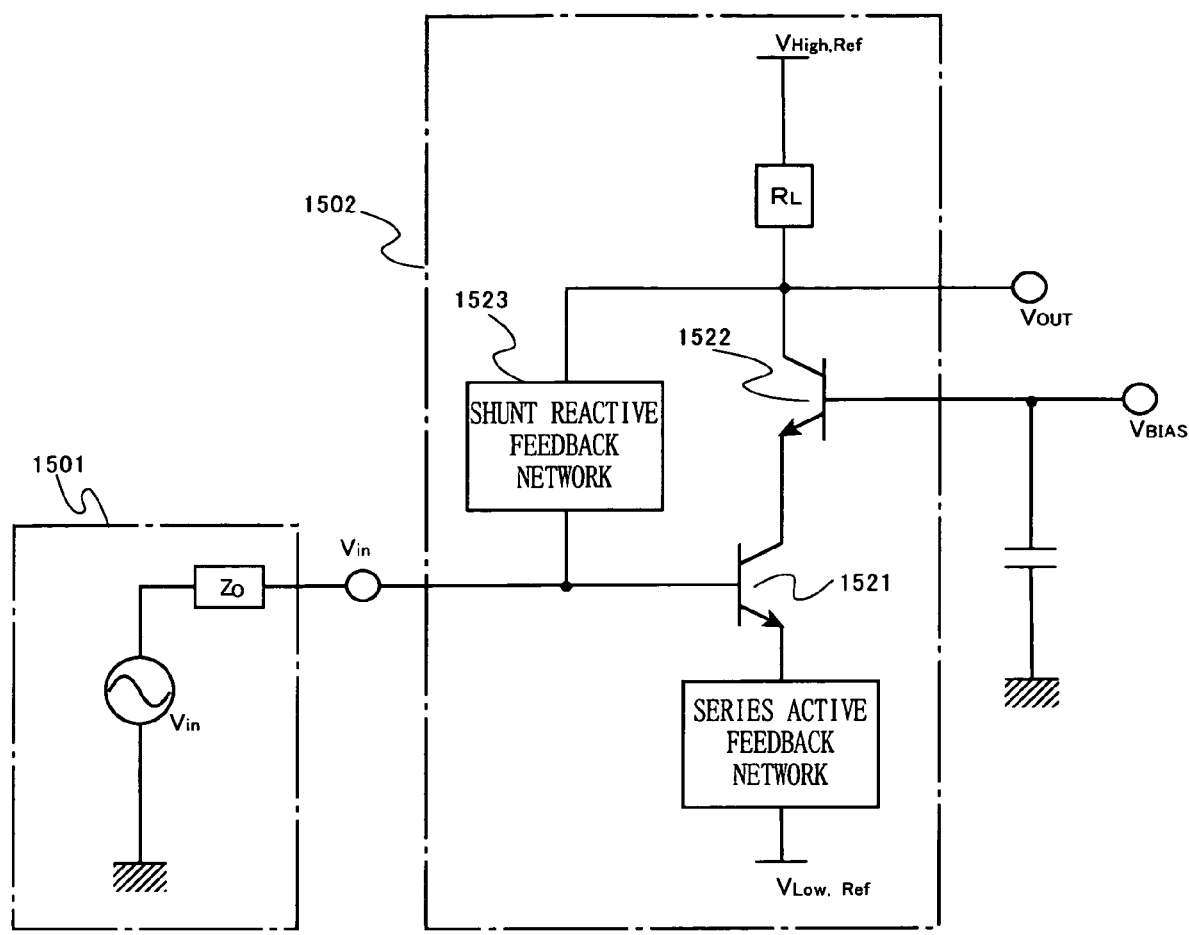
FIG. 32 is a diagram illustrating a feedback-type amplifier circuit described in Patent Publication 1.
Figure 33:
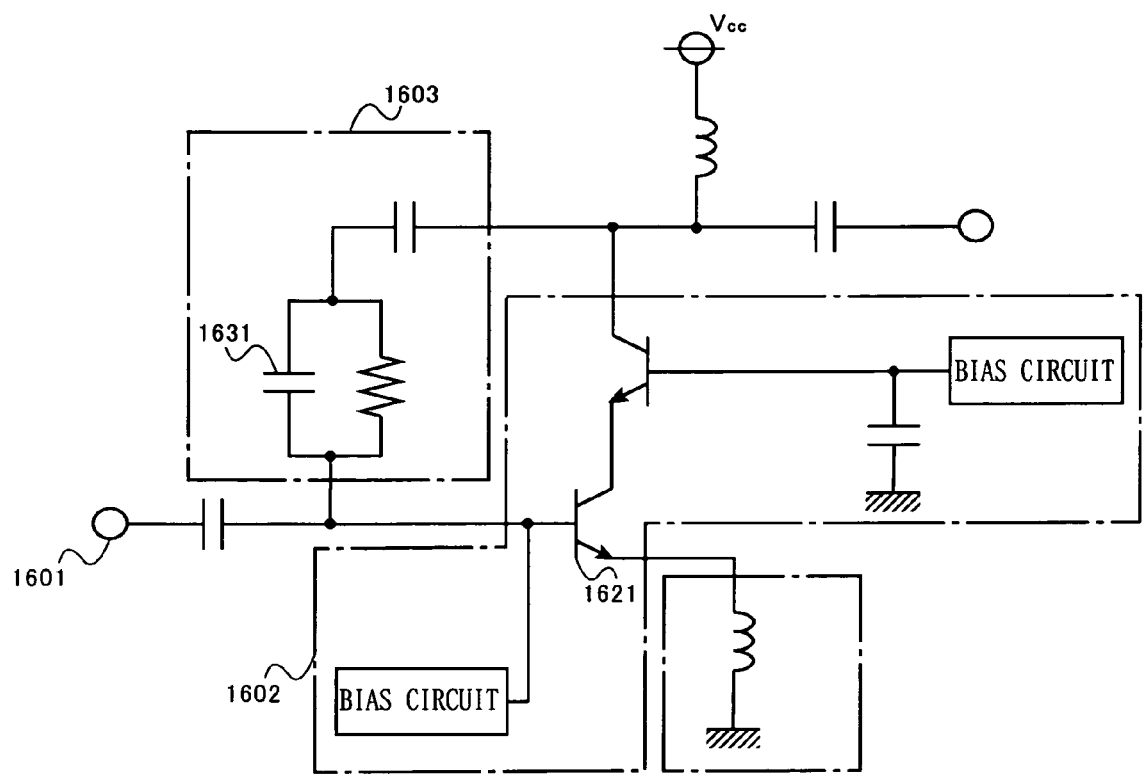
FIG. 33 is a diagram illustrating a feedback-type amplifier circuit described in Patent Publication 2.
Figure 34:
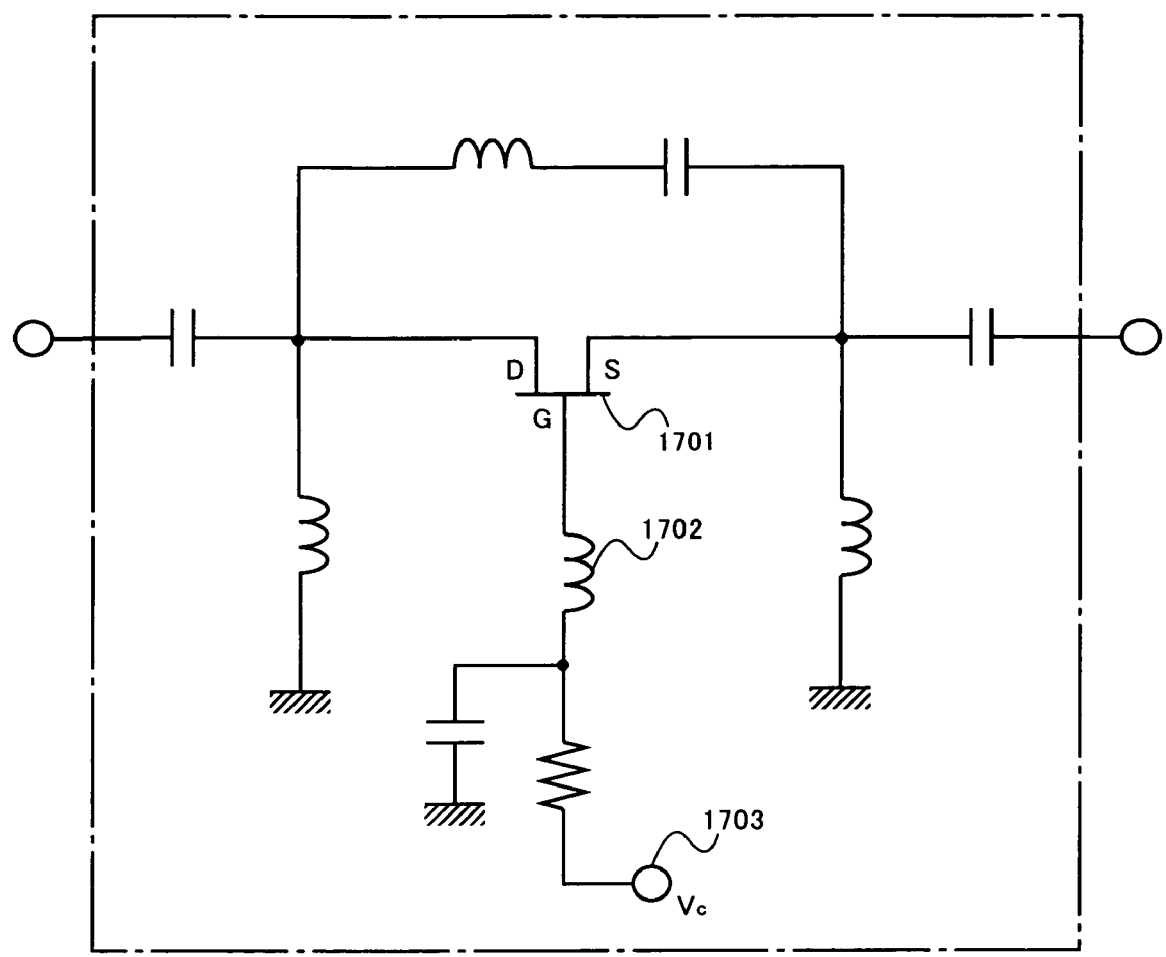
FIG. 34 is a diagram illustrating a feedback-type amplifier circuit described in Patent Publication 3.

FIG. 31 is a block diagram illustrating a structure of a radio communication device 11 according to an eleventh embodiment of the present invention. The radio communication device 11 of FIG. 31 comprises a reception circuit 1101, a transmission circuit 1102, and a control circuit 1103.

The reception circuit 1101 is a signal reception amplifier which amplifies a received signal and processes the amplified received signal. The reception circuit 1101 does not include the logic circuit 915, the second detection circuit 917, and the control circuit 918 which are included in the reception circuit 9 of FIG. 28. Therefore, in the reception circuit 1101, the same components as those of the reception circuit 9 are referenced with the same reference numerals numeral and will not be explained.

The transmission circuit 1102 is a signal transmission amplifier which amplifies and transmits a transmission signal. When the transmission circuit 1102 transmits a transmission signal, the control circuit 1103 controls the multistage amplifying device 904 of the reception circuit 1101.

An operation of the radio communication device 11 will be described. The radio communication device 11 may simultaneously perform transmission of a transmission signal and reception of a reception signal. In this case, a portion of a signal transmitted by the transmission circuit 1102 leaks to the reception circuit 1101. Therefore, the reception circuit 1101 requires considerably low distortion characteristics.

When simultaneously performing signal transmission and reception, the control circuit 1103 detects the level of a transmission signal. The control circuit 1103 determines a control signal, depending on the level of the transmission signal. The control circuit 1103 controls the reception circuit 1101 based on the control signal. Specifically, the control circuit 1103 controls the first feedback section 945 and second feedback section 946 so that the feedback amount of the first feedback section 945 and the feedback amount of the second feedback section 946 are increased. The control circuit 1103 controls the first amplification section 943 and the second amplification section 944 so that the bias current of the first amplification section 943 and the bias current of the second amplification section 944 are increased. The control circuit 1103 controls the multistage amplifying device 904 in this manner, thereby improving distortion characteristics without reducing the gain of the multistage amplifying device 904.

Thus, the radio communication device 11 of the eleventh embodiment, when performing transmission and reception simultaneously, controls the bias current of an amplification section and the feedback amount of a feedback section in a multistage amplifying device included in a reception circuit, thereby improving the distortion characteristics of the multistage amplifying device. Therefore, for example, when transmission and reception are simultaneously performed, a radio communication device with substantially no deterioration of reception sensitivity can be achieved.

While the invention has been described in detail, the foregoing description is in all aspects illustrative and not restrictive. It is understood that numerous other modifications and variations can be devised without departing from the scope of the invention.

What is claimed is:

1. A multistage amplifying device for amplifying a desired signal having a desired frequency band and outputting the amplified desired signal, comprising:

first to N-th (N is a natural number of 2 or more) amplifiers connected in cascade, wherein the k-th (k is a natural number of 1 to N) amplifier includes:

a k-th amplification section; and a k-th feedback section which has a reactance component, changes a phase of a signal output from the k-th amplification section and negatively feeds the resultant signal back to an input side of the k-th amplification section, wherein, when a difference between a phase of a frequency component of the desired frequency band included in a signal output from the N-th amplifier and a phase of a third-order inter-modulation distortion included in a signal output from the (N−1)-th amplifier is referred to as a first phase, and a difference between the phase of the frequency component of the desired frequency band included in the signal output from the N-th amplifier, and a phase of a combined third-order inter-modulation distortion obtained by combining a third-order inter-modulation distortion occurring in the N-th amplification section and a third-order inter-modulation distortion fed back from the N-th feedback section is referred to as a second phase, a difference between the first phase and the second phase is 120° or more and 180° or less.

2. The multistage amplifying device according to claim 1, wherein the k-th feedback section has a reactance component which causes a phase component of $1/(1-\alpha\cdot\beta)$ to be −90° or more and 90° or less, where $\beta$ represents a feedback amount of the k-th feedback section which is a value obtained by dividing an admittance of the k-th feedback section by a sum of the admittance of the k-th feedback section and a load admittance of the k-th amplifier, and $\alpha$ represents a gain of the k-th amplifier with respect to the frequency component of the desired frequency band.

3. The multistage amplifying device according to claim 1, wherein:

N is 2;

the first phase is a difference between a phase of a frequency component of the desired frequency band included in a signal output from the second amplifier and a phase of a third-order inter-modulation distortion included in a signal output from the first amplifier, the second phase is a difference between the phase of the frequency component of the desired frequency band included in the signal output from the second amplifier, and a phase of a combined third-order inter-modulation distortion obtained by combining a third-order inter-modulation distortion occurring in the second amplification section and a third-order inter-modulation distortion fed back from the second feedback section, and a difference between the first phase and the second phase is 120° or more and 180° or less.

4. The multistage amplifying device according to claim 1, wherein:

when a difference between a phase of a frequency component of the desired frequency band included in a signal output from the k-th (k is at least one natural number of 2 or more and N−1 or less) amplifier, and a phase of a third-order inter-modulation distortion included in a signal output from the (k−1)-th amplifier is referred to as a third phase, and a difference between the phase of the frequency component of the desired frequency band included in the signal output from the k-th amplifier, and a phase of a combined third-order inter-modulation distortion obtained by combining a phase of a third-order inter-modulation distortion occurring in the k-th amplification section and a third-order inter-modulation distortion fed back from the k-th feedback section is referred to as a fourth phase, the k-th feedback section changes the phase of the signal output from the k-th amplification section to cause a difference between the third phase and the fourth phase to be 0° or more and less than 120°.

5. The multistage amplifying device according to claim 4, wherein each of the first to (N−1)-th feedback sections changes the phase of the signal output from the k-th amplification section to cause the difference between the third phase and the fourth phase to be 0° or more and less than 120°.

6. The multistage amplifying device according to claim 1, wherein at least two of the first to N-th feedback sections has:

a capacitive parallel feedback section which has a capacitive reactance component and performs parallel feedback with respect to a signal output from an amplification section; and an inductive parallel feedback section which has an inductive reactance component and performs parallel feedback with respect to a signal output from an amplification section, wherein a gain decrease rate of the desired frequency band of the amplifier including the capacitive parallel feedback section is equivalent to a gain increase rate of the desired frequency band of the amplifier including the inductive parallel feedback section.

7. The multistage amplifying device according to claim 1, wherein at least two of the first to N-th feedback sections has:

a capacitive parallel feedback section which has a capacitive reactance component and performs series feedback with respect to a signal output from an amplification section; and an inductive parallel feedback section which has an inductive reactance component and performs series feedback with respect to a signal output from an amplification section, wherein a gain increase rate of the desired frequency band of the amplifier including the capacitive parallel feedback section is equivalent to a gain decrease rate of the desired frequency band of the amplifier including the inductive parallel feedback section.

8. The multistage amplifying device according to claim 1, wherein the first feedback section has an inductive series feedback section which has an inductive reactance component and performs series feedback with respect to a signal output from the first amplification section.

9. The multistage amplifying device according to claim 1, wherein the N-th feedback section has an inductive series feedback section which has an inductive reactance component and performs series feedback with respect to a signal output from the N-th amplification section.

10. The multistage amplifying device according to claim 1, wherein at least two of the first to N-th feedback sections has:

a feedback amount increasing feedback section including a parallel feedback section which has a capacitive reactance component and performs parallel feedback with respect to a signal output from an amplification section, and a series feedback section which has an inductive reactance component and performs series feedback with respect to a signal output from an amplification section; and a feedback amount decreasing feedback section including a parallel feedback section which has an inductive reactance component and performs parallel feedback with respect to a signal output from an amplification section, and a series feedback section which has a capacitive reactance component and performs series feedback with respect to a signal output from an amplification section, wherein a gain decrease rate of the desired frequency band of the amplifier including the feedback amount increasing feedback section is equivalent to a gain increase rate of the desired frequency band of the amplifier including the feedback amount decreasing feedback section.

11. The multistage amplifying device according to claim 1, wherein at least one k-th amplifier further includes:

a matching circuit of matching impedances of the k-th amplification section and the (k+1)-th amplification section, wherein the matching circuit changes a reactance based on an externally-input control signal to adjust a level of a signal to be fed back to the k-th feedback section.

12. The multistage amplifying device according to claim 1, wherein at least one k-th feedback section includes a varactor diode which changes a reactance, depending on an externally-input control signal, as the reactance component.

13. The multistage amplifying device according to claim 1, wherein at least k-th feedback section changes a reactance by turning ON/OFF a switching element.

14. The multistage amplifying device according to claim 1, wherein at least k-th amplification section changes a current value of a bias current based on an externally-input control signal.

15. The multistage amplifying device according to claim 14, wherein at least one k-th bias circuit changes the current value of the bias current by turning ON/OFF a switching circuit.

16. A reception device, comprising:

a multistage amplifying device for amplifying a received radio signal, wherein the multistage amplifying device comprises:

first to N-th (N is a natural number of 2 or more) amplifiers connected in cascade, wherein the k-th (k is a natural number of 1 to N) amplifier includes:
a k-th amplification section; and
a k-th feedback section which has a reactance component, changes a phase of a signal output from the k-th amplification section and negatively feeds the resultant signal back to an input side of the k-th amplification section,
wherein, when a difference between a phase of a frequency component of the desired frequency band included in a signal output from the N-th amplifier and a phase of a third-order inter-modulation distortion included in a signal output from the (N−1)-th amplifier is referred to as a first phase, and
a difference between the phase of the frequency component of the desired frequency band included in the signal output from the N-th amplifier, and a phase of a combined third-order inter-modulation distortion obtained by combining a third-order inter-modulation distortion occurring in the N-th amplification section and a third-order inter-modulation distortion fed back from the N-th feedback section is referred to as a second phase,
a difference between the first phase and the second phase is 120° or more and 180° or less.

17. A transmission device, comprising:
a multistage amplifying device for amplifying an electrical signal,
wherein the multistage amplifying device comprises:
first to N-th (N is a natural number of 2 or more) amplifiers connected in cascade,
wherein the k-th (k is a natural number of 1 to N) amplifier includes:
a k-th amplification section; and
a k-th feedback section which has a reactance component, changes a phase of a signal output from the k-th amplification section and negatively feeds the resultant signal back to an input side of the k-th amplification section,
wherein, when a difference between a phase of a frequency component of the desired frequency band included in a signal output from the N-th amplifier and a phase of a third-order inter-modulation distortion included in a signal output from the (N−1)-th amplifier is referred to as a first phase, and
a difference between the phase of the frequency component of the desired frequency band included in the signal output from the N-th amplifier, and a phase of a combined third-order inter-modulation distortion obtained by combining a third-order inter-modulation distortion occurring in the N-th amplification section and a third-order inter-modulation distortion fed back from the N-th feedback section is referred to as a second phase,
a difference between the first phase and the second phase is 120° or more and 180° or less.

18. A radio communication device, comprising:
a signal reception amplifier of amplifying a received signal;
a signal transmission amplifier of amplifying a transmission signal; and
a control device of inputting a control signal to the signal reception amplifier, depending on a level of the amplified transmission signal, when performing signal transmission and signal reception simultaneously,
wherein the signal reception amplifier includes a multistage amplifying device,
the multistage amplifying device comprises:
first to N-th (N is a natural number of 2 or more) amplifiers connected in cascade,
wherein the k-th (k is a natural number of 1 to N) amplifier includes:
a k-th amplification section; and
a k-th feedback section which has a reactance component and charges a phase of a signal output from the k-th amplification section and negatively feeds the resultant signal back to an input side of the k-th amplification section,
wherein, when a difference between a phase of a frequency component of the desired frequency band included in a signal output from the N-th amplifier and a phase of a third-order inter-modulation distortion included in a signal output from the (N−1)-th amplifier is referred to as a first phase, and
a difference between the phase of the frequency component of the desired frequency band included in the signal output from the N-th amplifier, and a phase of a combined third-order inter-modulation distortion obtained by combining a third-order inter-modulation distortion occurring in the N-th amplification section and a third-order inter-modulation distortion fed back from the N-th feedback section is referred to as a second phase,
a difference between the first phase and the second phase is 120° or more and 180° or less, and
the multistage amplification section changes a feedback amount of the k-th feedback section and a current value of a bias current of the k-th amplification section based on the control signal.

* * * * *